US012707820B2

(12) United States Patent
Sato et al.

(10) Patent No.: US 12,707,820 B2
(45) Date of Patent: Aug. 11, 2026

(54) DISPLAY DEVICE COMPRISING PARTITION COVERING ADJACENT PIXEL ELECTRODES AND MANUFACTURING METHOD OF DISPLAY DEVICE

(71) Applicant: Semiconductor Energy Laboratory Co., Ltd., Atsugi (JP)

(72) Inventors: Rai Sato, Tochigi (JP); Masahiro Katayama, Tochigi (JP); Naoto Goto, Tochigi (JP); Yasutaka Nakazawa, Tochigi (JP); Kenichi Okazaki, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 424 days.

(21) Appl. No.: 18/276,078

(22) PCT Filed: Feb. 7, 2022

(86) PCT No.: PCT/IB2022/051019
§ 371 (c)(1),
(2) Date: Aug. 7, 2023

(87) PCT Pub. No.: WO2022/175774
PCT Pub. Date: Aug. 25, 2022

(65) Prior Publication Data

US 2024/0099069 A1 Mar. 21, 2024

(30) Foreign Application Priority Data

Feb. 19, 2021 (JP) ................................. 2021-024818
Feb. 25, 2021 (JP) ................................. 2021-028667

(51) Int. Cl.
*H10K 59/122* (2023.01)
*H10K 59/12* (2023.01)

(52) U.S. Cl.
CPC ....... *H10K 59/122* (2023.02); *H10K 59/1201* (2023.02)

(58) Field of Classification Search
CPC .......................... H10K 59/122; H10K 59/1201
See application file for complete search history.

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 107851408 A 3/2018
CN 111243527 A 6/2020
(Continued)

OTHER PUBLICATIONS

Kurauchi, JP2007-103058, machine translation (Year: 2007).*
(Continued)

*Primary Examiner* — Tracie Y Green
(74) *Attorney, Agent, or Firm* — Eric J. Robinson; Robinson Intellectual Property Law Office, P.C.

(57) ABSTRACT

A high-resolution display device is provided. A display device with both high display quality and high resolution is provided. The display device includes a first display element including a first pixel electrode, a first EL layer, and a common electrode; a second display element including a second pixel electrode, a second EL layer, and the common electrode; a first insulating layer covering an end portion of the first pixel electrode and an end portion of the second pixel electrode; a second insulating layer over the first insulating layer; and a third insulating layer over the second insulating layer. The first EL layer is placed over the first
(Continued)

pixel electrode and the third insulating layer. The second EL layer is placed over the second pixel electrode and the third insulating layer.

12 Claims, 35 Drawing Sheets

(56) References Cited

U.S. PATENT DOCUMENTS

| | | | |
|---|---|---|---|
| 9,678,378 | B2 | 6/2017 | Sato |
| 9,692,020 | B2 | 6/2017 | Park et al. |
| 10,096,776 | B2 | 10/2018 | Malinowski et al. |
| 10,468,637 | B2 | 11/2019 | Defranco et al. |
| 10,657,881 | B2 | 5/2020 | Suzuki et al. |
| 10,862,036 | B2 | 12/2020 | Ke et al. |
| 11,081,676 | B2 | 8/2021 | Kim et al. |
| 11,158,246 | B2 | 10/2021 | Suzuki et al. |
| 2002/0072139 | A1 | 6/2002 | Kashiwabara |
| 2011/0148290 | A1 | 6/2011 | Oota |
| 2011/0198598 | A1 | 8/2011 | Kim et al. |
| 2012/0256204 | A1 | 10/2012 | Yoshizumi et al. |
| 2012/0273804 | A1 | 11/2012 | Hatano |
| 2012/0276484 | A1 | 11/2012 | Izumi et al. |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0280839 | A1 | 10/2013 | Sonoda et al. |
| 2013/0295705 | A1 | 11/2013 | Sonoda et al. |
| 2014/0004640 | A1 | 1/2014 | Hamaguchi et al. |
| 2014/0004642 | A1 | 1/2014 | Otsuka et al. |
| 2015/0060826 | A1 | 3/2015 | Matsumoto et al. |
| 2015/0069360 | A1 | 3/2015 | Sato |
| 2015/0076476 | A1 | 3/2015 | Odaka et al. |
| 2015/0286103 | A1* | 10/2015 | Sato ..................... H10K 59/122 349/86 |
| 2016/0172595 | A1 | 6/2016 | Malinowski et al. |
| 2016/0315133 | A1 | 10/2016 | Sato |
| 2017/0141167 | A1 | 5/2017 | Naganuma |
| 2017/0256754 | A1 | 9/2017 | Defranco et al. |
| 2017/0271421 | A1* | 9/2017 | Jinbo ................. H10K 59/8722 |
| 2018/0190908 | A1 | 7/2018 | Ke et al. |
| 2018/0226016 | A1* | 8/2018 | Suzuki ................... H05B 33/22 |
| 2020/0203662 | A1 | 6/2020 | Mollard et al. |
| 2020/0372855 | A1 | 11/2020 | Suzuki et al. |
| 2021/0013452 | A1 | 1/2021 | Kim et al. |
| 2021/0336227 | A1 | 10/2021 | Kim et al. |
| 2022/0101786 | A1 | 3/2022 | Suzuki et al. |
| 2023/0120428 | A1 | 4/2023 | Du et al. |

FOREIGN PATENT DOCUMENTS

| | | | |
|---|---|---|---|
| CN | 112216726 | A | 1/2021 |
| JP | 2000-036385 | A | 2/2000 |
| JP | 2003-059663 | A | 2/2003 |
| JP | 2007103058 | A * | 4/2007 |
| JP | 2008-098106 | A | 4/2008 |
| JP | 2008-147072 | A | 6/2008 |
| JP | 2008-251270 | A | 10/2008 |
| JP | 2011-171300 | A | 9/2011 |
| JP | 2012-160473 | A | 8/2012 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2015-201353 | A | 11/2015 |
| JP | 2016-197494 | A | 11/2016 |
| JP | 2017-026973 | A | 2/2017 |
| JP | 2019-179696 | A | 10/2019 |
| JP | 2020-160305 | A | 10/2020 |
| JP | 2021-015597 | A | 2/2021 |
| KR | 2011-0094458 | A | 8/2011 |
| KR | 2018-0076496 | A | 7/2018 |
| KR | 2020-0073805 | A | 6/2020 |
| KR | 2021-0008240 | A | 1/2021 |
| WO | WO-2017/018059 | | 2/2017 |
| WO | WO-2018/087625 | | 5/2018 |

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20: SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

International Search Report (Application No. PCT/IB2022/051019) Dated May 10, 2022.

Written Opinion (Application No. PCT/IB2022/051019) Dated May 10, 2022.

* cited by examiner 101
111R
134f
111G
111B
111C 152
151
101
111R
134f
131f
111G
111B
111C 101
111R
134f
131
111G
111B
111C 101
111R
134f
131
132f
111G
111B
111C 153
151
101
111R
134f
131
132f
111G
141f
111B
111C 101
111R
134f
131
132f
111G
141
111B
111C 101
111R
134
131
132
111G
111B
111C 144a
146a
112Rf
101
111R
134
131
132
111G
111B
111C 143a
146a
144a
112Rf
101
111R
134
131
132
111G
111B
111C 143a
147a
144a
112Rf
101
111R
134
131
132
111G
111B
111C 147a
144a
112Rf
101
111R
134
131
132
111G
111B
111C 147a
145a
112Rf
101
111R
134
131
132
111G
111B
111C 145a
112R
101
111R
134
131
132
111G
111B
111C 145a
146b
144b
112Gf
145a
101
111R
111G
111B
111C 146b
143b
144b
112Gf
101
111R
111G
111B
111C 147b
143b
144b
112Gf
101
111R
111G
111B
111C 145b
145a
112R
145b
112G
145a
101
111R
111G
134
131
132
111B
111C 145c
145a
145b
112R
145a
112G
145b
112B
145b
101
111R
111G
134
131
132
111B
111C 112R
112G
112B
101
111R
111G
111B
111C 113
114
112R
112G
112B
113
101
111R
111G
111B
111C 113
121
114
112R
112G
112B
113
121
101
111R
111G
111B
111C 112R
112G
112B
101
111R
111G
111B
111C 113
114
112R
112G
112B
114
113
101
111R
111G
111B
111C 113
121
114
112R
112G
112B
121
114
113
101
111R
111G
111B
111C 146a
144a
112Rf
101
111R
134
131
111G
111B
111C 143a
146a
144a
112Rf
101
111R
134
131
111G
111B
111C 143a
147a
144a
112Rf
101
111R
134
131
111G
111B
111C 147a
144a
112Rf
101
111R
134
131
111G
111B
111C 147a
145a
112Rf
101
111R
134
131
111G
111B
111C 145a
112R
101
111R
134
131
111G
111B
111C 145a
146b
144b
112Gf
145a
101
111R
111G
111B
111C 146b
143b
144b
112Gf
101
111R
111G
111B
111C 143b
147b
144b
112Gf
101
111R
111G
111B
111C 145b
145a
112R
145b
112G
145a
101
111R
111G
134
131
132
111B
111C 145c
145b
145a
112R
145a
112G
145b
112B
145b
101
111R
111G
134
131
132
111B
111C 400C
442
228
443
215
213
211
462
464
222b
223
205
231
221
222a
430c
B
413
452
416
426c
411c
430b
G
421
424
426b
411b
430a
R
417
426a
411a
201
465
242
466
472
214
204
454

416
416a
416b
416c
451

DISPLAY DEVICE COMPRISING PARTITION COVERING ADJACENT PIXEL ELECTRODES AND MANUFACTURING METHOD OF DISPLAY DEVICE

TECHNICAL FIELD

One embodiment of the present invention relates to a display device. One embodiment of the present invention relates to a manufacturing method of the display device.

Note that one embodiment of the present invention is not limited to the above technical field. Examples of a technical field of one embodiment of the present invention disclosed in this specification and the like include a semiconductor device, a display device, a light-emitting apparatus, a power storage device, a memory device, an electronic device, a lighting device, an input device, an input/output device, a driving method thereof, and a manufacturing method thereof. A semiconductor device refers to any device that can function by utilizing semiconductor characteristics.

BACKGROUND ART

In recent years, higher-resolution display panels have been required. Examples of devices that require high-resolution display panels include a smartphone, a tablet terminal, and a notebook personal computer. Furthermore, higher resolution has been required for a stationary display device such as a television device or a monitor device along with an increase in definition. Examples of devices required to have the highest resolution include devices for virtual reality (VR) and augmented reality (AR).

Examples of display devices that can be used for a display panel include, typically, a liquid crystal display device, a light-emitting apparatus including a light-emitting element such as an organic EL (Electro Luminescence) element or a light-emitting diode (LED), and electronic paper performing display by an electrophoretic method or the like.

Patent Document 1, for example, discloses an example of a display device for VR using an organic EL element.

REFERENCE

Patent Document

[Patent Document 1] PCT International Publication No. 2018/087625

SUMMARY OF THE INVENTION

Problems to be Solved by the Invention

An object of one embodiment of the present invention is to provide a high-resolution display device. Another object of one embodiment of the present invention is to provide a display device with a high aperture ratio. Another object of one embodiment of the present invention is to provide a display device with both high display quality and high resolution. Another object of one embodiment of the present invention is to provide a high-contrast display device. Another object of one embodiment of the present invention is to provide a highly reliable display device.

Another object of one embodiment of the present invention is to provide a display device with a novel structure or a manufacturing method of the display device. Another object of one embodiment of the present invention is to provide a manufacturing method of the above-described display device with high yield. Another object of one embodiment of the present invention is to at least reduce at least one of problems of the conventional technique.

Note that the description of these objects does not preclude the existence of other objects. Note that one embodiment of the present invention does not have to achieve all the objects. Note that objects other than these can be derived from the descriptions of the specification, the drawings, the claims, and the like.

Means for Solving the Problems

One embodiment of the present invention is a display device including a first display element including a first pixel electrode, a first EL layer, and a common electrode; a second display element including a second pixel electrode, a second EL layer, and the common electrode; a first insulating layer covering an end portion of the first pixel electrode and an end portion of the second pixel electrode; a second insulating layer over the first insulating layer; and a third insulating layer over the second insulating layer. The first EL layer is placed over the first pixel electrode and the third insulating layer, and the second EL layer is placed over the second pixel electrode and the third insulating layer.

One embodiment of the present invention is a display device including a first display element including a first pixel electrode, a first EL layer, and a common electrode; a second display element including a second pixel electrode, a second EL layer, and the common electrode; a first insulating layer covering an end portion of the first pixel electrode and an end portion of the second pixel electrode; a second insulating layer over the first insulating layer; and a third insulating layer over the second insulating layer. The first EL layer is placed over the first pixel electrode and the third insulating layer. The second EL layer is placed over the second pixel electrode and the third insulating layer. The third insulating layer includes a region in contact with the first insulating layer over the first pixel electrode.

One embodiment of the present invention is a method for manufacturing a display device, including steps of: forming a pixel electrode; forming a first insulating film over the pixel electrode; forming a second insulating layer over the first insulating film to cover an end portion of the pixel electrode; forming a second insulating film over the first insulating film and the second insulating layer; forming a first insulating layer covering the end portion of the pixel electrode and a third insulating layer including a region in contact with the first insulating layer by etching the first insulating film and the second insulating film using a resist mask; forming an EL layer over the pixel electrode and the third insulating layer; and forming a common electrode over the EL layer.

In the above manufacturing method, the first insulating layer, the second insulating layer, and the third insulating layer are preferably processed using the same photomask (light exposure mask). Specifically, the second insulating layer is formed in the following manner: an insulating film X to be the first insulating layer is formed, and a photosensitive organic resin is deposited thereover and exposed to light using a photomask and then developed. In this case, light exposure conditions are controlled so that the second insulating layer is formed to have a pattern width narrower than the pattern width of the photomask. After that, an insulating film Y to be the third insulating layer is deposited, a resist mask that is patterned using the above photomask is formed, and the insulating film X and the insulating film Y are etched using the resist mask, whereby the first insulating layer and the third insulating layer can be formed. In this case, light exposure conditions of the resist mask are controlled so that the resist mask is formed to have a pattern width wider than the pattern width of the second insulating layer. In this manner, insulating layers with different pattern widths can be separately formed by using the same photomask.

In any of the above, the first insulating layer and the third insulating layer preferably contain an inorganic material. Specifically, it is preferable to contain silicon oxide, silicon oxynitride, silicon nitride oxide, silicon nitride, aluminum oxide, aluminum oxynitride, hafnium oxide, indium gallium oxide, or indium gallium zinc oxide.

In any of the above, the second insulating layer preferably contains an organic material. Specifically, an acrylic resin, a polyimide resin, an epoxy resin, a polyamide resin, a polyimide-amide resin, a siloxane resin, a benzocyclobutene-based resin, a phenol resin, or a precursor of any of these resins is preferably included.

One embodiment of the present invention is a display device including a first display element including a first pixel electrode, a first EL layer, and a common electrode; a second display element including a second pixel electrode, a second EL layer, and the common electrode; a first insulating layer covering an end portion of the first pixel electrode and an end portion of the second pixel electrode; and a second insulating layer over the first insulating layer. The first EL layer is placed over the first pixel electrode and the second insulating layer. The second EL layer is placed over the second pixel electrode and the second insulating layer. The first insulating layer contains an inorganic material. The second insulating layer contains an organic material.

One embodiment of the present invention is a display device including a first display element including a first pixel electrode, a first EL layer, and a common electrode; a second display element including a second pixel electrode, a second EL layer, and the common electrode; a first insulating layer covering an end portion of the first pixel electrode and an end portion of the second pixel electrode; and a second insulating layer over the first insulating layer. The first EL layer is placed over the first pixel electrode and the second insulating layer. The first EL layer includes a region in contact with the first insulating layer over the first pixel electrode. The second EL layer is placed over the second pixel electrode and the second insulating layer. The second EL layer includes a region in contact with the first insulating layer over the second pixel electrode. The first insulating layer contains an inorganic material. The second insulating layer contains an organic material.

One embodiment of the present invention is a display device including a first display element including a first pixel electrode, a first EL layer, and a common electrode; a second display element including a second pixel electrode, a second EL layer, and the common electrode; a first insulating layer covering an end portion of the first pixel electrode and an end portion of the second pixel electrode; and a second insulating layer over the first insulating layer. The first EL layer is placed over the first pixel electrode and the second insulating layer. The second EL layer is placed over the second pixel electrode and the second insulating layer. The second insulating layer includes a region in contact with the first pixel electrode and a region in contact with the second pixel electrode. The first insulating layer contains an inorganic material. The second insulating layer contains an organic material.

One embodiment of the present invention is a display device including a pixel electrode; a first insulating layer covering an end portion of the pixel electrode; a second insulating layer over the first insulating layer; an EL layer over the pixel electrode and the second insulating layer; and a common electrode over the EL layer. The first insulating layer contains an inorganic material. The second insulating layer contains an organic material.

One embodiment of the present invention is a display device including a pixel electrode; a first insulating layer covering an end portion of the pixel electrode; a second insulating layer over the first insulating layer; an EL layer over the pixel electrode and the second insulating layer; and a common electrode over the EL layer. The EL layer includes a region in contact with the first insulating layer over the pixel electrode. The first insulating layer contains an inorganic material. The second insulating layer contains an organic material.

One embodiment of the present invention is a display device including a pixel electrode; a first insulating layer covering an end portion of the pixel electrode; a second insulating layer over the first insulating layer; an EL layer over the pixel electrode and the second insulating layer; and a common electrode over the EL layer. The second insulating layer includes a region in contact with the pixel electrode. The first insulating layer contains an inorganic material. The second insulating layer contains an organic material.

One embodiment of the present invention is a method for manufacturing a display device, including steps of: forming a pixel electrode; forming a first insulating film over the pixel electrode; forming a second insulating layer over the first insulating film to cover an end portion of the pixel electrode; forming a first insulating layer covering the end portion of the pixel electrode by etching the first insulating film using a resist mask; forming an EL layer over the pixel electrode and the second insulating layer; and forming a common electrode over the EL layer. The first insulating layer contains an inorganic material. The second insulating layer contains an organic material.

One embodiment of the present invention is a method for manufacturing a display device, including steps of: forming a pixel electrode; forming a first insulating layer to cover an end portion of the pixel electrode; forming a second insulating layer to cover the first insulating layer; forming an EL layer over the pixel electrode and the second insulating layer; and forming a common electrode over the EL layer. The first insulating layer contains an inorganic material. The second insulating layer contains an organic material.

In the above manufacturing method, the first insulating layer and the second insulating layer are preferably processed using the same photomask (light exposure mask). Specifically, the second insulating layer is formed in the following manner: an insulating film X to be the first insulating layer is formed, and a photosensitive organic resin is deposited thereover and exposed to light using a photomask and then developed. In this case, light exposure conditions are controlled so that the second insulating layer is formed to have a pattern width narrower than the pattern width of the photomask. After that, a resist mask that is patterned using the above photomask is formed and the insulating film X is etched using the resist mask, whereby the first insulating layer can be formed. In this case, light exposure conditions of the resist mask are controlled so that the resist mask is formed to have a pattern width wider than the pattern width of the second insulating layer. In this manner, insulating layers with different pattern widths can be separately formed by using the same photomask. This manufacturing method is an example, and another manufacturing method may be used.

In any of the above, the first insulating layer preferably contains silicon oxide, silicon oxynitride, silicon nitride oxide, silicon nitride, aluminum oxide, aluminum oxynitride, hafnium oxide, indium gallium oxide, or indium gallium zinc oxide. Note that these materials are examples, and another inorganic material or organic material may be used.

In any of the above, the second insulating layer preferably contains an acrylic resin, a polyimide resin, an epoxy resin, a polyamide resin, a polyimide-amide resin, a siloxane resin, a benzocyclobutene-based resin, a phenol resin, or a precursor of any of these resins, for example. Note that these materials are examples, and another inorganic material or organic material may be used.

Effect of the Invention

According to one embodiment of the present invention, a high-resolution display device can be provided. A display device with both high display quality and high resolution can be provided. A high-contrast display device can be provided. A highly reliable display device can be provided.

According to one embodiment of the present invention, a display device with a novel structure or a manufacturing method of the display device can be provided. A manufacturing method of the above-described display device with high yield can be provided. One embodiment of the present invention can at least reduce at least one of problems of the conventional technique.

Note that the description of these effects does not preclude the existence of other effects. Note that one embodiment of the present invention does not need to have all of these effects. Note that effects other than these can be derived from the descriptions of the specification, the drawings, the claims, and the like.

MODE FOR CARRYING OUT THE INVENTION

Figure 1A:
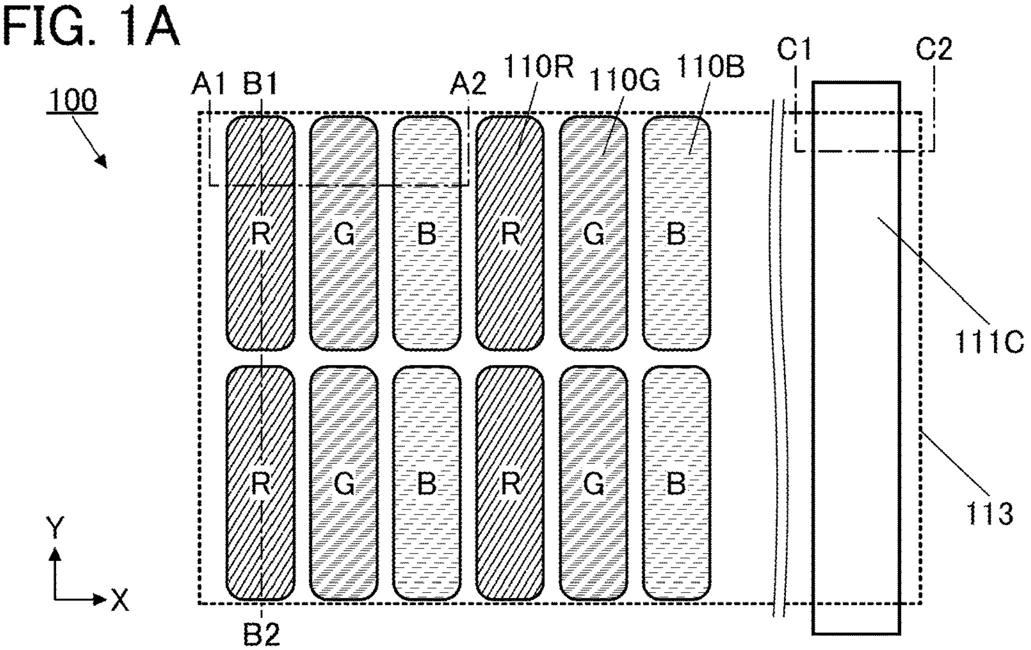
FIG. 1A to FIG. 1D are diagrams illustrating a structure example of a display device.

Hereinafter, embodiments will be described with reference to the drawings. Note that the embodiments can be implemented in many different modes, and it will be readily understood by those skilled in the art that modes and details thereof can be changed in various ways without departing from the spirit and scope thereof. Thus, the present invention should not be interpreted as being limited to the following description of the embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification and the like, ordinal numbers such as "first," "second," and the like are used in order to avoid confusion among components and do not limit the number.

In this specification and the like, the term "film" and the term "layer" can be interchanged with each other. For example, in some cases, the term "conductive layer" and the term "insulating layer" can be interchanged with the term "conductive film" and the term "insulating film", respectively. Furthermore, the term "above" includes not only "vertically upward" but also "diagonally upward". Similarly, the terms "upper portion", "below", and "lower portion" also include diagonal directions.

Note that in this specification, an EL layer means a layer containing at least a light-emitting substance (also referred to as a light-emitting layer) or a stacked-layer body including the light-emitting layer provided between a pair of electrodes of a light-emitting element.

In this specification and the like, a display panel that is one embodiment of a display device has a function of displaying (outputting) an image or the like on (to) a display surface. Therefore, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

A light-emitting element of one embodiment of the present invention may include layers containing a substance with a high hole-injection property, a substance with a high hole-transport property, a substance with a high electron-transport property, a substance with a high electron-injection property, a substance with a bipolar property, and the like.

Note that the light-emitting layer and the layers containing a substance with a high hole-injection property, a substance with a high hole-transport property, a substance with a high electron-transport property, a substance with a high electron-injection property, and a substance with a bipolar property may include an inorganic compound such as a quantum dot or a high molecular compound (e.g., an oligomer, a dendrimer, and a polymer). For example, when used for the light-emitting layer, the quantum dots can function as a light-emitting material.

Note that as the quantum dot material, a colloidal quantum dot material, an alloyed quantum dot material, a core-shell quantum dot material, a core quantum dot material, or the like can be used. The material containing elements belonging to Group 12 and Group 16, elements belonging to Group 13 and Group 15, or elements belonging to Group 14 and Group 16, may be used. Alternatively, the quantum dot material containing an element such as cadmium, selenium, zinc, sulfur, phosphorus, indium, tellurium, lead, gallium, arsenic, or aluminum may be used.

Embodiment 1

In this embodiment, structure examples of a display device of one embodiment of the present invention are described.

[Structure Example 1 of Display Device]

One embodiment of the present invention is a display device including a light-emitting element (also referred to as a light-emitting device) as a display element. The display device includes at least two light-emitting elements which emit light of different colors. The light-emitting elements each include a pair of electrodes and an EL layer therebetween. The light-emitting elements are preferably organic EL elements (organic electroluminescent elements). The two or more light-emitting elements emitting different colors include respective EL layers containing different materials. For example, three kinds of light-emitting elements emitting red (R) light, green (G) light, and blue (B) light are included, whereby a full-color display device can be achieved.

FIG. 1A is a schematic top view of a display device 100 of one embodiment of the present invention. The display device 100 includes a plurality of light-emitting elements 110R exhibiting red, a plurality of light-emitting elements 110G exhibiting green, and a plurality of light-emitting elements 110B exhibiting blue. In FIG. 1A, light-emitting regions of the light-emitting elements are denoted by R, G, and B to easily differentiate the light-emitting elements.

The light-emitting elements 110R, the light-emitting elements 110G, and the light-emitting elements 110B are arranged in a matrix. FIG. 1A illustrates what is called a stripe arrangement, in which light-emitting elements of the same color are arranged in one direction. Note that the arrangement method of the light-emitting elements is not limited thereto; another arrangement method such as an S-stripe arrangement, a delta arrangement, a Bayer arrangement, or a zigzag arrangement may be employed, or a PenTile arrangement may also be used.

The light-emitting elements 110R, the light-emitting elements 110G, and the light-emitting elements 110B are arranged in the X direction. The light-emitting elements of the same color are arranged in the Y direction intersecting with the X direction.

As the light-emitting elements 110R, the light-emitting elements 110G, and the light-emitting elements 110B, an EL element such as an OLED (Organic Light Emitting Diode) or a QLED (Quantum-dot Light Emitting Diode) is preferably used. As a light-emitting substance contained in the EL element, a substance that emits fluorescence (a fluorescent material), a substance that emits phosphorescence (a phosphorescent material), an inorganic compound (e.g., a quantum dot material), a substance that exhibits thermally activated delayed fluorescence (a thermally activated delayed fluorescent (TADF) material), and the like can be given. Note that as a TADF material, a material that is in a thermal equilibrium state between a singlet excited state and a triplet excited state may be used. Since such a TADF material enables a short emission lifetime (excitation lifetime), an efficiency decrease of a light-emitting element in a high-luminance region can be inhibited.

Figure 1B:
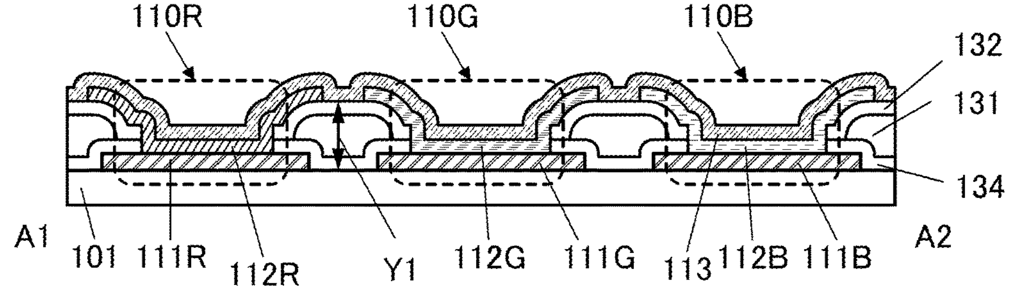
Figure 1C:
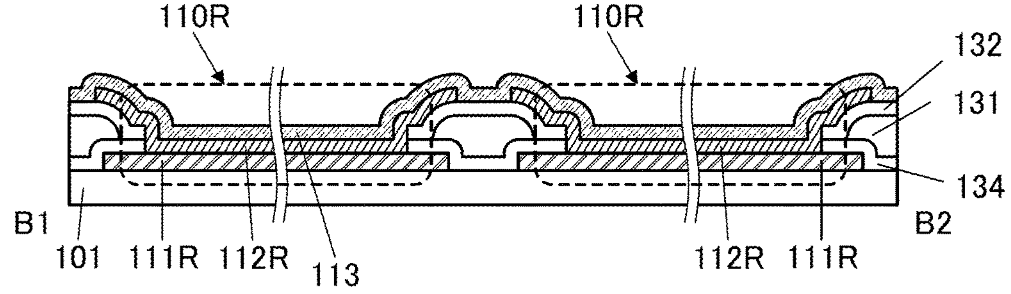

FIG. 1B is a schematic cross-sectional view taken along the dashed-dotted line A1-A2 in FIG. 1A, and FIG. 1C is a schematic cross-sectional view taken along the dashed-dotted line B1-B2.

FIG. 1B illustrates a cross section of the light-emitting element 110R, the light-emitting element 110G, and the light-emitting element 110B. The light-emitting element 110R includes a pixel electrode 111R, an EL layer 112R, and a common electrode 113. The light-emitting element 110G includes a pixel electrode 111G, an EL layer 112G, and the common electrode 113. The light-emitting element 110B includes a pixel electrode 111B, an EL layer 112B, and the common electrode 113. The common electrode 113 is shared by the light-emitting element 110R, the light-emitting element 110G, and the light-emitting element 110B.

In one embodiment of the present invention, an insulating layer (also referred to as an embankment, a bank, or a partition) is preferably provided to cover end portions of the pixel electrode 111R and the like (referring to the pixel electrode 111R, the pixel electrode 111G, and the pixel electrode 111B).

With this partition, step coverage with the EL layer 112R and the like (referring to the EL layer 112R, the EL layer 112G, and the EL layer 112B) over the partition can be improved. A reduction in the thicknesses of the EL layer 112R and the like at the end portions of the pixel electrode 111R and the like can be prevented, so that an increase in leakage current can be prevented. An electrical short circuit between the pixel electrode 111R and the like and the common electrode 113 placed over the EL layer 112R and the like can be prevented. The partition can be formed of a single insulating layer or two or more insulating layers.

FIG. 1B illustrates an example in which the partition is formed of three or more layers. Specifically, an insulating layer 134 covering the end portions of the pixel electrode 111R and the like, an insulating layer 131 over the insulating layer 134, and an insulating layer 132 over the insulating layer 131 are provided.

The insulating layer 134, the insulating layer 131, and the insulating layer 132 each include a portion overlapping with the EL layer 112R and the like and a portion not overlapping with the EL layer 112R and the like.

The insulating layer 134 includes a portion overlapping with the pixel electrode 111R and the like and a portion not overlapping with the pixel electrode 111R and the like. The insulating layer 131 over the insulating layer 134 includes a portion overlapping with the pixel electrode 111R and the like with the insulating layer 134 therebetween and a portion not overlapping with the pixel electrode 111R and the like. The insulating layer 132 over the insulating layer 131 includes a portion overlapping with the pixel electrode 111R and the like with the insulating layer 134 therebetween, a portion overlapping with the pixel electrode 111R and the like with the insulating layer 131 and the insulating layer 134 therebetween, and a portion not overlapping with the pixel electrode 111R and the like.

The insulating layer 132 is preferably placed to cover an end portion of the insulating layer 131. The insulating layer 132 can be placed to include a region in contact with the insulating layer 134.

An end portion of the insulating layer 134 preferably includes a region protruding beyond the end portion of the insulating layer 131 (also referred to as a region extending beyond the end portion) in the end portion direction. Furthermore, an end portion of the insulating layer 132 also preferably includes a region protruding beyond the end portion of the insulating layer 131. In the plan view, the outline of the insulating layer 131 preferably includes a portion positioned inside the outline of the insulating layer 134 and the outline of the insulating layer 132. In that case, part or all of the end portion of the insulating layer 131 can be wrapped in the insulating layer 134 and the insulating layer 132. The insulating layer 132 and the insulating layer 134 are preferably placed to sandwich the insulating layer 131 therebetween, in particular, the insulating layer 132 and the insulating layer 134 are preferably in contact with each other at the end portion of the insulating layer 131.

Here, the insulating layer 134 has a function as a layer for protecting the pixel electrode 111R (also referred to as a protective layer). The insulating layer 132 has a function as a layer for protecting the insulating layer 131 (also referred to as a protective layer).

Figure 2A:
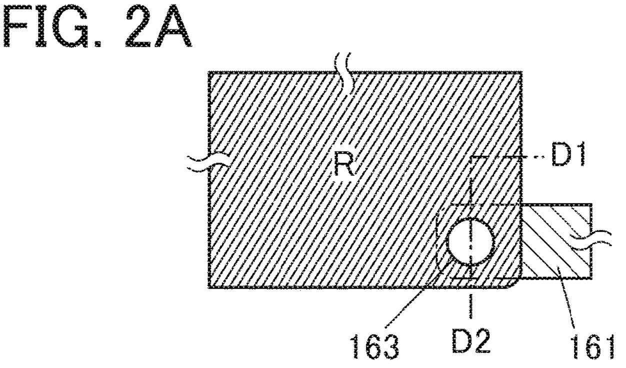
FIG. 2A to FIG. 2C are diagrams illustrating structure examples of a display device.
Figure 2B:
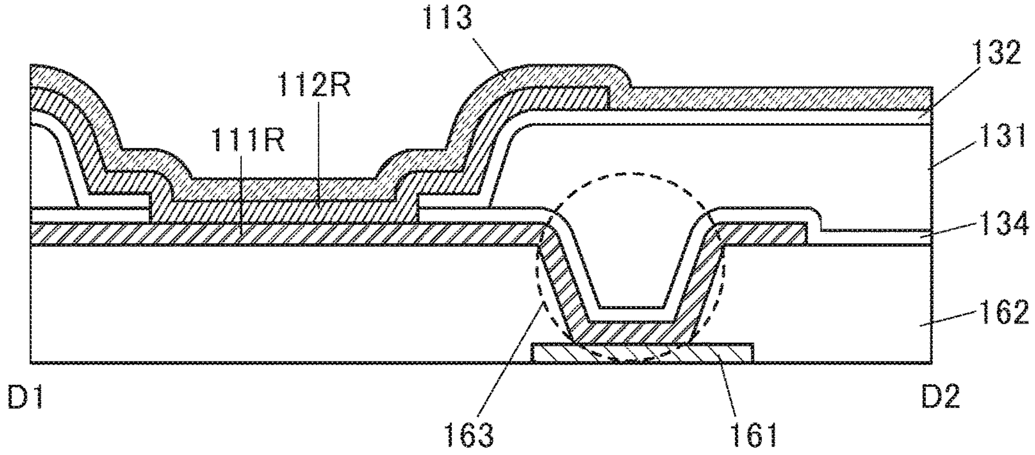
Figure 2C:
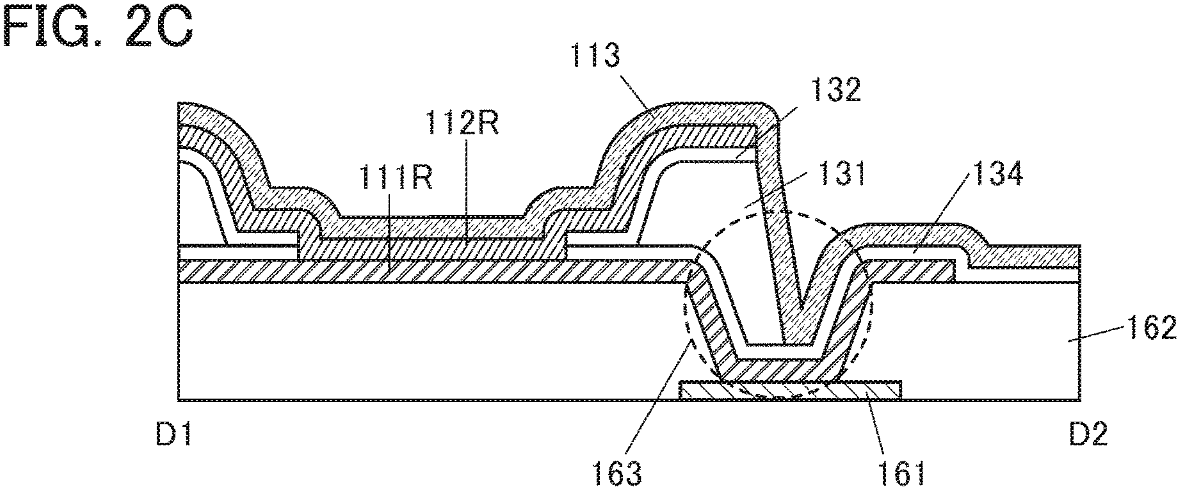

FIG. 2 illustrates a specific example in which the insulating layer 132 or the insulating layer 134 functions as a protective layer. FIG. 2A illustrates part of the light-emitting element 110R in FIG. 1A and the vicinity thereof, and FIG. 2B and FIG. 2C are examples of schematic cross-sectional views taken along the dashed-dotted line D1-D2 in FIG. 2A. D1-D2 indicates a portion where the pixel electrode 111R is electrically connected to a layer 161.

In FIG. 2B and FIG. 2C, the layer 161 is, for example, a layer electrically connected to a transistor (e.g., a conductive layer or a semiconductor layer), and an insulating layer 162 functioning as a planarization film is placed over the layer 161. The pixel electrode 111R placed over the insulating layer 162 is electrically connected to the layer 161 through a contact hole 163 in the insulating layer 162. Note that the insulating layer 162 is an insulating layer included in a substrate 101 in FIG. 1.

A partition is preferably provided in a portion over the pixel electrode 111R, from which a display region is excluded (e.g., a portion including the contact hole 163). However, when the insulating layer 131 having a single layer is placed as the partition, for example, the insulating layer 131 might be removed due to a formation process of an EL layer over the partition. For example, the partition might be removed when forming the EL layer by etching.

Thus, when the insulating layer 132 is provided over the insulating layer 131 as illustrated in FIG. 2B, the insulating layer 132 functions as a protective layer (etching stopper), so that exposure or removal of the insulating layer 131 can be prevented.

When the insulating layer 134 is provided under the insulating layer 131 as illustrated in FIG. 2C, the insulating layer 134 functions as a protective layer (etching stopper) even if part of the insulating layer 131 is removed, so that exposure of the pixel electrode 111R can be prevented. As a result, a short circuit between the pixel electrode 111R and the common electrode 113 can be prevented.

As described above, a structure in which the insulating layer 132 is placed over the insulating layer 131 or a structure in which the insulating layer 134 is placed under the insulating layer 131 is employed, whereby defects of a display device can be reduced and the display quality can be improved. A structure in which the end portion of the insulating layer 131 is wrapped in the insulating layer 134 and the insulating layer 132 is particularly preferably employed, in which case synergistic effects can be produced.

Next, examples of materials which are preferable for the insulating layer 134, the insulating layer 131, and the insulating layer 132 are described.

For the insulating layer 134, an insulating film containing an inorganic insulating material (also referred to as an inorganic material or an inorganic substance) is preferably used. For the insulating layer 134, it is further preferable to use an insulating film having etching resistance to an etching step of the EL layer 112R. Using such a material for the insulating layer 134 can enhance the function as a protective layer.

For the insulating layer 131, an insulating film containing an organic insulating material (also referred to as an organic material or an organic substance) such as an organic resin is preferably used. In that case, the end portion of the insulating layer 131 preferably has a moderate curve. This can improve step coverage with a layer (e.g., an EL layer) formed over the insulating layer 131.

For the insulating layer 132, an insulating film containing an inorganic insulating material (also referred to as an inorganic material or an inorganic substance) is preferably used. For the insulating layer 132, it is further preferable to use an insulating film having etching resistance to an etching step of the EL layer 112R. Using such a material for the insulating layer 132 can enhance the function as a protective layer. Note that even if part of the insulating layer 131 is removed, exposure of the pixel electrode 111R can be prevented by the effect of the insulating layer 134 described above.

Specific examples of the inorganic insulating materials that can be used for the insulating layer 134 and the insulating layer 132 include films of oxides and nitrides such as silicon oxide, silicon oxynitride, silicon nitride oxide, silicon nitride, aluminum oxide, aluminum oxynitride, and hafnium oxide. Yttrium oxide, zirconium oxide, gallium oxide, tantalum oxide, magnesium oxide, lanthanum oxide, cerium oxide, neodymium oxide, or the like may be used.

Specific examples of materials that can be used for the insulating layer 131 include an acrylic resin, a polyimide resin, an epoxy resin, a polyamide resin, a polyimide-amide resin, a siloxane resin, a benzocyclobutene-based resin, a phenol resin, and precursors of these resins.

As described above, using suitable materials for the insulating layer 134, the insulating layer 131, and the insulating layer 132 can enhance the function as the partition. Note that the above materials are examples, and another material can be used. For example, an organic insulating material such as an organic resin may be used for the insulating layer 134 and the insulating layer 132. In that case, the partition can be formed high and have a function similar to that of the etching stopper described above. The insulating layer 131 can also be formed using an inorganic insulating material.

The end portion of the insulating layer 134, the insulating layer 131, or the insulating layer 132 preferably has a tapered shape. This can improve step coverage with a film formed over these insulating layers. Note that in this specification and the like, an end portion of an object having a tapered shape indicates that the end portion of the object has a cross-sectional shape in which the angle between a surface of the object and a surface on which the object is formed is larger than 0° and smaller than 90° in a region of the end portion, preferably, larger than or equal to 5° and smaller than or equal to 70°, and the thickness continuously increases from the end portion.

In addition, the thickness of the insulating layer 132 is preferably smaller than the thickness of the insulating layer 131. When the insulating layer 132 is formed to be thin, the step coverage with a film formed over the insulating layer 132 can be improved. The thickness of the insulating layer 134 is also preferably smaller than the thickness of the insulating layer 131.

Note that although the light-emitting element 110R is described as an example in FIG. 2, a similar structure can be applied to the light-emitting element 110G and the light-emitting element 110B.

The EL layer 112R included in the light-emitting element 110R contains at least a light-emitting organic compound that emits light with intensity in a red wavelength range. The EL layer 112G included in the light-emitting element 110G contains at least a light-emitting organic compound that emits light with intensity in a green wavelength range. The EL layer 112B included in the light-emitting element 110B contains at least a light-emitting organic compound that emits light with intensity in a blue wavelength range.

The EL layer 112R, the EL layer 112G, and the EL layer 112B may each include one or more of an electron-injection layer, an electron-transport layer, a hole-injection layer, and a hole-transport layer in addition to the layer containing a light-emitting organic compound (the light-emitting layer).

A conductive film having a light-transmitting property with respect to visible light is preferably used for either the pixel electrode 111R and the like or the common electrode 113, and a reflective conductive film is preferably used for the other. The use of the light-transmitting pixel electrodes and the reflective common electrode 113 offers a bottom-emission display device whereas the use of the reflective pixel electrodes and the light-transmitting common electrode 113 offers a top-emission display device. Note that when both the pixel electrode 111R and the like and the common electrode 113 have a light-transmitting property, the display device can have a dual emission structure.

FIG. 1A illustrates a connection electrode 111C that is electrically connected to the common electrode 113. The connection electrode 111C is supplied with a potential (e.g., an anode potential or a cathode potential) that is to be supplied to the common electrode 113. The connection electrode 111C is provided outside a display region where the light-emitting elements 110R and the like are arranged. In FIG. 1A, the common electrode 113 is denoted by a dashed line.

The connection electrode 111C can be provided along the outer periphery of the display region. For example, the connection electrode 111C may be provided along one side of the outer periphery of the display region or two or more sides of the outer periphery of the display region. That is, in the case where the display region has a rectangular top surface shape, a top surface shape of the connection electrode 111C can be a band shape, an L shape, a U shape (a square bracket shape), a quadrangular shape, or the like.

Figure 1D:
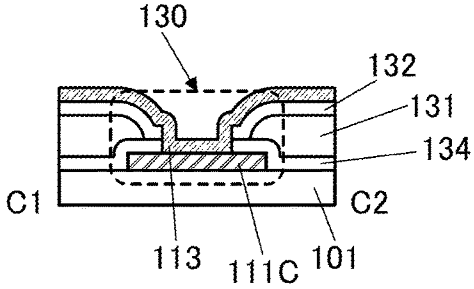

FIG. 1D is a schematic cross-sectional view taken along the dashed-dotted line C1-C2 in FIG. 1A. FIG. 1D illustrates a connection portion 130 in which the connection electrode 111C is electrically connected to the common electrode 113. In the connection portion 130, the common electrode 113 is provided on and in contact with the connection electrode 111C. The insulating layer 134, the insulating layer 131, and the insulating layer 132 are provided to cover an end portion of the connection electrode 111C.

At least part of the structure examples, the manufacturing method examples, the drawings corresponding thereto, and the like described in this embodiment can be combined with the other structure examples, the other manufacturing method examples, the other drawings, and the like as appropriate. The terms or expressions used for describing the structure or manufacturing method in this specification can be appropriately used for defining another structure or manufacturing method.

At least part of this embodiment can be implemented in combination with the other embodiments described in this specification as appropriate.

Embodiment 2

Other structure examples of the display device of one embodiment of the present invention are described below with reference to drawings. Structure example 1 and the like are referred to for portions similar to those described in Structure example 1 and the like, and portions are not described.

FIG. 3 and FIG. 4 are schematic cross-sectional views of a display device 100A to a display device 100E which are other structure examples of the display device of the present invention. Top views of the display device 100A to the display device 100E are similar to FIG. 1A.

[Structure Example 2 of Display Device]

Figure 3A:
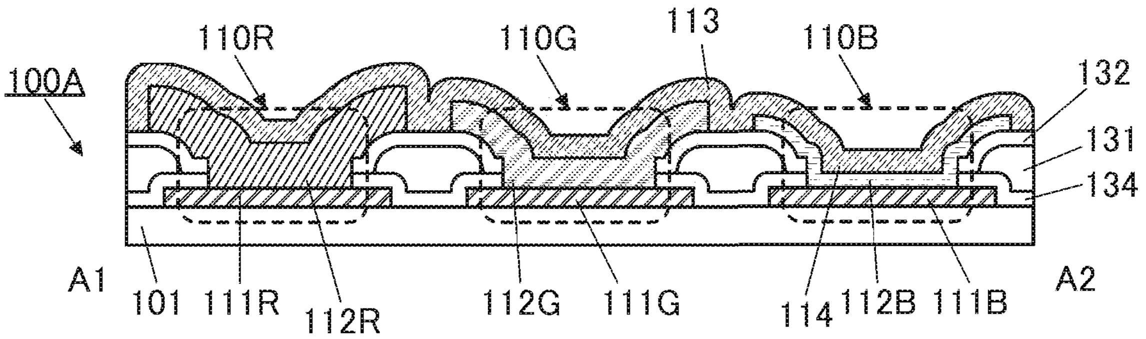
FIG. 3A to FIG. 3D are diagrams illustrating structure examples of display devices.

FIG. 3A is a schematic cross-sectional view of the display device 100A (corresponding to a cross-section in the X direction in FIG. 1A). The display device 100A is an example in which a microcavity structure is achieved by changing the thicknesses of the EL layer 112R, the EL layer 112G, and the EL layer 112B. Such a structure does not require an optical adjustment layer provided additionally, simplifying the process.

For example, in the display device 100A, the EL layer 112R of the light-emitting element 110R emitting light whose wavelength is longest has the largest thickness, and the EL layer 112B of the light-emitting element 110B emitting light whose wavelength is shortest has the smallest thickness. Without limitation to this, the thickness of each EL layer can be adjusted in consideration of the wavelength of light emitted by the light-emitting element, the optical characteristics of the layer included in the light-emitting element, the electrical characteristics of the light-emitting element, and the like.

[Structure Example 3 of Display Device]

Figure 3B:
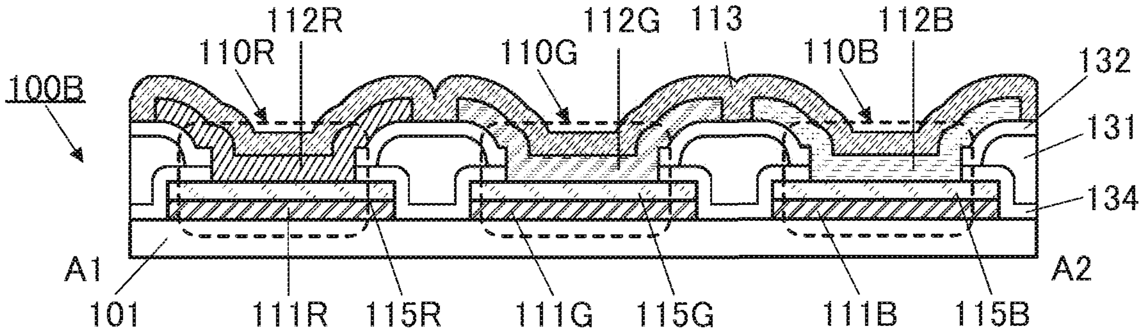

FIG. 3B is a schematic cross-sectional view of the display device 100B (corresponding to a cross section in the X direction in FIG. 1A). The display device 100B is an example in which an optical adjustment layer is provided.

The light-emitting element 110R includes an optical adjustment layer 115R between the pixel electrode 111R and the EL layer 112R. The light-emitting element 110G includes an optical adjustment layer 115G between the pixel electrode 111G and the EL layer 112G. The light-emitting element 110B includes an optical adjustment layer 115B between the pixel electrode 111B and the EL layer 112B.

Figure 12A:
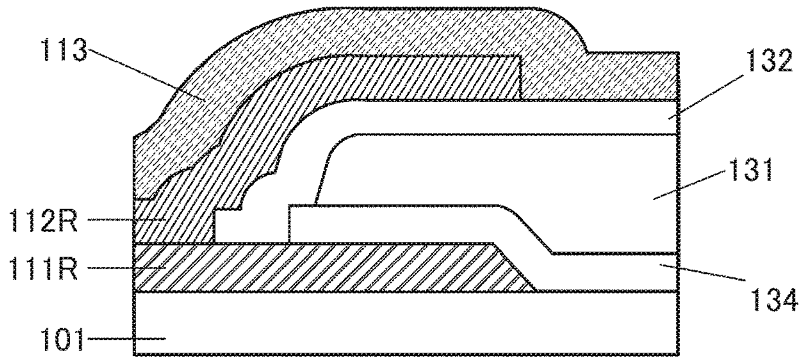
FIG. 12A to FIG. 12D are diagrams illustrating structure examples of a display device.
Figure 12B:
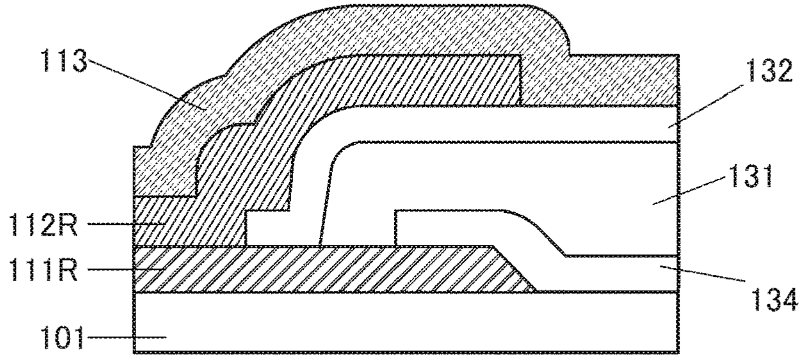
Figure 12C:
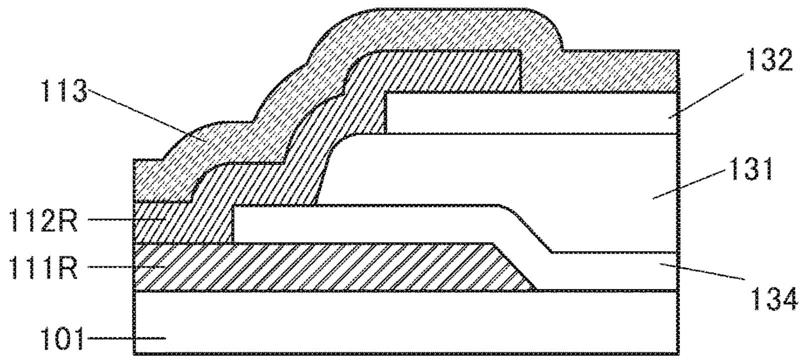
Figure 12D:
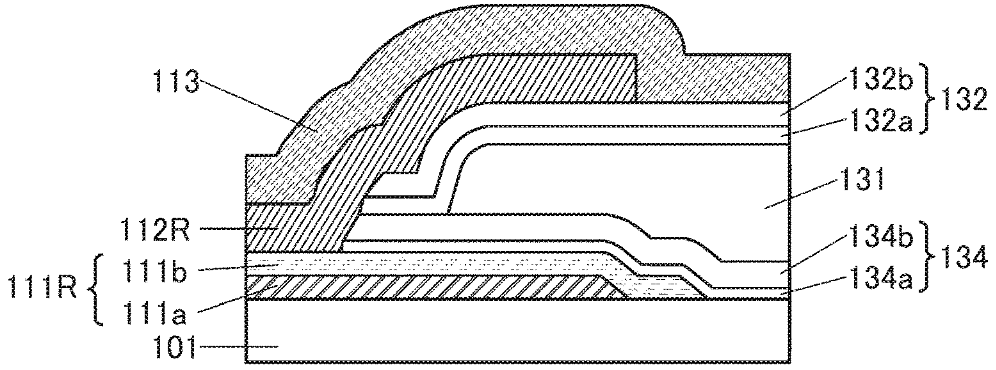

Each of the optical adjustment layer 115R, the optical adjustment layer 115G, and the optical adjustment layer 115B corresponds to a conductive layer 111*b* illustrated as an example in FIG. 12D and the like. In this case, the pixel electrode 111R, the pixel electrode 111G, and the pixel electrode 111B each correspond to a conductive layer 111*a*.

In addition, the optical adjustment layer 115R, the optical adjustment layer 115G, and the optical adjustment layer 115B each have a light-transmitting property with respect to visible light. The optical adjustment layer 115R, the optical adjustment layer 115G, and the optical adjustment layer 115B have different thicknesses. Thus, the optical path lengths of the light-emitting elements can differ from one another.

Here, a conductive film that has a reflective property with respect to visible light is used for the pixel electrode 111R and the like, and a conductive film that has properties of reflecting and transmitting visible light is used for the common electrode 113. Thus, the light-emitting elements have what is called a microcavity structure and intensify light with a specific wavelength. This can achieve a display device having a high color purity.

A conductive material having a light-transmitting property with respect to visible light can be used for each of the optical adjustment layers. For example, a conductive oxide such as indium oxide, indium tin oxide, indium zinc oxide, zinc oxide, zinc oxide containing gallium, indium-tin oxide containing silicon, or an indium-zinc oxide containing silicon can be used.

The optical adjustment layers can be formed after the formation of the pixel electrode 111R and the like and before the formation of a film to be the EL layer 112 (an EL film 112Rf described later) and the like. The optical adjustment layers may be formed using conductive films with different thicknesses from each other or may have a single-layer structure, a two-layer structure, a three-layer structure, or the like, in ascending order of thickness. Note that a layer in which the pixel electrode 111R and the optical adjustment layer 115R are stacked is sometimes referred to as a pixel electrode.

[Structure Example 4 of Display Device]

Figure 3C:
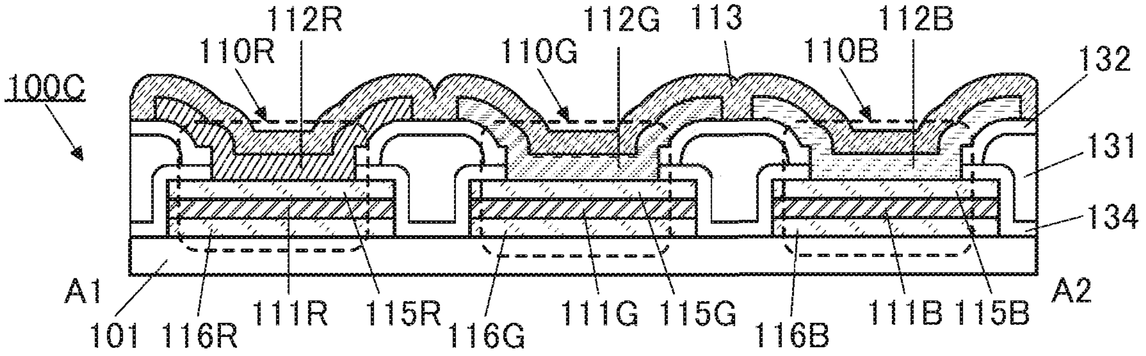

FIG. 3C is a schematic cross-sectional view of the display device 100C (corresponding to the cross-section in the X direction in FIG. 1A). The display device 100C is an example in which a conductive layer 116R and the like (referring to the conductive layer 116R, a conductive layer 116G, and a conductive layer 116B) are provided under the pixel electrode 111R and the like in addition to the display device 100B in FIG. 3B.

The pixel electrode 111R and the like are electrically connected to the lower layer 161 (FIG. 2B), and providing the conductive layer 116R and the like makes a connection between the layer 161 and the pixel electrode 111R and the like becomes favorable in some cases.

The conductive layer 116R and the like can be formed using a material having a light-transmitting property or a material having a reflective property. As the material having a light-transmitting property, a material can be appropriately selected from the materials described for the optical adjustment layer 115R. In particular, the conductive layer 116R and the like are preferably formed using the same material as the optical adjustment layer 115R, but a different material may be used. As the material having a reflective property, a material can be appropriately selected from the materials described for the pixel electrode 111R. The conductive layer 116R and the like are preferably formed using a material different from that for the electrode 111R, but the same material may be used.

The conductive layer 116R and the like can include a single conductive layer or a two or more conductive layers. Note that a layer in which the conductive layer 116R and the like, the pixel electrode 111R and the like, and the optical adjustment layer 115R and the like are stacked is sometimes referred to as a pixel electrode.

[Structure Example 5 of Display Device]

Figure 3D:
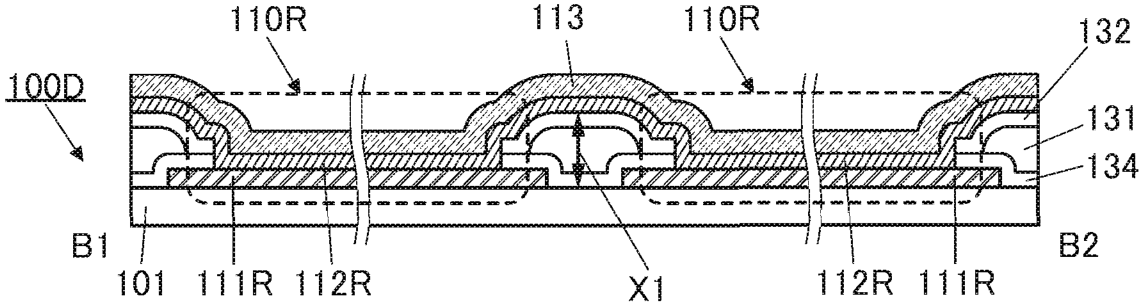

FIG. 3D is a schematic cross-sectional view of the display device 100D (corresponding to a cross-section in the Y direction in FIG. 1A). The display device 100D is an example of using the band-shaped EL layer 112R extending in the Y direction and the common electrode 113. FIG. 3D illustrates a cross section of the two light-emitting elements 110R arranged side by side in the Y direction. FIG. 3D illustrates a cross section of a partition X (e.g., the insulating layer 134, the insulating layer 131, or the insulating layer 132) extending in the X direction.

When the EL layer 112R is formed in a band shape in the Y direction when seen from above as illustrated in FIG. 3D, a space for dividing the EL layer 112R is not needed and thus the area of a non-light-emitting region between the light-emitting elements can be reduced, resulting in a higher aperture ratio.

The partition X extending in the X direction includes a region having a height X1 (FIG. 3D). In addition, a partition Y extending in the Y direction includes a region having a height Y1 (FIG. 1B). The height of the partition refers to the distance between a top surface of the substrate 101 to a top surface of the partition. The height X1 and the height Y1 may be different from each other. For example, the height X1 can be lower than the height Y1. Lowering the height X1 facilitates formation of the continuous EL layer 112R over the partition X. That is, the EL layer 112R easily extends in a band shape when seen from above. Note that the height X1 can be lower than the height Y1.

In order to change the height of the partition, the number of layers of the partition (e.g., the insulating layer 134, the insulating layer 131, and the insulating layer 132) in a low height region can be smaller than that in a high height region, for example. Moreover, it is also effective to set the thickness of the insulating layer in a low height region smaller than that in a high height region. Note that in the case where the EL layer 112R does not extend in a band shape as in FIG. 1C, for example, the means for adjusting the height of the partition can be employed. Note that a plurality of regions of the partition X can have different heights. For example, the heights of the partitions X in an end portion of the pixel electrode 111R, an end portion of the pixel electrode 111G, and an end portion of the pixel electrode 111B may be varied. Similarly, a plurality of regions of the partitions Y may have different heights.

[Structure Example 6 of Display Device]

Figure 4A:
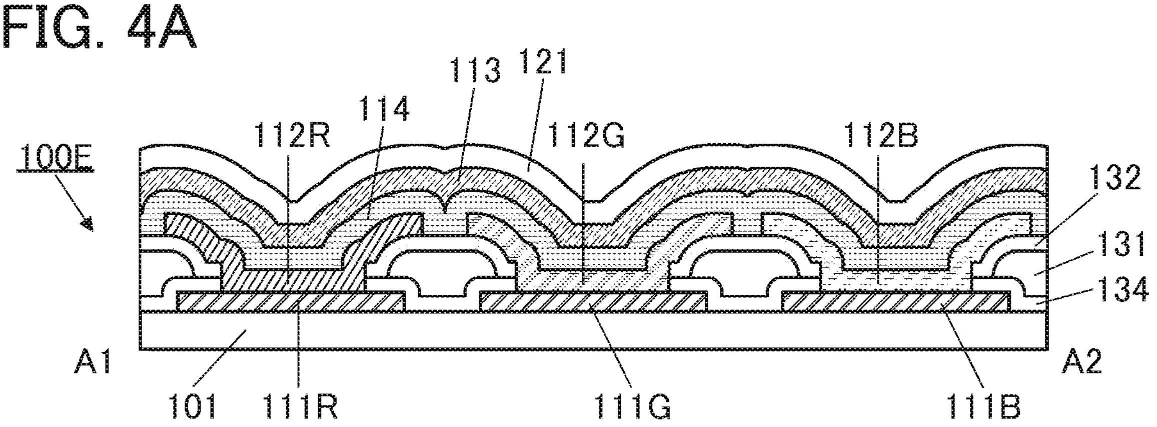
FIG. 4A to FIG. 4C are diagrams illustrating structure examples of a display device.

FIG. 4A is a schematic cross-sectional view of the display device 100E (corresponding to the cross-section in the X direction in FIG. 1A). The display device 100E is different from the display device 100 (FIG. 1) in including an EL layer 114 that is a common layer and including a protective layer 121.

The EL layer 114 is provided in contact with top surfaces of the EL layer 112R, the EL layer 112G, and the EL layer 112B. As the EL layer 114, an electron-transport layer or an electron-injection layer can be used. When an electron-injection layer is used as the EL layer 114, for example, the electron-injection layer can be formed in the same step in the light-emitting element 110R, the light-emitting element 110G, and the light-emitting element 110B.

The protective layer 121 is positioned over the common electrode 113 and is provided over the light-emitting element 110R, the light-emitting element 110G, and the light-emitting element 110B. The protective layer 121 has a function of preventing diffusion of impurities such as water into the light-emitting elements from above.

The protective layer 121 can have, for example, a single-layer structure or a stacked-layer structure at least including an inorganic insulating film. As the inorganic insulating film, for example, an oxide film or a nitride film such as a silicon oxide film, a silicon oxynitride film, a silicon nitride oxide film, a silicon nitride film, an aluminum oxide film, an aluminum oxynitride film, or a hafnium oxide film can be given. Alternatively, a semiconductor material such as indium gallium oxide or indium gallium zinc oxide may be used for the protective layer 121.

For the protective layer 121, a stacked film of an inorganic insulating film and an organic insulating film can be used. For example, a structure in which an organic insulating film is sandwiched between a pair of inorganic insulating films is preferable. Furthermore, the organic insulating film preferably functions as a planarization film. With this structure, a top surface of the organic insulating film can be flat, and accordingly, coverage with the inorganic insulating film thereover is improved, leading to an improvement in barrier properties. Since a top surface of the protective layer 121 is flat, when a component (e.g., a color filter, an electrode of a touch sensor, or a lens array) is provided above the protective layer 121, the component is less affected by an uneven shape caused by components therebelow, which is preferable.

A layer (also referred to as a cap layer or as a protective layer) may be provided between the common electrode 113 and the protective layer 121. The cap layer has a function of preventing light emitted from the light-emitting elements from being totally reflected by light. The cap layer is preferably formed using a material having a higher refractive index than the common electrode 113. The cap layer can be formed using an organic substance or inorganic organic substance. The thickness of the cap layer is preferably larger than that of the common electrode 113. The cap layer may have a function of preventing diffusion of impurities such as water from the above into each of the light-emitting elements.

Note that in each of the structure examples, a structure in the vicinity of one end portion of the pixel electrode 111R and the like and a structure in the vicinity of the other end portion thereof may be different from each other. For example, as in FIG. 4B, a partition in a region 117R including one end portion of the pixel electrode 111R may have a larger overlap with the pixel electrode 111R than a partition in a region 118R including the other end portion thereof.

Figure 4B:
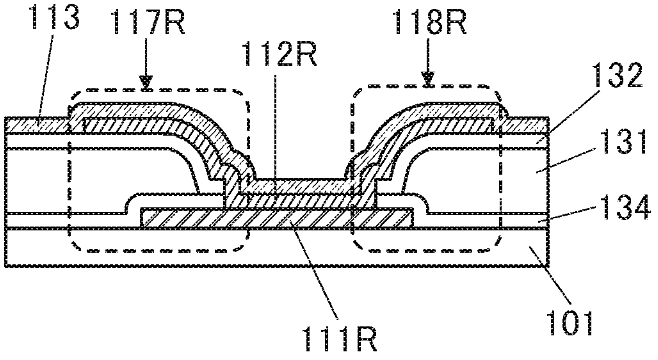
Figure 4C:
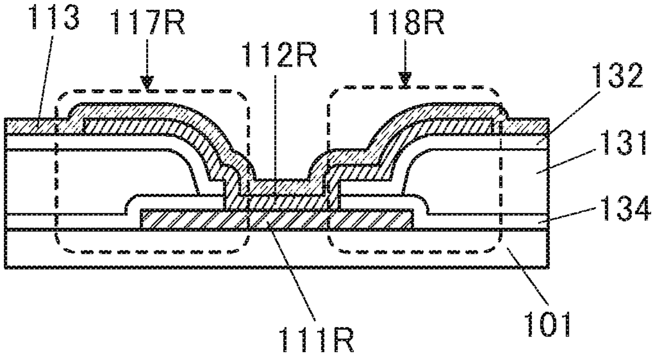

As in FIG. 4C, the insulating layer 134 includes a portion in contact with the insulating layer 132 (also referred to as a contact portion), and a contact portion in the region 117R may have a smaller overlap with the pixel electrode 111R than a contact portion in the region 118R.

Note that the insulating layer 134 is not in contact with the insulating layer 132 over the pixel electrode 111R (FIG. 12B, FIG. 12C, or the like described later) in some cases. Even in such a case, when the insulating layers 134 or the insulating layers 132 in the region 117R and the region 118R are formed with different sizes, the partition structures can be formed with different structures.

At least part of the structure examples, the manufacturing method examples, the drawings corresponding thereto, and the like described in this embodiment can be combined with the other structure examples, the other manufacturing method examples, the other drawings, and the like as appropriate. The terms or expressions used for describing the structure or manufacturing method in this specification can be appropriately used for defining another structure or manufacturing method.

At least part of this embodiment can be implemented in combination with the other embodiments described in this specification as appropriate.

Embodiment 3

One embodiment of a manufacturing method of the display device of the present invention is described below.

As a way of forming some or all of the EL layers separately between light-emitting elements of different colors as in one embodiment of the display device of the present invention, an evaporation method using a shadow mask such as a metal mask can be used. However, this method sometimes causes a deviation from the designed shape and position of an island-shaped organic film due to various influences such as the low accuracy of the metal mask, the positional deviation between the metal mask and a substrate, a warp of the metal mask, and the vapor-scattering-induced expansion of outline of the deposited film.

In that case, since it is difficult to achieve high resolution and a high aperture ratio of the display device, a measure can be taken for pseudo improvement in resolution (also referred to as pixel density) by employing a unique pixel arrangement method such as a PenTile arrangement, for example.

In one embodiment of the manufacturing method of the display device of the present invention described below, fine patterning of an EL layer can be performed without a shadow mask such as a metal mask. Thus, a display device that has high resolution and a high aperture ratio can be achieved as compared to the case of using a shadow mask. Moreover, the EL layers can be formed separately, enabling the display device to perform extremely clear display with high contrast and high display quality. One embodiment of the manufacturing method is described in detail below with reference to drawings.

[Manufacturing Method Example 1 of Display Device]

Figure 5A:
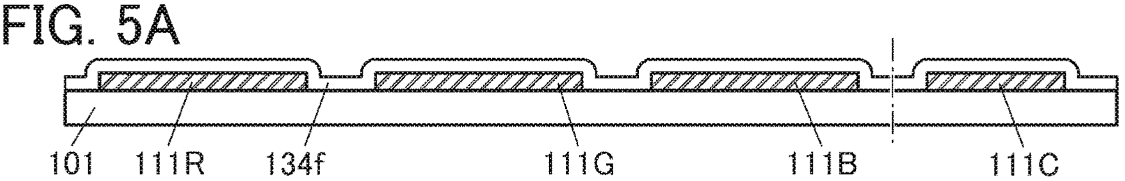
FIG. 5A to FIG. 5G are diagrams illustrating a manufacturing method example of a display device.

Description here is made using the display device 100E described in Structure example 6 as an example. FIG. 5A to FIG. 8C are schematic cross-sectional views in steps of the manufacturing method of the display device described below as an example. In FIG. 5A and the like, schematic cross-sectional views of the connection portion 130 and the vicinity thereof are also illustrated on the right side.

[Preparation for Substrate 101]

As a substrate 101, a substrate having at least heat resistance high enough to withstand the following heat treatment can be used (FIG. 5A). In the case where an insulating substrate is used as the substrate 101, a glass substrate, a quartz substrate, a sapphire substrate, a ceramic substrate, an organic resin substrate, or the like can be used. Alternatively, a single crystal semiconductor substrate using silicon or silicon carbide as a material, a polycrystalline semiconductor substrate, a compound semiconductor substrate of silicon germanium or the like, a semiconductor substrate such as an SOI substrate, or the like can be used.

As the substrate 101, it is particularly preferable to use the semiconductor substrate or the insulating substrate over which a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed. In particular, the substrate 101 preferably includes an insulating surface. For example, a substrate over which the insulating layer 162 functioning as a planarization film is formed as illustrated in FIG. 2B or FIG. 2A is preferably used as the substrate 101.

[Formation of Pixel Electrodes 111R, 111G, and 111B and Connection Electrode 111C]

Next, the pixel electrode 111R, the pixel electrode 111G, the pixel electrode 111B, and the connection electrode 111C are formed over the substrate 101 (FIG. 5A). First, a conductive film to be a pixel electrode is deposited, a resist mask is formed by a photolithography method, and an unnecessary portion of the conductive film is removed by etching. After that, the resist mask is removed to form the pixel electrode 111R, the pixel electrode 111G, and the pixel electrode 111B.

In the case where a conductive film that has a property of reflecting visible light is used as each pixel electrode, it is preferable to use a material (e.g., silver or aluminum) having reflectance as high as possible in the whole wavelength range of visible light. This can increase not only light extraction efficiency, but also color reproducibility of the light-emitting elements.

[Formation of Insulating Film 134*f*]

Next, an insulating film 134*f* is formed to cover the pixel electrode 111R, the pixel electrode 111G, the pixel electrode 111B, and the connection electrode 111C (FIG. 5A). The insulating film 134*f* becomes the insulating layer 134 later.

The insulating film 134*f* can be formed by a deposition method such as an ALD method, a sputtering method, a CVD method, a PLD method, or an evaporation method or a combination thereof.

[Formation of Insulating Layer 131]

Next, an insulating film 131*f* is deposited to cover the insulating film 134*f*. As the insulating film 131*f*, a film containing a photosensitive organic resin can be used.

The insulating film 131*f* can be formed by a wet deposition method such as a spin coating method or an inkjet method. After the deposition, heat treatment may be performed to volatilize the solvent in the material or cure the material.

Figure 5B:
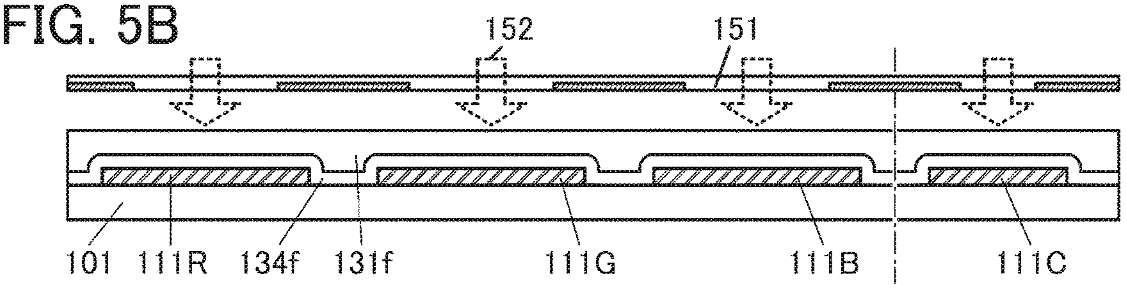

After the deposition of the insulating film 131*f*, light 152 is irradiated with the use of a photomask 151 (FIG. 5B). Here, an example is described in which what is called a positive photosensitive material, whose solubility in a developer is improved by light exposure, is used for the insulating film 131*f*.

Figure 5C:
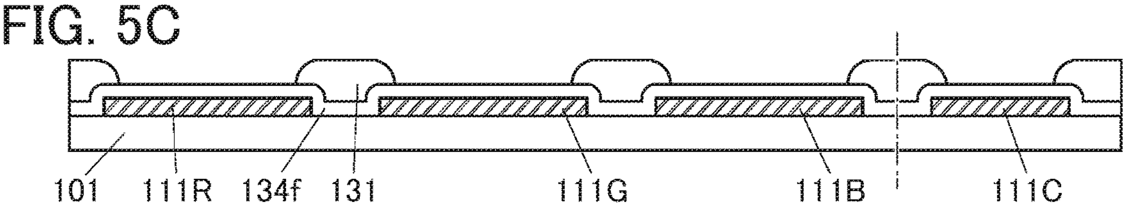

Then, development treatment is performed to form the insulating layer 131 (FIG. 5C).

In this case, the insulating layer 131 is preferably formed to have a pattern width smaller than the pattern width of a mask pattern of the photomask 151 by adjusting a light exposure time and an intensity of light exposure in light exposure treatment. For example, light exposure is performed under conditions where the amount of light exposure is larger than the proper value.

[Formation of Insulating Layer 132 and Insulating Layer 134]

Figure 5D:
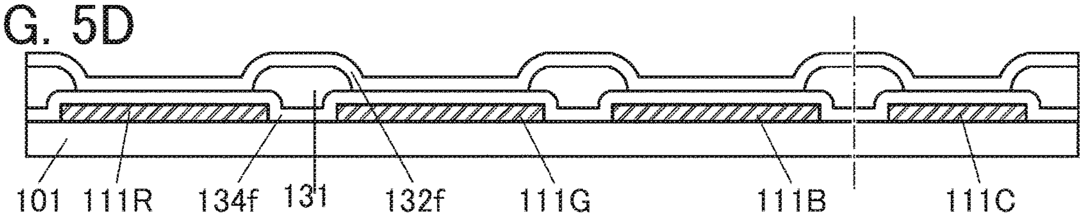

Next, an insulating film 132*f* is deposited to cover the insulating film 134*f*, the insulating layer 131, the pixel electrode 111R, the pixel electrode 111G, the pixel electrode 111B, and the like (FIG. 5D).

The insulating film 132*f* can be formed by a deposition method such as an ALD method, a sputtering method, a CVD method, a PLD method, or an evaporation method or a combination thereof.

Figure 5E:
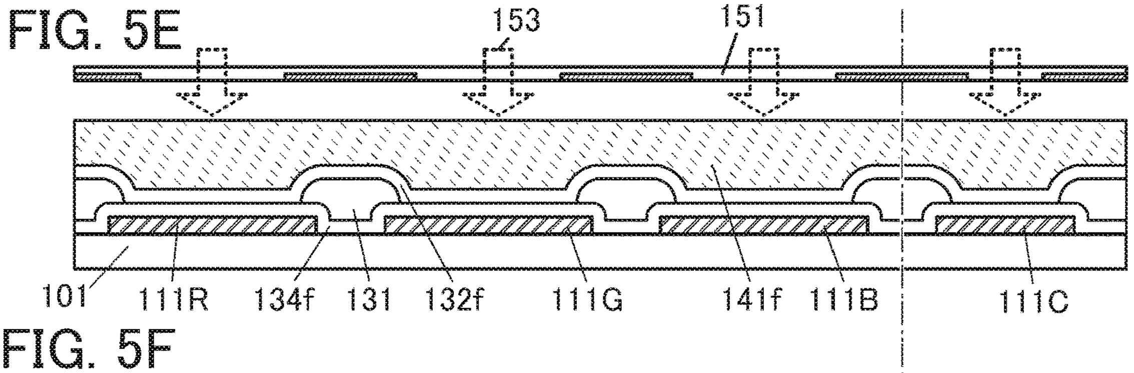

Next, a resist film 141*f* is deposited over the insulating film 132*f* (FIG. 5E).

For the resist film 141*f*, a resist material containing a photosensitive resin such as a positive type resist material or a negative type resist material can be used.

Next, the resist film 141*f* is irradiated with light 153 with the use of the photomask 151 (FIG. 5E).

Figure 5F:
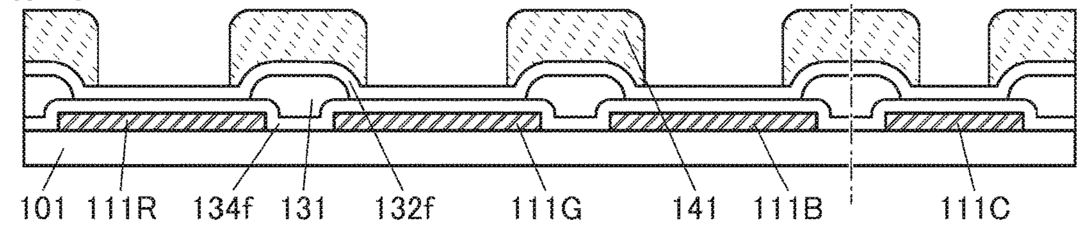

Next, the resist mask film 141*f* is subjected to development treatment to form a resist mask 141 (FIG. 5F).

Here, the photomask used in the formation of the insulating layer 131 can be the same as the photomask used in the formation of the resist mask 141. Note that exactly the same photomask is not necessarily used; a photomask manufactured for forming the same pattern can be used. Since the photomask 151 can be commonly used in the formation of the insulating layer 131 and in the formation of the resist mask 141, the manufacturing cost can be reduced.

Note that the photomask used for forming the insulating layer 131 may be different from the photomask used for forming the resist mask 141.

As illustrated in FIG. 5F, the resist mask 141 is preferably formed to cover the insulating layer 131.

Figure 5G:
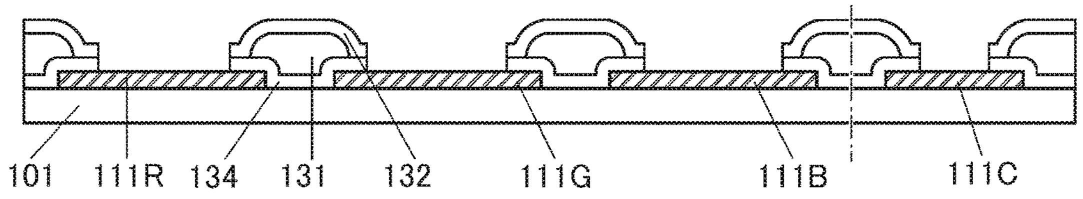

Next, portions of the insulating film 132*f* and the insulating film 134*f* which are not covered with the resist mask 141 are etched. After that, the resist mask 141 is removed. In this manner, the insulating layer 132 and the insulating layer 134 are formed (FIG. 5G).

[Formation of EL Film 112Rf]

Figure 6A:
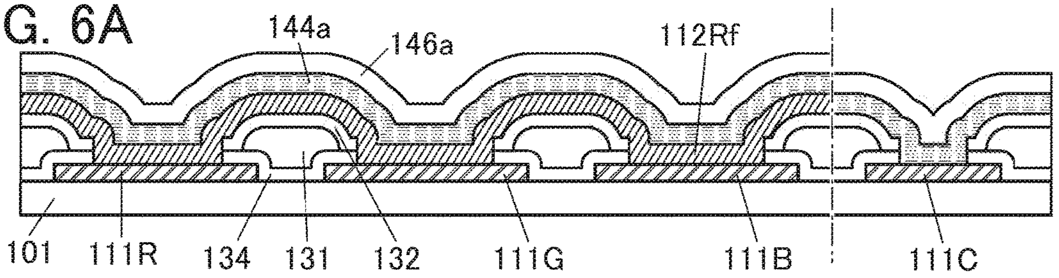
FIG. 6A to FIG. 6F are diagrams illustrating a manufacturing method example of a display device.

Next, the EL film 112Rf is deposited over the pixel electrode 111R, the pixel electrode 111G, the pixel electrode 111B, and the insulating layer 132 (FIG. 6A). The EL film 112Rf becomes the EL layer 112R later.

The EL film 112Rf includes at least a film containing a light-emitting compound. Besides, a structure in which one or more of films functioning as an electron-injection layer, an electron-transport layer, a charge-generation layer, a hole-transport layer, and a hole-injection layer are stacked may be employed. The EL film 112Rf can be formed by, for example, an evaporation method, a sputtering method, or an inkjet method. Without limitation to this, the above-described deposition method can be used as appropriate.

For example, the EL film 112Rf is preferably a stacked film in which a hole-injection layer, a hole-transport layer, a light-emitting layer, an electron-transport layer, and an electron-injection layer are stacked in this order. In that case, a film including the electron-injection layer can be used for the EL layer 114 formed later. In particular, the electron-transport layer is provided to cover the light-emitting layer, which can inhibit the light-emitting layer from being damaged by a subsequent photolithography step or the like, so that a highly reliable light-emitting element can be manufactured. Furthermore, when layers containing the same organic compound are used as the electron-transport layer used for the EL film 112Rf or the like and the electron-injection layer used for the EL layer 114 later, favorable junction of these layers can be obtained and a light-emitting element with high emission efficiency and high reliability can be achieved. For example, an organic compound having an electron-transport property may be used for the electron-transport layer and a material including the organic compound and a metal may be used for the electron-injection layer.

The EL film 112Rf is preferably formed so as not to be provided over the connection electrode 111C. For example, in the case where the EL film 112Rf is formed by an evaporation method or a sputtering method, it is preferable that the EL film 112Rf be formed using a shielding mask so as not to be deposited over the connection electrode 111C.

[Formation of Sacrificial Film 144*a*]

Next, a sacrificial film 144*a* is formed to cover the EL film 112Rf (FIG. 6A). The sacrificial film 144*a* is provided in contact with a top surface of the connection electrode 111C.

As the sacrificial film 144*a*, it is possible to use a film highly resistant to etching treatment performed on the EL films such as the EL film 112Rf, i.e., a film having high etching selectivity with respect to the EL films. Furthermore, as the sacrificial film 144*a*, it is possible to use a film having high etching selectivity with respect to a sacrificial film such as a sacrificial film 146*a* described later. Moreover, as the sacrificial film 144*a*, it is particularly preferable to use a film that can be removed by a wet etching method that is less likely to cause damage to the EL films.

As the sacrificial film 144*a*, for example, an inorganic film such as a metal film, an alloy film, a metal oxide film, a semiconductor film, or an inorganic insulating film can be suitably used. The sacrificial film 144*a* can be formed by any of a variety of deposition methods such as a sputtering method, an evaporation method, a CVD method, and an ALD method. In particular, an ALD method causes less damage to a layer where a film is formed; for this reason, the sacrificial film 144*a*, which is directly formed on the EL film 112Rf, is preferably formed by an ALD method.

For the sacrificial film 144*a*, for example, a metal material such as gold, silver, platinum, magnesium, nickel, tungsten, chromium, molybdenum, iron, cobalt, copper, palladium, titanium, aluminum, yttrium, zirconium, or tantalum, or an alloy material containing the metal material can be used. It is particularly preferable to use a low-melting-point material such as aluminum or silver.

Alternatively, for the sacrificial film 144*a*, a metal oxide such as an indium-gallium-zinc oxide (In—Ga—Zn oxide, also referred to as IGZO) can be used. It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Moreover, indium tin oxide containing silicon can also be used, for example.

Note that an element M (M is one or more kinds selected from aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) can be used instead of gallium. In particular, M is preferably one or more kinds selected from gallium, aluminum, and yttrium.

Specifically, oxide such as aluminum oxide, hafnium oxide, or silicon oxide, nitride such as silicon nitride or aluminum nitride, or oxynitride such as silicon oxynitride can be used for the sacrificial film 144*a*. Such an inorganic insulating material can be formed by a deposition method such as a sputtering method, a CVD method, or an ALD method; the sacrificial film 144*a*, which is formed directly on the EL film 112Rf, is particularly preferably formed by an ALD method.

The sacrificial film 144*a* may be formed using a material that can be dissolved in a solvent chemically stable with respect to at least the uppermost film of the EL film 112Rf. In particular, a material that is dissolved in water or alcohol can be suitably used for the sacrificial film 144*a*. In deposition of the sacrificial film 144*a*, it is preferable that application of such a material dissolved in a solvent such as water or alcohol be performed by a wet deposition method and followed by heat treatment for evaporating the solvent. At this time, the heat treatment is preferably performed in a reduced-pressure atmosphere, in which case the solvent can be removed at a low temperature in a short time and thermal damage to the EL film 112Rf can be reduced accordingly.

Examples of a wet deposition method that can be used for forming the sacrificial film 144*a* include spin coating, dipping, spray coating, ink-jetting, dispensing, screen printing, offset printing, a doctor knife method, a slit coating, a roll coating, a curtain coating, a knife coating, and the like.

For the sacrificial film 144*a*, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin can be used.

[Formation of Sacrificial Film 146*a*]

Next, the sacrificial film 146*a* is formed over the sacrificial film 144*a* (FIG. 6A).

The sacrificial film 146*a* is a film used for a hard mask when the sacrificial film 144*a* is etched later. In a later step of processing the sacrificial film 146*a*, the sacrificial film 144*a* is exposed. Thus, the combination of films having high etching selectivity therebetween is selected for the sacrificial film 144*a* and the sacrificial film 146*a*. It is thus possible to select a film that can be used for the sacrificial film 146*a* depending on an etching condition of the sacrificial film 144*a* and an etching condition of the sacrificial film 146*a*.

For example, in the case where dry etching using a gas containing fluorine (also referred to as a fluorine-based gas) is used for the etching of the sacrificial film 146*a*, silicon, silicon nitride, silicon oxide, tungsten, titanium, molybdenum, tantalum, tantalum nitride, an alloy containing molybdenum and niobium, an alloy containing molybdenum and tungsten, or the like can be used for the sacrificial film 146*a*. Here, a metal oxide film using IGZO, ITO, or the like is given as a film having high etching selectivity (that is, enabling low etching rate) in dry etching using the fluorine-based gas, and such a film can be used as the sacrificial film 144*a*.

Without being limited to the above, a material of the sacrificial film 146*a* can be selected from a variety of materials depending on an etching condition of the sacrificial film 144*a* and an etching condition of the sacrificial film 146*a*. For example, any of the films that can be used for the sacrificial film 144*a* can also be used.

For example, a film of oxide can be used as the sacrificial film 146*a*. Typically, a film of oxide or a film of oxynitride such as silicon oxide, silicon oxynitride, aluminum oxide, aluminum oxynitride, hafnium oxide, or hafnium oxynitride can also be used.

As the sacrificial film 146*a*, a film of nitride can be used, for example. Specifically, it is possible to use a film of nitride such as silicon nitride, aluminum nitride, hafnium nitride, titanium nitride, tantalum nitride, tungsten nitride, gallium nitride, or germanium nitride.

For example, for the sacrificial film 144*a*, an inorganic insulating material, such as aluminum oxide, hafnium oxide, or silicon oxide, formed by an ALD method is preferably used; and for the sacrificial film 146*a*, a metal oxide containing indium, such as indium gallium zinc oxide (also referred to as an In—Ga—Zn oxide or IGZO), formed by a sputtering method is preferably used.

Alternatively, as the sacrificial film 146*a*, an organic film that can be used as the EL film 112Rf or the like may be used. For example, the organic film that is used for the EL film 112Rf, an EL film 112Gf, or an EL film 112Bf can be used for the sacrificial film 146*a*. The use of such an organic film is preferable, in which case the deposition apparatus for the EL film 112Rf or the like can be used in common. In addition, when the EL film 112Rf or the like is etched using a layer to be a sacrificial layer as a mask, the organic film can be removed at the same time, so that the process can be simplified.

[Formation of Resist Mask 143*a*]

Figure 6B:
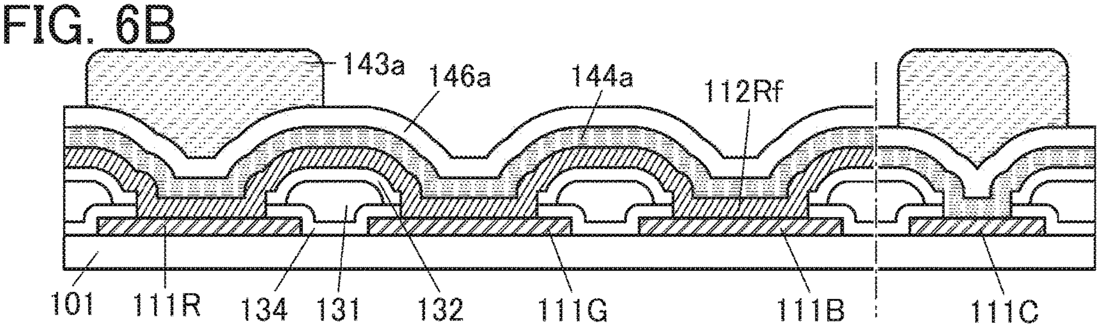

Then, over the sacrificial film 146*a*, a resist mask 143*a* is formed in each of a position overlapping with the pixel electrode 111R and a position overlapping with the connection electrode 111C (FIG. 6B).

For the resist mask 143*a*, a resist material containing a photosensitive resin such as a positive type resist material or a negative type resist material can be used.

Here, in the case where the resist mask 143*a* is formed over the sacrificial film 144*a* without using the sacrificial film 146*a*, there is a risk of dissolving the EL film 112Rf due to a solvent of the resist material if a defect such as a pinhole exists in the sacrificial film 144*a*. Such a defect can be prevented by using the sacrificial film 146*a*.

Note that in the case where a film in which a defect such as a pinhole is unlikely to be generated is used as the sacrificial film 144*a* or a material that is not dissolved in a solvent of the resist material is used for the EL film 112Rf, the resist mask 143*a* may be formed directly over the sacrificial film 144*a* without using the sacrificial film 146*a* in some cases.

[Etching of Sacrificial Film 146*a*]

Figure 6C:
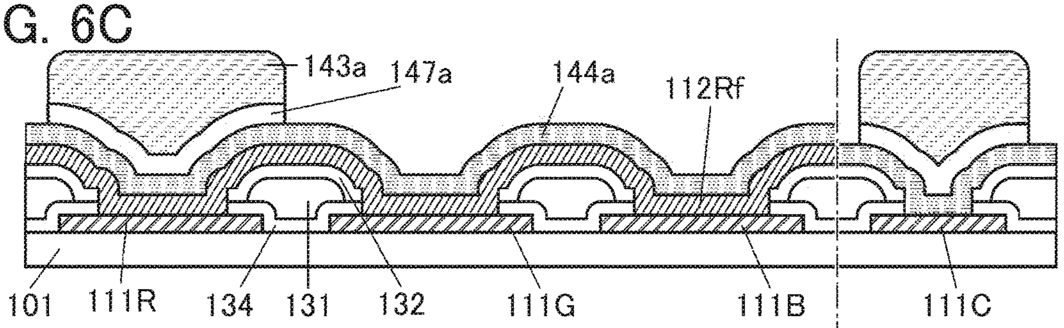

Next, part of the sacrificial film 146*a* that is not covered with the resist mask 143*a* is removed by etching, so that a band-shaped sacrificial layer 147*a* is formed (FIG. 6C). At the same time, the sacrificial layer 147*a* is formed also over the connection electrode 111C.

In the etching of the sacrificial film 146*a*, an etching condition with high selectivity is preferably employed so that the sacrificial film 144*a* is not removed by the etching. Either wet etching or dry etching can be performed for the etching of the sacrificial film 146*a*; with the use of dry etching, a shrinkage of the pattern of the sacrificial film 146*a* can be inhibited.

[Removal of Resist Mask 143*a*]

Figure 6D:
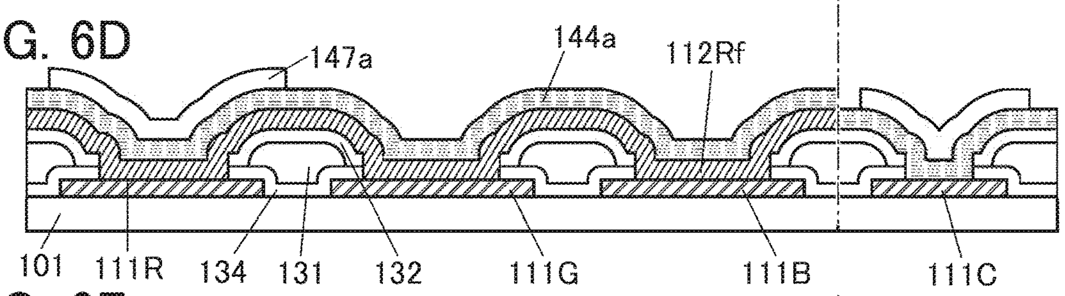

Next, the resist mask 143*a* is removed (FIG. 6D).

The removal of the resist mask 143*a* can be performed by wet etching or dry etching. It is particularly preferable to perform dry etching (also referred to as plasma ashing) using an oxygen gas as an etching gas to remove the resist mask 143*a*.

At this time, the removal of the resist mask 143*a* is performed in a state where the EL film 112Rf is covered with the sacrificial film 144*a*; thus, the influence on the EL film 112Rf is inhibited. In particular, when the EL film 112Rf is exposed to oxygen, the electrical characteristics are adversely affected in some cases; thus, it is suitable in the case where etching using an oxygen gas, such as plasma ashing, is performed.

[Etching of Sacrificial Film 144*a*]

Figure 6E:
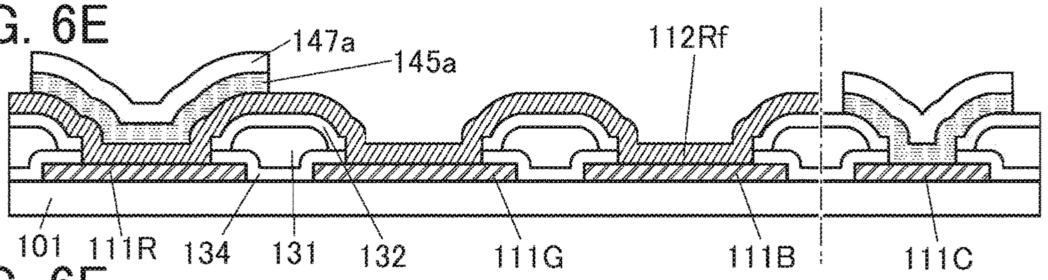

Next, part of the sacrificial film 144*a* that is not covered with the sacrificial layer 147*a* is removed by etching using the sacrificial layer 147*a* as a mask, so that an island-shaped or band-shaped sacrificial layer 145*a* is formed (FIG. 6E). At the same time, the sacrificial layer 145*a* is formed also over the connection electrode 111C.

Either wet etching or dry etching can be performed for the etching of the sacrificial film 144*a*; the use of dry etching is preferable, in which case a shrinkage of the pattern can be inhibited.

[Etching of EL Film 112Rf]

Figure 6F:
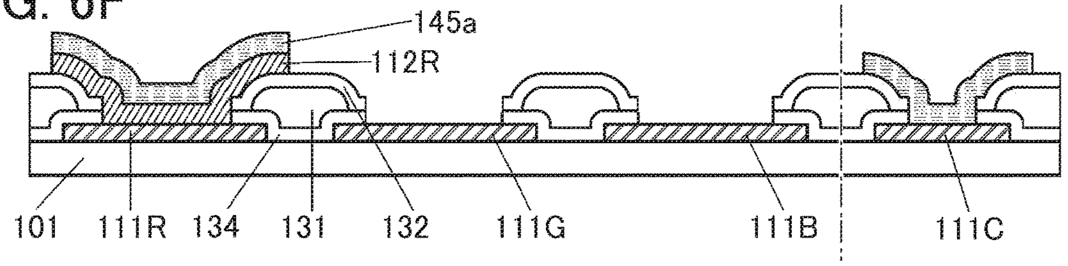

Next, part of the EL film 112Rf that is not covered with the sacrificial layer 145*a* is removed by etching, so that the island-shaped or band-shaped EL layer 112R is formed (FIG. 6F). By the etching of the EL film 112Rf, top surfaces of the pixel electrode 111G, the pixel electrode 111B, and the insulating layer 132 are exposed.

Specifically, for the etching of the EL film 112Rf, it is preferable to perform dry etching using an etching gas that does not contain oxygen as its main component. This can inhibit the alteration of the EL film 112Rf to achieve a highly reliable display device. Examples of the etching gas that does not contain oxygen as its main component include $CF_4$, $C_4F_8$, $SF_6$, $CHF_3$, $Cl_2$, $H_2O$, $BCl_3$, $H_2$, and a noble gas such as He. Alternatively, a mixed gas of the above gas and a dilute gas that does not contain oxygen can be used as the etching gas.

Note that etching of the EL film 112Rf is not limited to the above and may be performed by dry etching using another gas or wet etching.

In addition, when dry etching using an oxygen gas or an etching gas containing an oxygen gas is used for the etching of the EL film 112Rf, the etching rate can be increased. Thus, etching under a low-power condition can be performed while the etching rate is kept adequately high; hence, damage due to the etching can be reduced. Furthermore, a defect such as attachment of a reaction product generated at the etching can be inhibited. For example, an etching gas obtained by adding an oxygen gas to the etching gas not containing oxygen as its main component can be used.

The insulating layer 132 is exposed when the EL film 112Rf is etched. Accordingly, it is preferable to use a film highly resistant to the etching of the EL film 112Rf (a film that is less likely to be etched) for the insulating layer 132. Note that at the time of etching the EL film 112Rf, an upper portion of the insulating layer 132 is etched and a portion not covered with the EL layer 112R is thinned in some cases. Part of the insulating layer 132 is removed, and part of the insulating layer 131 is exposed or removed in some cases. Even if part of the insulating layer 131 is removed, the insulating layer 134 below the insulating layer 131 becomes an etching stopper, so that the pixel electrode (excluding a display region) can be prevented from being exposed and removed.

The sacrificial layer 147*a* can be etched at the same time of etching the EL film 112Rf (FIG. 6F). The EL film 112Rf and the sacrificial layer 147*a* are preferably etched by the same treatment, in which case the process can be simplified and the manufacturing cost of the display device can be reduced. Note that the sacrificial layer 147*a* may be left without being etched. The EL film 112Rf can be protected when the sacrificial layer 147*a* is left. In that case, the sacrificial layer 147*a* may be etched during an etching of the sacrificial layer 145 in a later step.

[Formation of EL Film 112Gf]

Figure 7A:
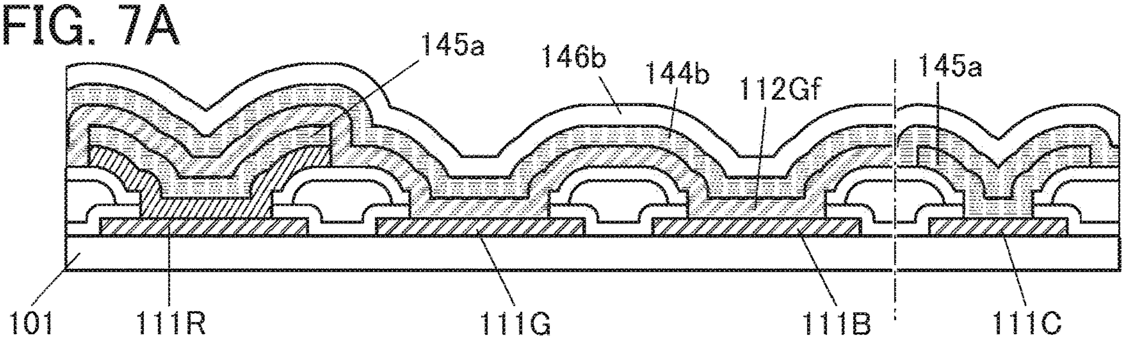
FIG. 7A to FIG. 7E are diagrams illustrating a manufacturing method example of a display device.

Subsequently, the EL film 112Gf to be the EL layer 112G later is deposited over the insulating layer 132, the pixel electrode 111G, and the pixel electrode 111B (FIG. 7A). In that case, similarly to the EL film 112Rf, the EL film 112Gf is preferably not provided over the connection electrode 111C like.

The above description of the EL film 112Rf can be referred to for the formation method of the EL film 112Gf.

[Formation of Sacrificial Film 144*b*]

Subsequently, a sacrificial film 144*b* is formed over the EL film 112Gf (FIG. 7A). The sacrificial film 144*b* can be formed in a manner similar to that for the sacrificial film 144*a*. In particular, the sacrificial film 144*b* and the sacrificial film 144*a* are preferably formed using the same material.

At the same time, the sacrificial film 144*b* is formed over the connection electrode 111C to cover the sacrificial layer 145*a*.

[Formation of Sacrificial Film 146*b*]

Next, a sacrificial film 146*b* is formed over the sacrificial film 144*b* (FIG. 7A). The sacrificial film 146*b* can be formed in a manner similar to that for the sacrificial film 146*a*. In particular, the sacrificial film 146*b* and the sacrificial film 146*a* are preferably formed using the same material.

[Formation of Resist Mask 143*b*]

Figure 7B:
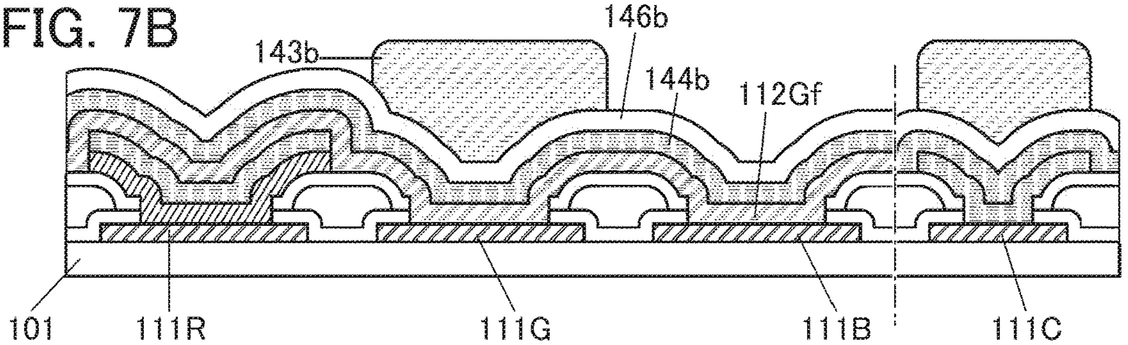

Next, a resist mask 143*b* is formed in a region that is over the sacrificial film 146*b* and overlaps with the pixel electrode 111G (FIG. 7B).

The resist mask 143*b* can be formed in a manner similar to that for the resist mask 143*a*.

Here, the connection electrode 111C is protected by the sacrificial layer 145*a*; thus, the resist mask 143*b* is not necessarily formed. Note that the resist mask 143*b* may be provided to cover the connection electrode 111C.

The resist mask 143*b* can be formed in a manner similar to that for the resist mask 143*a*.

[Etching of Sacrificial Film 146*b*]

Figure 7C:
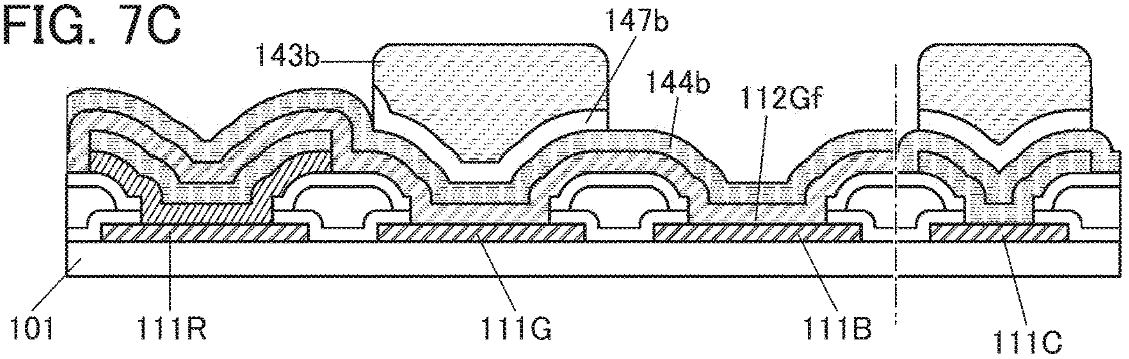

Next, part of the sacrificial film 146*b* that is not covered with the resist mask 143*b* is removed by etching, so that the island-shaped or band-shaped sacrificial layer 147*b* is formed (FIG. 7C). At that time, part of the sacrificial film 146*b* over the connection electrode 111C, which is not covered with the resist mask 143*b*, is also removed by etching.

The above description of the sacrificial film 146*a* can be referred to for the etching of the sacrificial film 146*b*.

[Removal of Resist Mask 143*b*]

Next, the resist mask 143*b* is removed. The above description of the resist mask 143*a* can be referred to for the removal of the resist mask 143*b*.

[Etching of Sacrificial Film 144*b*]

Figure 7D:
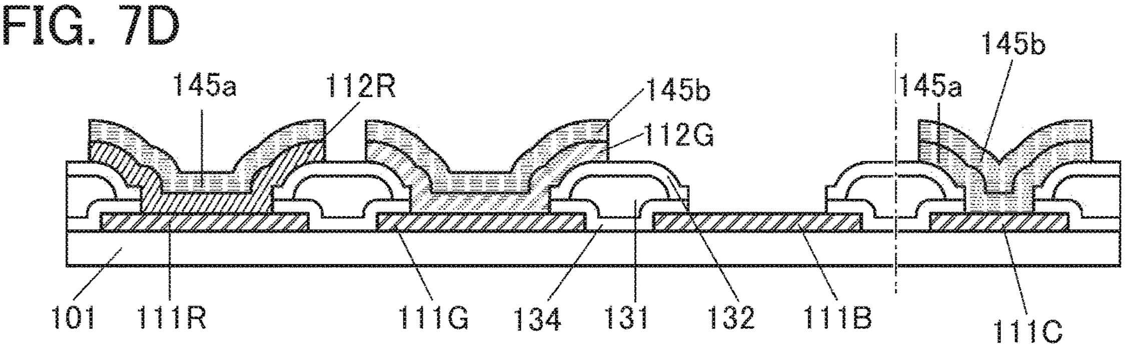

Next, part of the sacrificial film 144*b* that is not covered with the sacrificial layer 147*b* is removed by etching using the sacrificial layer 147*b* as a mask, so that the island-shaped or band-shaped sacrificial layer 145*b* is formed (FIG. 7D). At that time, part of the sacrificial film 144*b* over the connection electrode 111C, which is not covered with the sacrificial layer 147*b*, is also removed by etching.

The above description of the sacrificial film 144*a* can be referred to for the etching of the sacrificial film 144*b*.

[Etching of EL Film 112Gf]

Next, part of the EL film 112Gf that is not covered with the sacrificial layer 145*b* is removed by etching, so that the island-shaped or band-shaped EL layer 112G is formed (FIG. 7D).

The above description of the EL film 112Rf can be referred to for the etching of the EL film 112Gf. In that case, with the insulating layer 134, the insulating layer 131, and the insulating layer 132, an effect similar to that in forming the EL layer 112R is attained.

The EL layer 112R and the connection electrode 111C are protected by the sacrificial layer 145*a* and thus can be prevented from being damaged in the etching step of the EL film 112Gf.

In this manner, the island-shaped or band-shaped EL layer 112R and the island-shaped or band-shaped EL layer 112G can be separately formed with high alignment accuracy.

[Formation of EL Layer 112B]

Figure 7E:
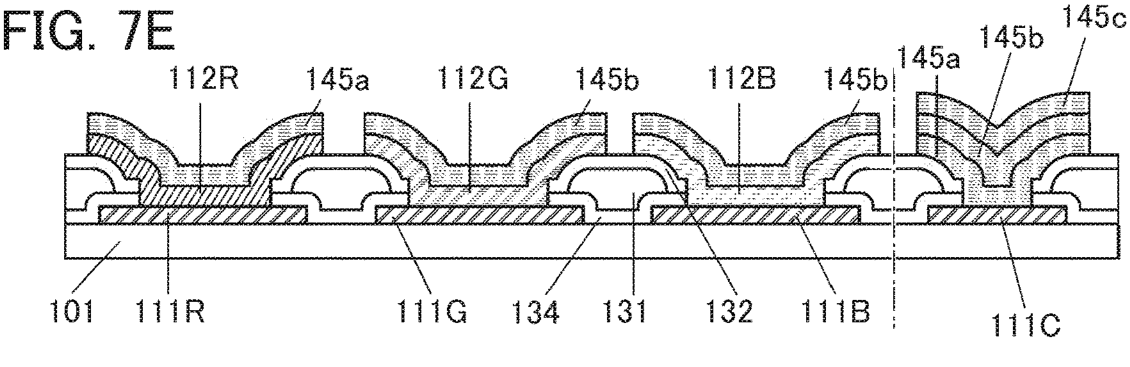

The above steps are performed on the EL film 112Bf (not illustrated), whereby the island-shaped or band-shaped EL layer 112B and an island-shaped or band-shaped sacrificial layer 145*c* can be formed (FIG. 7E).

That is, after the EL layer 112G is formed, the EL film 112Bf, a sacrificial film 144*c*, a sacrificial film 146*c*, and a resist mask 143*c* (each of which is not illustrated) are sequentially formed. Next, the sacrificial film 146*c* is etched to form a sacrificial layer 147*c* (not illustrated); then, the resist mask 143*c* is removed. Subsequently, the sacrificial film 144*c* is etched to form the sacrificial layer 145*c*. After that, the EL film 112Bf is etched to form the island-shaped or band-shaped EL layer 112B. In that case, with the insulating layer 134, the insulating layer 131, and the insulating layer 132, an effect similar to that in forming the EL layer 112R is attained.

[Removal of Sacrificial Layer]

Figure 8A:
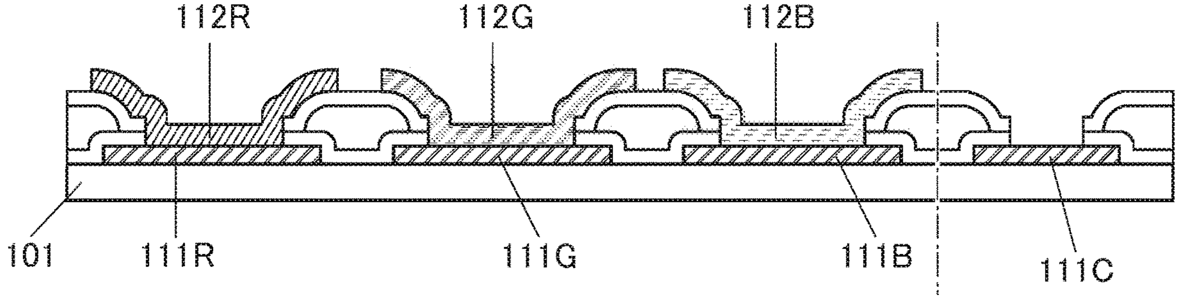
FIG. 8A to FIG. 8C are diagrams illustrating a manufacturing method example of a display device.

Next, the sacrificial layer 145*a*, the sacrificial layer 145*b*, and the sacrificial layer 145*c* are removed to expose the top surfaces of the EL layer 112R, the EL layer 112G, and the EL layer 112B (FIG. 8A). At the same time, the top surface of the connection electrode 111C is also exposed.

Etching of the sacrificial layer 145*a*, the sacrificial layer 145*b*, and the sacrificial layer 145*c* (hereinafter, collectively referred to as the sacrificial layer 145) is preferably performed in the same step.

The sacrificial layer 145 and the sacrificial layer 147 can be removed by wet etching or dry etching. In that case, a method that causes damage to the EL layer 112R, the EL layer 112G, and the EL layer 112B as little as possible is preferably employed. Specifically, a wet etching method is preferably used. For example, wet etching using a tetramethyl ammonium hydroxide (TMAH) aqueous solution, diluted hydrofluoric acid, oxalic acid, phosphoric acid, acetic acid, nitric acid, or a mixed solution thereof is preferably performed.

Alternatively, one or both of the sacrificial layer 145 and the sacrificial layer 147 are preferably removed by being dissolved in a solvent such as water or alcohol. Here, examples of the alcohol in which the sacrificial layer 145 and the sacrificial layer 147 can be dissolved include a variety of alcohol such as ethyl alcohol, methyl alcohol, isopropyl alcohol (IPA), and glycerin.

After the sacrificial layer 145 and the sacrificial layer 147 are removed, drying treatment is preferably performed to remove water contained in the EL layer 112R, the EL layer 112G, and the EL layer 112B and water adsorbed on the surfaces thereof. For example, heat treatment is preferably performed in an inert gas atmosphere or a reduced-pressure atmosphere. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 120° C. The heat treatment is preferably performed in a reduced-pressure atmosphere, in which case drying at a lower temperature is possible.

In this manner, the EL layer 112R, the EL layer 112G, and the EL layer 112B can be formed separately. Furthermore, by repeating the above-described steps, EL layers in light-emitting elements of four or more colors can be separately formed, so that a display device including light-emitting elements of four or more colors can be achieved. Note that some of the above steps can be employed also when a single light-emitting element is formed or when light-emitting elements of two or more colors are formed separately.

[Formation of EL Layer 114]

Figure 8B:
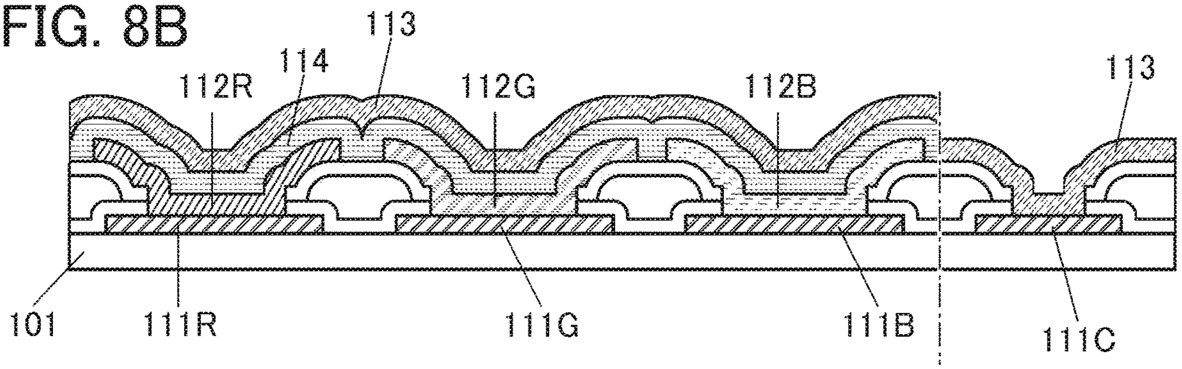

Next, the EL layer 114 is deposited to cover the EL layer 112R, the EL layer 112G, and the EL layer 112B (FIG. 8B).

The EL layer 114 can be deposited in a manner similar to that of the EL film 112Rf or the like. In the case where the EL layer 114 is deposited by an evaporation method, the EL layer 114 is preferably deposited using a shielding mask so as not to be deposited over the connection electrode 111C.

[Formation of Common Electrode 113]

Then, the common electrode 113 is formed to cover the EL layer 114 and the connection electrode 111C (FIG. 8B).

The common electrode 113 can be formed by a deposition method such as an evaporation method or a sputtering method. Alternatively, a film formed by an evaporation method and a film formed by a sputtering method may be stacked. In that case, the common electrode 113 is preferably formed so as to cover a region where the EL layer 114 is formed. That is, a structure in which an end portion of the EL layer 114 overlaps with the common electrode 113 can be obtained. The common electrode 113 is preferably formed using a shielding mask.

The common electrode 113 is electrically connected to the connection electrode 111C outside a display region.

[Formation of Protective Layer 121]

Figure 8C:
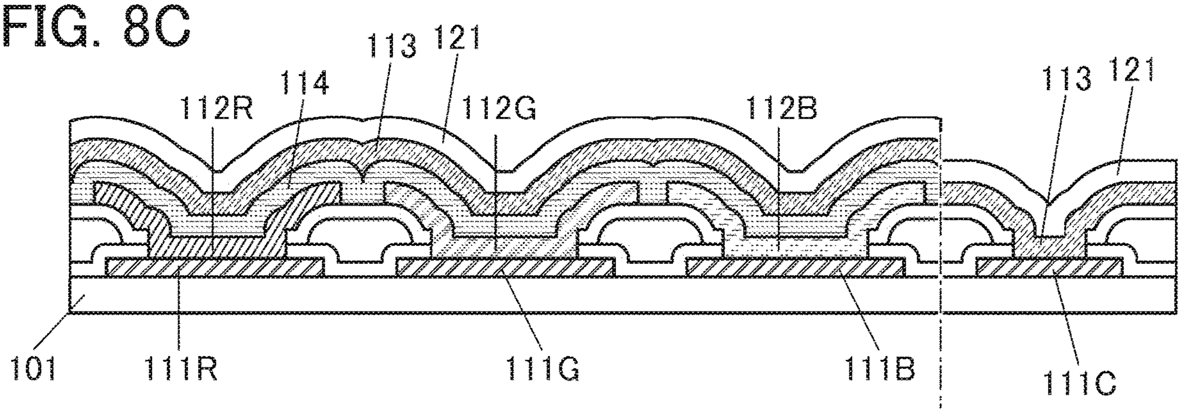

Next, the protective layer 121 is formed over the common electrode 113 (FIG. 8C). An inorganic insulating film used for the protective layer 121 is preferably deposited by a sputtering method, a PECVD method, or an ALD method. In particular, an ALD method is preferable because it provides excellent step coverage and is less likely to cause a defect such as a pinhole. An organic insulating film is preferably deposited by an inkjet method because a uniform film can be formed in a desired area.

Note that thin films included in the display device (e.g., insulating films, semiconductor films, and conductive films) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD: Plasma Enhanced CVD) method and a thermal CVD method. An example of the thermal CVD method is a metal organic chemical vapor deposition (MOCVD: Metal Organic CVD) method.

Alternatively, thin films included in the display device (e.g., insulating films, semiconductor films, and conductive films) can be formed by a method such as spin coating, dipping, spray coating, ink-jetting, dispensing, screen printing, offset printing, a doctor knife method, a slit coating, a roll coating, a curtain coating, or a knife coating.

When the thin films included in the display device are processed, a photolithography method or the like can be used. Besides, a nanoimprinting method, a sandblasting method, a lift-off method, or the like may be used for the processing of the thin films. Island-shaped thin films may be directly formed by a deposition method using a shielding mask such as a metal mask.

There are the following two typical methods of a photolithography method. In one of the methods, a resist mask is formed over a thin film that is to be processed, the thin film is processed by etching or the like, and then the resist mask is removed. In the other method, a photosensitive thin film is deposited and then processed into a desired shape by light exposure and development.

As the light used for light exposure in the photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Light exposure may be performed by liquid immersion exposure technique. As the light used for the light exposure, extreme ultraviolet (EUV) light, X-rays, or the like may be used. Furthermore, instead of the light used for the light exposure, an electron beam can also be used. It is preferable to use extreme ultraviolet light, X-rays, or an electron beam because extremely minute processing can be performed. Note that in the case of performing light exposure by scanning of a beam such as an electron beam, a photomask is not needed.

For etching of the thin film, a dry etching method, a wet etching method, a sandblasting method, or the like can be used.

Through the above steps, the display device 100E illustrated in FIG. 4A can be manufactured.

[Manufacturing Method Example 2 of Display Device]

Although the case where the common electrode 113 and the EL layer 114 are formed so as to have different top surface shapes is described above, they may be formed in the same region.

Figure 9A:
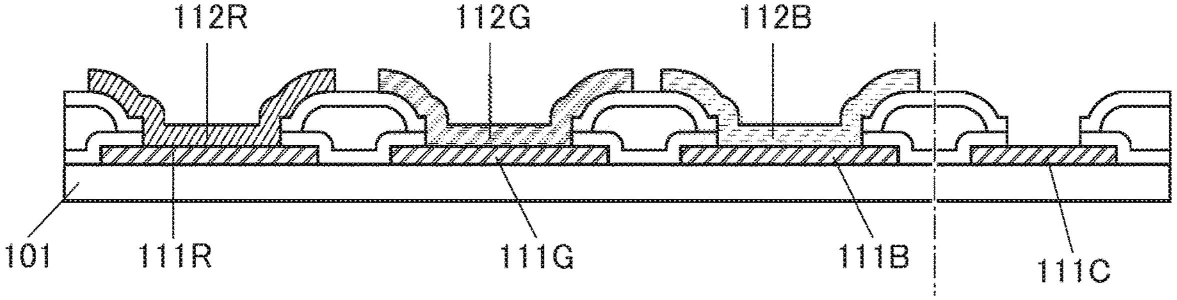
FIG. 9A to FIG. 9C are diagrams illustrating a manufacturing method example of a display device.
Figure 9B:
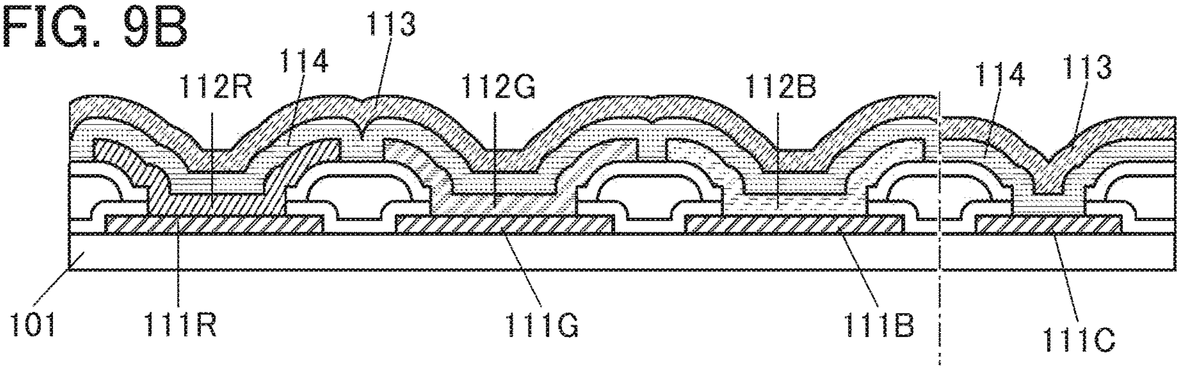

FIG. 9A is a schematic cross-sectional view after removal of the sacrificial layer in the above description. Next, as illustrated in FIG. 9B, the EL layer 114 and the common electrode 113 are formed using the same shielding mask or without using a shielding mask. Thus, manufacturing cost can be reduced as compared to the case where different shielding masks are used.

In this case, as illustrated in FIG. 9B, the connection portion 130 has a structure in which the EL layer 114 is sandwiched between the connection electrode 111C and the common electrode 113. In this case, for the EL layer 114, a material with as low electric resistance as possible is preferably used. Alternatively, it is preferable to form the EL layer 114 as thin as possible, in which case the electric resistance of the EL layer 114 in the thickness direction is reduced. For example, when a material which has an electron-injection property or a hole-injection property and whose thickness is larger than or equal to 1 nm and smaller than or equal to 5 nm, preferably larger than or equal to 1 nm and smaller than or equal to 3 nm is used for the EL layer 114, the electric resistance between the connection electrode 111C and the common electrode 113 can be made small enough to be negligible in some cases.

Figure 9C:
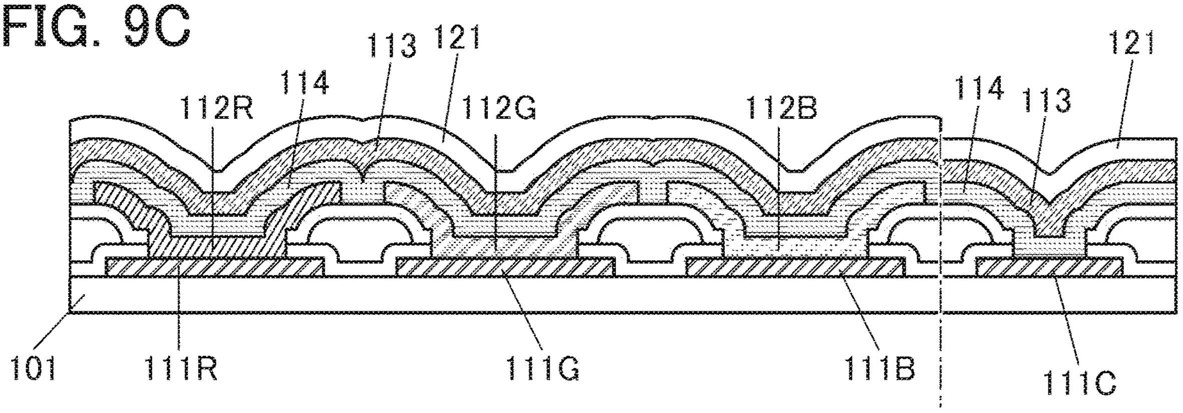

Subsequently, the protective layer 121 is formed as illustrated in FIG. 9C. In this case, as illustrated in FIG. 9C, the protective layer 121 is preferably provided to cover an end portion of the common electrode 113 and the end portion of the EL layer 114. Accordingly, diffusion of impurities such as water or oxygen from the outside into the EL layer 114 and an interface between the EL layer 114 and the common electrode 113 can be effectively prevented.

It is difficult to set the distance between the EL layers of different colors to be less than 10 μm with a formation method using a metal mask, for example; however, with the use of the above method, the distance can be decreased to be less than or equal to 3 μm, less than or equal to 2 μm, or less than or equal to 1 μm. For example, with the use of a light exposure apparatus for LSI, the distance can be decreased to be less than or equal to 500 nm, less than or equal to 200 nm, less than or equal to 100 nm, or less than or equal to 50 nm. Accordingly, the area of a non-light-emitting region that may exist between two light-emitting elements can be significantly reduced, and the aperture ratio can be close to 100%. For example, the aperture ratio higher than or equal to 50%, higher than or equal to 60%, higher than or equal to 70%, higher than or equal to 80% or higher than or equal to 90% and lower than 100% can be achieved.

Furthermore, a pattern of the EL layer itself can be made extremely smaller than that in the case of using a metal mask. For example, in the case of using a metal mask for forming EL layers separately, a variation in the thickness of the pattern occurs between the center and the edge of the pattern. This causes a reduction in an effective area that can be used as a light-emitting region with respect to the entire pattern area. By contrast, in the above manufacturing method, a pattern is formed by processing a film deposited to have a uniform thickness, which enables a uniform thickness in the pattern. Thus, even with a fine pattern, almost the entire area can be used as a light-emitting region. Therefore, the above manufacturing method makes it possible to achieve both high resolution and a high aperture ratio.

The partition (the insulating layer 134, the insulating layer 131, or the insulating layer 132) provided between two adjacent pixel electrodes is provided to cover the end portions of the pixel electrodes. Since a region covered with the partition over the pixel electrode does not function as a light-emitting region of the light-emitting element, the smaller the width of a region where the partition and the pixel electrode overlap with each other becomes, the more effective light-emitting area ratio, i.e., the aperture ratio of the display device, can be increased.

The end portions of the EL layers are positioned over the partition. In that case, the end portions (side surfaces) of two of the EL layers are placed to face each other over the partition. When the distance between the two EL layers is decreased, the width of the partition can also be decreased; thus, the aperture ratio of the display device can be increased. For example, the distance between the side surfaces of the two EL layers facing each other can be less than or equal to 5 μm, preferably less than or equal to 4 μm, further preferably less than or equal to 3 μm, still further preferably less than or equal to 2 μm, yet further preferably less than or equal to 1 μm and greater than or equal to 10 nm, 50 nm, or greater than or equal to 100 nm.

As described above, one embodiment of the present invention can achieve a display device in which minute light-emitting elements are integrated. It is not necessary to conduct a pseudo improvement in resolution by employing a unique pixel arrangement such as a PenTile arrangement; thus, the display device can achieve resolution higher than or equal to 500 ppi, higher than or equal to 1000 ppi, higher than or equal to 2000 ppi, higher than or equal to 3000 ppi, or higher than or equal to 5000 ppi while having what is called a stripe pattern where R, G, and B are arranged in one direction. Furthermore, a display device with an effective light-emitting area ratio (aperture ratio) of higher than or equal to 50%, higher than or equal to 60%, higher than or equal to 70% and lower than 100% can be achieved.

In one embodiment of the present invention, a minute light-emitting element can be manufactured with high accuracy, so that a complex arrangement method of pixels can be achieved. For example, various arrangement methods such as an S-stripe arrangement, a Bayer arrangement, and a delta alignment can be employed in addition to a stripe arrangement.

Note that in this specification and the like, the effective light-emitting area ratio refers to a proportion of an area of a region that can be regarded as a light-emitting region of one pixel in an area of one pixel calculated from a repeated pixel pitch in a display device.

The above is the description of a manufacturing method example of a display device.

At least part of the structure examples, the manufacturing method examples, the drawings corresponding thereto, and the like described in this embodiment can be combined with the other structure examples, the other manufacturing method examples, the other drawings, and the like as appropriate. The terms or expressions used for describing the structure or manufacturing method in this specification can be appropriately used for defining another structure or manufacturing method.

At least part of this embodiment can be implemented in combination with the other embodiments described in this specification as appropriate.

Embodiment 4

In this embodiment, a preferable structure of the insulating layer 131, the insulating layer 132, the insulating layer 134, and the vicinity thereof in the display device of one embodiment of the present invention is described in detail. It is particularly effective to use the structure in the vicinity of the contact hole 163 in FIG. 2.

FIG. 10 to FIG. 12 are enlarged views of the vicinity of one end portion of the light-emitting element 110R in FIG. 1 and the like. Note that only the vicinity of one end portion of the light-emitting element 110R is illustrated here for simple description; however, a similar structure can be applied to the other end portion of the light-emitting element 110R, end portions of the light-emitting element 110G, and end portions of the light-emitting element 110B.

Figure 10A:
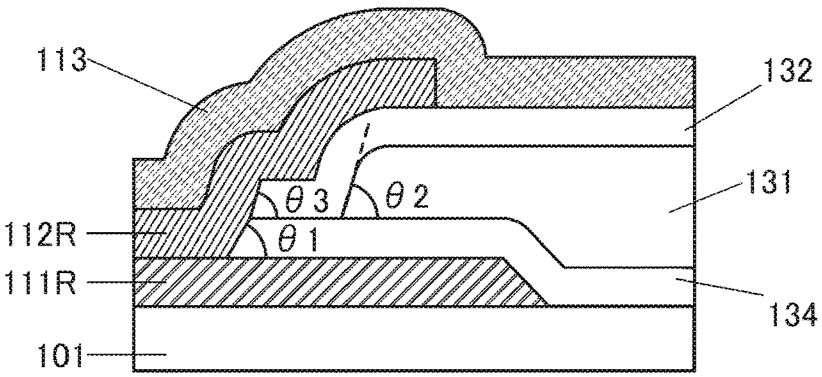
FIG. 10A to FIG. 10D are diagrams illustrating structure examples of a display device.

FIG. 10A illustrates a structure in which the end portion of the insulating layer 134, the end portion of the insulating layer 131, and the end portion of the insulating layer 132 have tapered shapes. An angle formed by a bottom surface and a side surface of the end portion of the insulating layer 134 is denoted as an angle $\theta_1$, an angle formed by a bottom surface and a side surface of the end portion of the insulating layer 131 is denoted as an angle $\theta_2$, and an angle formed by a bottom surface and a side surface of the end portion of the insulating layer 132 is denoted as an angle $\theta_3$. Note that since a surface of the insulating layer 131 in the vicinity of the end portion has a curved shape, a tangent of the end portion of the insulating layer 131 is illustrated by a dashed-dotted line.

The angle $\theta_2$ of the insulating layer 131 is preferably smaller than the angle $\theta_1$ of the insulating layer 134 or the angle $\theta_3$ of the insulating layer 132. When the taper angle $\theta_2$ of the insulating layer 131 is reduced, formation of a low-density region in the insulating layer 132 can be inhibited.

The angle $\theta_2$ of the insulating layer 131 can be larger than 0° and smaller than 90°, preferably larger than or equal to 5° and smaller than or equal to 70°, further preferably larger than or equal to 10° and smaller than or equal to 60°, still further preferably larger than or equal to 15° and smaller than or equal to 50°.

Meanwhile, the angle $\theta_3$ of the insulating layer 132 can be larger than or equal to 0° and smaller than 90°, preferably larger than or equal to 10° and smaller than or equal to 85°, further preferably larger than or equal to 20° and smaller than or equal to 80°, still further preferably larger than or equal to 25° and smaller than or equal to 75°. Note that the angle $\theta_3$ is sometimes larger than or equal to 90° depending on the processing conditions of the insulating layer 132.

The angle $\theta_1$ of the insulating layer 134 can be larger than or equal to 0° and smaller than 90°, preferably larger than or equal to 10° and smaller than or equal to 85°, further preferably larger than or equal to 20° and smaller than or equal to 80°, still further preferably larger than or equal to 25° and smaller than or equal to 75°. Note that the angle $\theta_1$ is sometimes larger than or equal to 90° depending on the processing conditions of the insulating layer 132.

The angle $\theta_1$ of the insulating layer 134 is preferably smaller than the angle $\theta_3$ of the insulating layer 132. When the taper angles are set to $\theta_1<\theta_3$, the step coverage with the EL layer 112R can be improved. When the taper angle of the smaller thickness of the insulating layer 134 and the insulating layer 132 is increased, the step coverage with the EL layer 112R can be improved. For example, when the thickness of the insulating layer 134 is smaller than the thickness of the insulating layer 132, the taper angles are preferably set to $\theta_1>\theta_3$. By contrast, when the thickness of the insulating layer 134 is larger than the thickness of the insulating layer 132, the taper angles are preferably set to $\theta_1<\theta_3$.

Note that when the surface of the insulating layer 131 is curved, the top surface and the side surface are continuous and cannot be distinguished from each other in some cases. In that case, in the surface of the insulating layer 131 in the vicinity of the end portion, the surface of a portion whose thickness is increased from the end portion can be regarded as the side surface, and the surface of a portion whose thickness is constant can be regarded as the top surface.

Figure 10B:
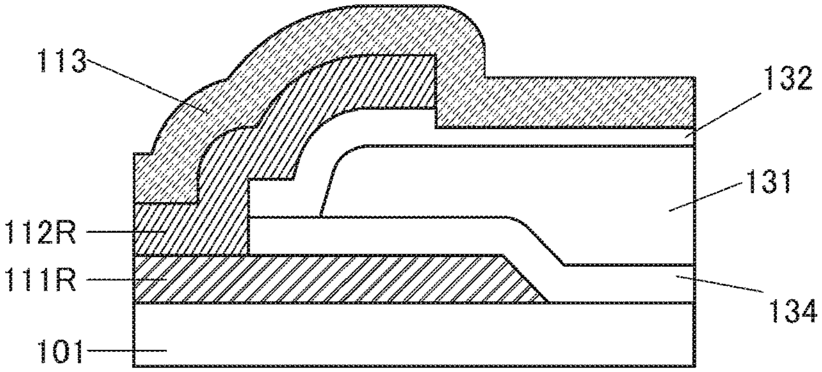

FIG. 10B illustrates a structure in which a depression is provided in part of the insulating layer 132. For example, in some cases, part of the insulating layer 132 is removed and a depression is formed when the EL layer 112R is etched. The insulating layer 132 functions as an etching stopper, so that the insulating layer 131 can be prevented from being exposed. As a result, step coverage with the common electrode 113 can be improved.

Figure 10C:
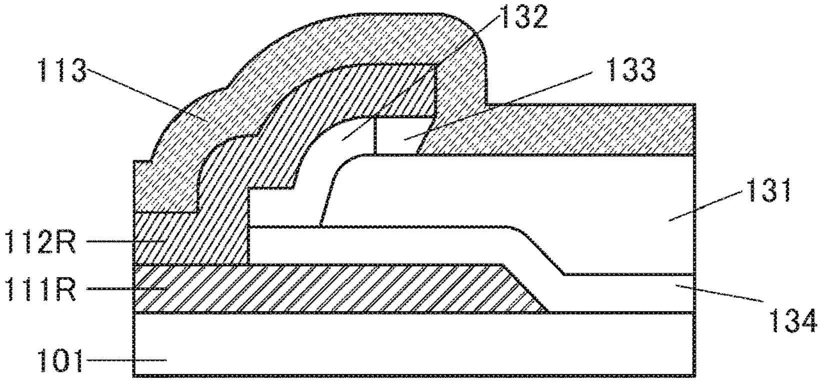

FIG. 10C illustrates a structure in which part of the insulating layer 132 is removed and part of the insulating layer 131 is exposed. In this structure, the common electrode 113 is in contact with the insulating layer 131. Between the light-emitting element 110R and the adjacent light-emitting element, a portion of the insulating layer 132 that is not covered with the EL layer is removed by etching and is divided into two in some cases.

An end surface of the insulating layer 132 may be recessed below an end portion of the EL layer 112R by etching. A space 133 surrounded by the EL layer 112R, the insulating layer 132, the insulating layer 131, and the common electrode 113 is formed. The common electrode 113 may be placed to overlap with the EL layer 112R in the space 133.

Note that in the case where the EL layer 114 (common layer) is provided between the EL layer 112R and the common electrode 113, the EL layer 114 is in contact with the insulating layer 131.

Figure 10D:
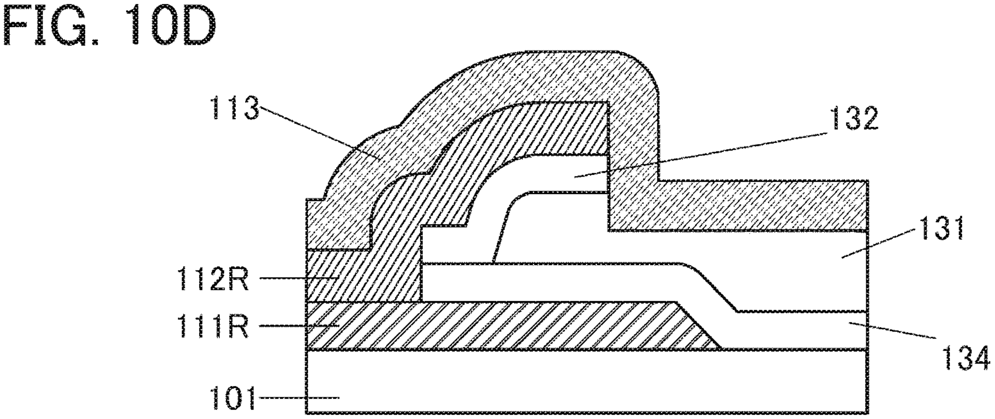

FIG. 10D illustrates a structure in which a depression is provided in part of the insulating layer 131. For example, in some cases, part of the insulating layer 131 is removed and a depression is formed when the EL layer 112R is etched. The depression is a region with a smaller thickness than a region of the insulating layer 131 on which etching is not performed. In this structure, the common electrode 113 (or the EL layer 114) is in contact with the insulating layer 131 in the depression.

Figure 11A:
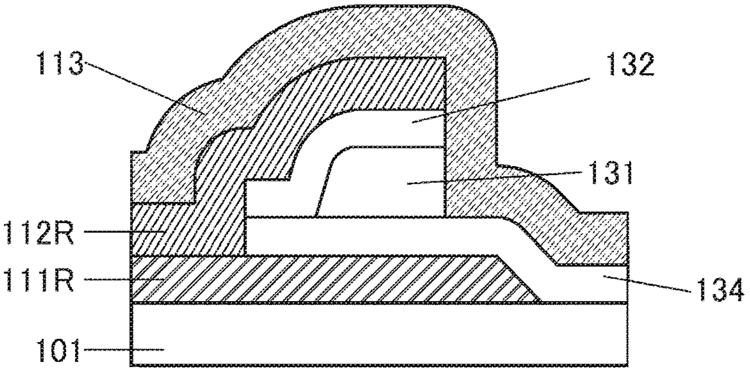
FIG. 11A to FIG. 11D are diagrams illustrating structure examples of a display device.

FIG. 11A illustrates a structure in which part of the insulating layer 131 is removed and part of the insulating layer 134 is exposed. Like the structure illustrated in FIG. 2C, the insulating layer 134 functions as a protective layer, so that the pixel electrode 111R can be prevented from being exposed. In this structure, the common electrode 113 (or the EL layer 114) is in contact with the insulating layer 134.

Figure 11B:
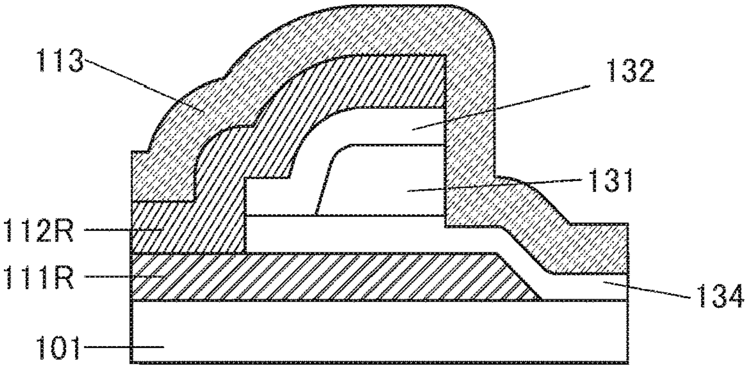

FIG. 11B illustrates a structure in which a depression is provided in part of the insulating layer 134. In this structure, the common electrode 113 (or the EL layer 114) is in contact with the insulating layer 134 in the depression.

Figure 11C:
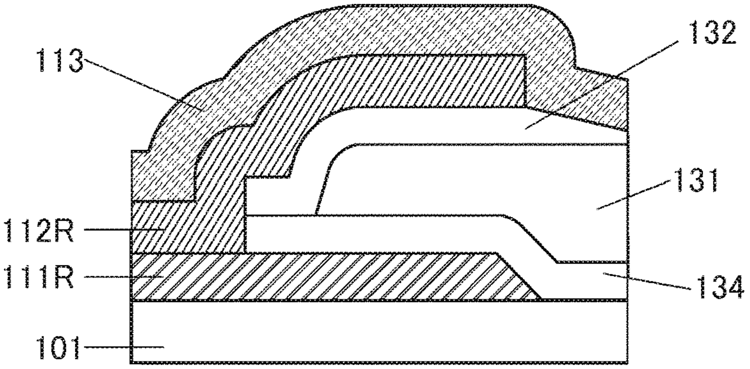

FIG. 11C illustrates a structure in which the end portion of the insulating layer 132 has a tapered shape below the EL layer 112R. For example, the end portion of the insulating layer 132 is processed into a tapered shape when the EL layer 112R is etched. This is effective for improving the step coverage with the common electrode 113.

In this structure, the common electrode 113 (or the EL layer 114) is in contact with a tapered portion of the insulating layer 132. In the case where the insulating layer 131 is not exposed, the common electrode 113 (or the EL layer 114) is in contact with the insulating layer 132 in a depression (see FIG. 10B or the like).

In the case where the insulating layer 131 is exposed, the common electrode 113 (or the EL layer 114) is in contact with the insulating layer 131 (see FIG. 10C, FIG. 10D, or the like).

In the case where the insulating layer 134 is exposed, the common electrode 113 (or the EL layer 114) is in contact with the insulating layer 134 (see FIG. 11A, FIG. 11B, or the like).

Figure 11D:
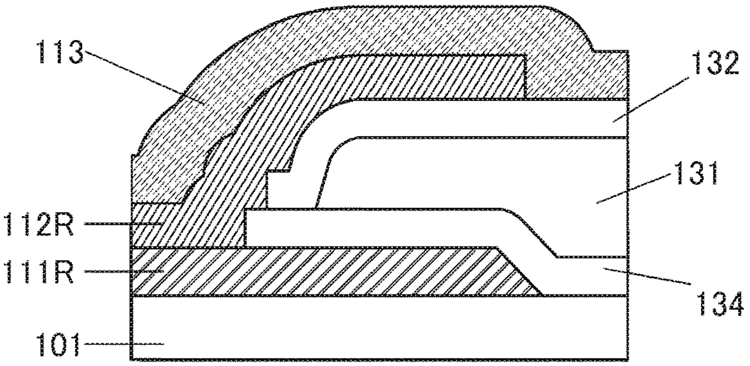

FIG. 11D illustrates a structure in which the end portion of the insulating layer 134 protrudes beyond the end portion of the insulating layer 131 and the end portion of the insulating layer 132.

FIG. 12A illustrates a structure in which the end portion of the insulating layer 132 covers the end portion of the insulating layer 131 and the end portion of the insulating layer 134.

FIG. 12B illustrates a structure in which the end portion of the insulating layer 131 covers the end portion of the insulating layer 134, and the end portion of the insulating layer 132 covers the end portion of the insulating layer 131.

In the end portion, the insulating layer 134 is not in contact with the insulating layer 132.

FIG. 12C illustrates a structure in which the end portion of the insulating layer 134 protrudes beyond the end portion of the insulating layer 131 and the end portion of the insulating layer 132. In the end portion, the insulating layer 134 is not in contact with the insulating layer 132.

When the structures illustrated in FIG. 11D, FIG. 12A, or FIG. 12B are employed, a step due to a stack of the insulating layer 134 and the insulating layer 132 is reduced, so that the step coverage with the EL layer 112R can be improved. These structures can be formed by, for example, processing the insulating layer 134 and the insulating layer 132 in different steps.

FIG. 12D illustrates an example in which the insulating layer 132, the insulating layer 134, and the pixel electrode 111R each have a stacked-layer structure.

The insulating layer 132 has a stacked-layer structure in which the insulating layer 132*a* and the insulating layer 132*b* are stacked from the substrate 101 side. The insulating layer 132*b* is thicker than the insulating layer 132*a*. In that case, the taper angle of the insulating layer 132*b* is preferably smaller than the taper angle of the insulating layer 132*a*. In contrast, the insulating layer 132*b* may be thinner than the insulating layer 132*a*, in which case the taper angle of the insulating layer 132*b* is preferably larger than the taper angle of the insulating layer 132*a*.

The insulating layer 134 has a stacked-layer structure in which the insulating layer 134*a* and the insulating layer 134*b* are stacked from the substrate 101 side. The insulating layer 134*b* is thicker than the insulating layer 134*a*. In that case, the taper angle of the insulating layer 134*b* is preferably smaller than the taper angle of the insulating layer 134*a*. In contrast, the insulating layer 134*b* may be thinner than the insulating layer 134*a*, in which case the taper angle of the insulating layer 134*b* is preferably larger than the taper angle of the insulating layer 134*a*.

As described above, in the case where the insulating layer 132 or the insulating layer 134 has a stacked-layer structure, the step coverage with the EL layer 112R can be improved by making the thicker film have a smaller taper angle.

Note that without being limited to the above, the taper angle of the thinner film may be smaller than that of the thicker film. The insulating layer 132 or the insulating layer 134 may have a stacked-layer structure of three or more layers.

In the pixel electrode 111R, the conductive layer 111*a* and the conductive layer 111*b* are stacked from the substrate 101 side. Here, an example in which the conductive layer 111*b* is provided to cover an end portion of the conductive layer 111*a* is illustrated. Thus, a surface of the conductive layer 111*a* can be protected by the conductive layer 111*b*.

For the conductive layer 111*a*, a film having a reflective property with respect to light emitted by the EL layer 112R can be used. In contrast, for the conductive layer 111*b*, a film having a transmitting property with respect to the light can be used.

For the conductive layer 111*a*, for example, a metal film or an alloy film can be used. A metal film having a high reflective property with respect to visible light, such as a film of aluminum or silver, or an alloy film of them is preferably used for the conductive layer 111*a*, in which case the light extraction efficiency of the light-emitting element 110R can be increased.

For the conductive layer 111*b*, a conductive material having a light-transmitting property with respect to visible light can be used. For example, conductive oxide such as indium oxide, indium tin oxide, indium zinc oxide, indium tin oxide containing silicon, or indium zinc oxide containing silicon can be used.

Note that one end portion (the region 117R) of the pixel electrode 111R illustrated in FIG. 4B or FIG. 4C may employ any of the structures in FIG. 10 to FIG. 12, and the other end portion (the region 118R) may employ any of the other structures in FIG. 10 to FIG. 12. As described above, it is also effective to form partitions with different structures in end portions of one pixel electrode.

At least part of the structure examples, the manufacturing method examples, the drawings corresponding thereto, and the like described in this embodiment can be combined with the other structure examples, the other manufacturing method examples, the other drawings, and the like as appropriate. The terms or expressions used for describing the structure or manufacturing method in this specification can be appropriately used for defining another structure or manufacturing method.

At least part of this embodiment can be implemented in combination with the other embodiments described in this specification as appropriate.

Embodiment 5

In this embodiment, structure examples of the display device of one embodiment of the present invention are described.

[Structure Example 7 of Display Device]

Figure 13A:
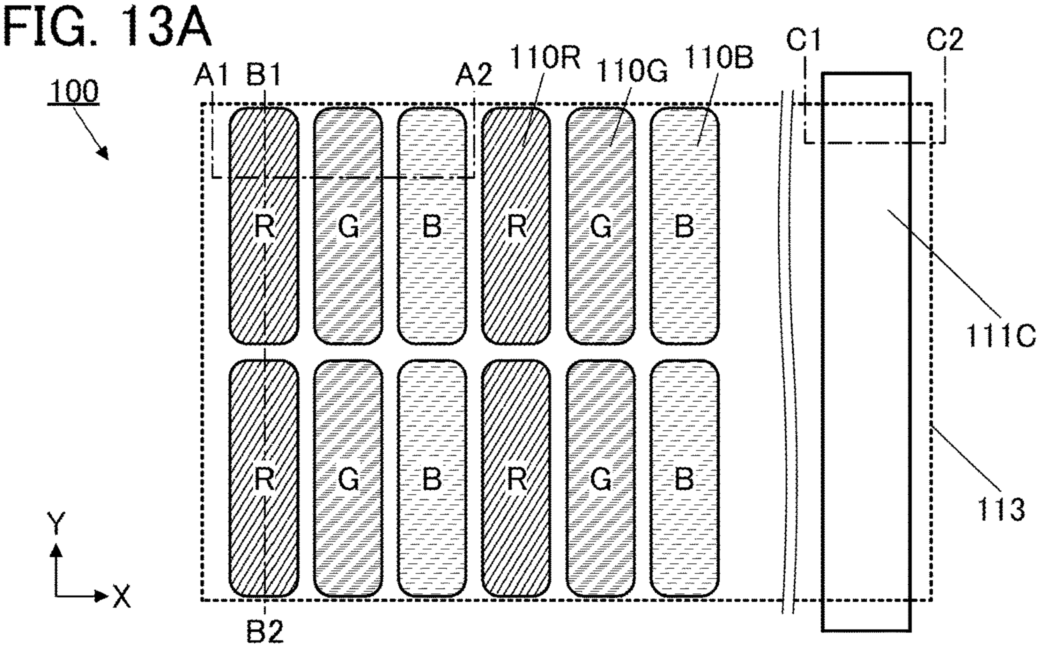
FIG. 13A to FIG. 13D are diagrams illustrating a structure example of a display device.

FIG. 13A is a schematic top view of the display device 100 of one embodiment of the present invention. The display device 100 includes a plurality of the light-emitting elements 110R exhibiting red, a plurality of the light-emitting elements 110G exhibiting green, and a plurality of the light-emitting elements 110B exhibiting blue. In FIG. 13A, light-emitting regions of the light-emitting elements are denoted by R, G, and B to easily differentiate the light-emitting elements.

The light-emitting elements 110R, the light-emitting elements 110G, and the light-emitting elements 110B are arranged in a matrix. FIG. 13A illustrates what is called a stripe arrangement, in which light-emitting elements of the same color are arranged in one direction. Note that the arrangement method of the light-emitting elements is not limited thereto; another arrangement method such as an S-stripe arrangement, a delta arrangement, a Bayer arrangement, or a zigzag arrangement may be employed, or a PenTile arrangement may also be used.

The light-emitting elements 110R, the light-emitting elements 110G, and the light-emitting elements 110B are arranged in the X direction. The light-emitting elements of the same color are arranged in the Y direction intersecting with the X direction.

Figure 13B:
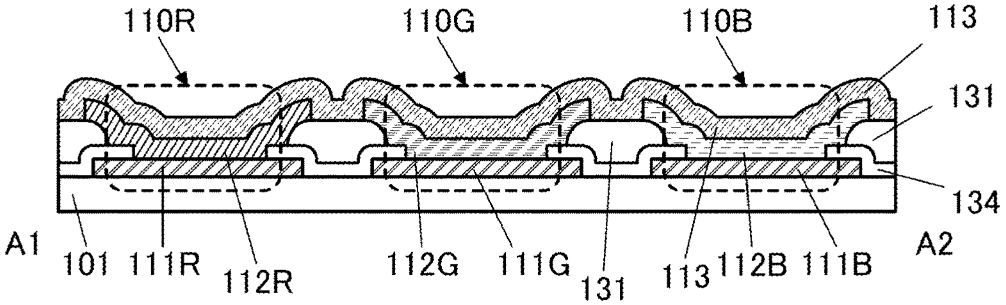
Figure 13C:
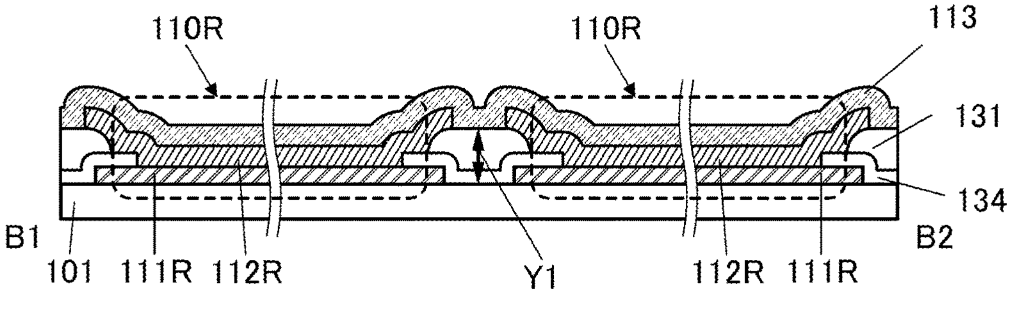

FIG. 13B is a schematic cross-sectional view taken along the dashed-dotted line A1-A2 in FIG. 13A, and FIG. 13C is a schematic cross-sectional view taken along the dashed-dotted line B1-B2.

FIG. 13B illustrates a cross section of the light-emitting element 110R, the light-emitting element 110G, and the light-emitting element 110B. The light-emitting element 110R includes the pixel electrode 111R, the EL layer 112R, and the common electrode 113. The light-emitting element 110G includes the pixel electrode 111G, the EL layer 112G, and the common electrode 113. The light-emitting element 110B includes the pixel electrode 111B, the EL layer 112B, and the common electrode 113. The common electrode 113 is shared by the light-emitting element 110R, the light-emitting element 110G, and the light-emitting element 110B.

In one embodiment of the present invention, an insulating layer (also referred to as an embankment, a bank, or a partition) is preferably provided to cover the end portions of the pixel electrode 111R and the like (referring to the pixel electrode 111R, the pixel electrode 111G, and the pixel electrode 111B).

With this partition, the step coverage with the EL layer 112R and the like (referring to the EL layer 112R, the EL layer 112G, and the EL layer 112B) over the partition can be improved. A reduction in the thicknesses of the EL layer 112R and the like at the end portions of the pixel electrode 111R and the like can be prevented, so that an increase in leakage current can be prevented. An electrical short circuit between the pixel electrode 111R and the like and the common electrode 113 placed over the EL layer 112R and the like can be prevented. The partition can be formed of a single insulating layer or a plurality of insulating layers.

FIG. 13B illustrates an example in which the partition is formed of a plurality of insulating layers. Specifically, the insulating layer 134 covering the end portions of the pixel electrode 111R and the like and the insulating layer 131 over the insulating layer 134 are provided.

The insulating layer 134 and the insulating layer 131 each include a portion overlapping with the EL layer 112R and the like and a portion not overlapping with the EL layer 112R and the like.

The insulating layer 134 includes a portion overlapping with the pixel electrode 111R and the like and a portion not overlapping with the pixel electrode 111R and the like. The insulating layer 131 over the insulating layer 134 includes a portion overlapping with the pixel electrode 111R and the like with the insulating layer 134 therebetween and a portion not overlapping with the pixel electrode 111R and the like.

The end portion of the insulating layer 134 preferably includes a region protruding beyond the end portion of the insulating layer 131 (also referred to as a region extending beyond the end portion) in the end portion direction. In the plan view, the outline of the insulating layer 131 preferably includes a portion positioned inside the outline of the insulating layer 134. In that case, over the pixel electrode 111R and the like, the EL layer 112R and the like include a region in contact with the insulating layer 134.

The end portion of the insulating layer 134 may include a region covered with the insulating layer 131. In that case, the region of the insulating layer 134 is not in contact with the EL layer 112R and the like.

Here, the insulating layer 134 has a function as a layer for protecting the pixel electrode 111R (also referred to as a protective layer).

Figure 14A:
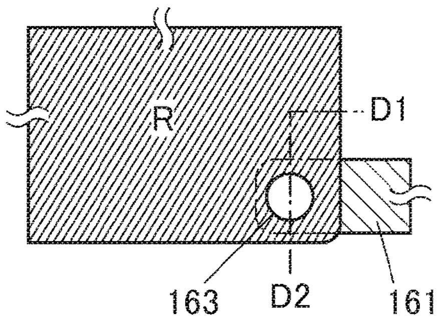
FIG. 14A to FIG. 14C are diagrams illustrating structure examples of a display device.
Figure 14B:
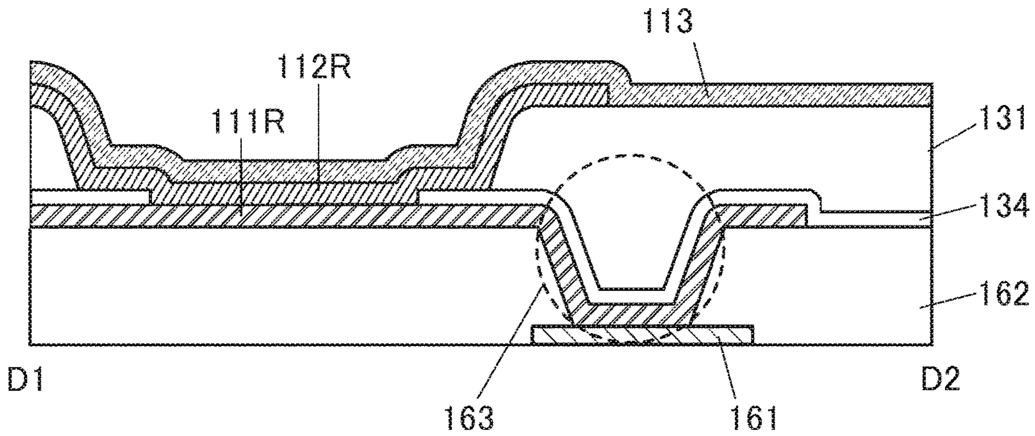
Figure 14C:
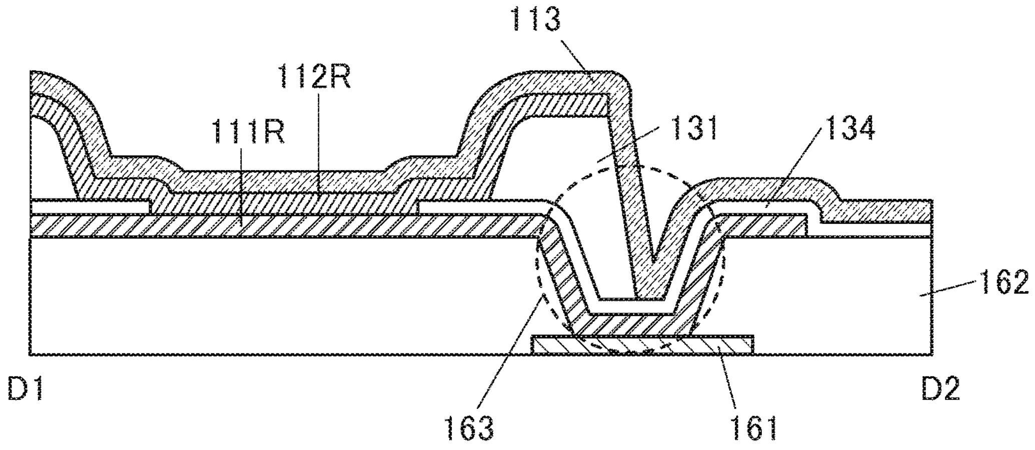

FIG. 14 illustrates a specific example in which the insulating layer 134 functions as a protective layer. FIG. 14A illustrates part of the light-emitting element 110R in FIG. 13A and the vicinity thereof, and FIG. 14B and FIG. 14C are examples of schematic cross-sectional views taken along the dashed-dotted line D1-D2 in FIG. 14A. D1-D2 indicates a portion where the pixel electrode 111R is electrically connected to the layer 161.

In FIG. 14B and FIG. 14C, the layer 161 is, for example, a layer electrically connected to a transistor (e.g., a conductive layer or a semiconductor layer), and the insulating layer 162 functioning as a planarization film is placed over the layer 161. The pixel electrode 111R placed over the insulating layer 162 is electrically connected to the layer 161 through the contact hole 163 in the insulating layer 162. Note that the insulating layer 162 is an insulating layer included in the substrate 101 in FIG. 13.

As illustrated in FIG. 14B, a partition is preferably provided in a portion over the pixel electrode 111R, from which a display region is excluded (e.g., a portion including the contact hole 163). However, when the insulating layer 131 having a single layer is placed as the partition, for example, the insulating layer 131 might be removed due to a formation process of an EL layer over the partition. For example, the partition might be removed when forming the EL layer by etching.

When the insulating layer 134 is provided under the insulating layer 131 as illustrated in FIG. 14C, the insulating layer 134 functions as a protective layer (etching stopper) even if part of the insulating layer 131 is removed, so that exposure of the pixel electrode 111R can be prevented. As a result, a short circuit between the pixel electrode 111R and the common electrode 113 can be prevented.

As described above, a structure in which the insulating layer 134 is placed under the insulating layer 131 is employed, whereby defects of a display device can be reduced and the display quality can be improved.

Next, examples of materials which are preferable for the insulating layer 134 and the insulating layer 131 are described.

For the insulating layer 134, an insulating film containing an inorganic insulating material (also referred to as an inorganic material or an inorganic substance) is preferably used. For the insulating layer 134, it is further preferable to use an insulating film having etching resistance to an etching step of the EL layer 112R. Using such a material for the insulating layer 134 can enhance the function as a protective layer.

For the insulating layer 131, an insulating film containing an organic insulating material (also referred to as an organic material or an organic substance) such as an organic resin is preferably used. In that case, the end portion of the insulating layer 131 preferably has a moderate curve. This can improve step coverage with a layer (e.g., an EL layer) formed over the insulating layer 131.

Specific examples of the inorganic insulating material that can be used for the insulating layer 134 include films of oxides and nitrides such as silicon oxide, silicon oxynitride, silicon nitride oxide, silicon nitride, aluminum oxide, aluminum oxynitride, and hafnium oxide. Yttrium oxide, zirconium oxide, gallium oxide, tantalum oxide, magnesium oxide, lanthanum oxide, cerium oxide, neodymium oxide, or the like may be used.

Specific examples of materials that can be used for the insulating layer 131 include an acrylic resin, a polyimide resin, an epoxy resin, a polyamide resin, a polyimide-amide resin, a siloxane resin, a benzocyclobutene-based resin, a phenol resin, and precursors of these resins.

As described above, using suitable materials for the insulating layer 134 and the insulating layer 131 can enhance the function as the partition. Note that the above materials are examples, and another material can be used. For example, an organic insulating material such as an organic resin may be used for the insulating layer 134. In that case, the partition can be formed high and have a function similar to that of the etching stopper described above. The insulating layer 131 can also be formed using an inorganic insulating material.

The end portion of the insulating layer 134 or the insulating layer 131 preferably has a tapered shape. This can improve step coverage with a film formed over these insulating layers. Note that in this specification and the like, an end portion of an object having a tapered shape indicates that the end portion of the object has a cross-sectional shape in which the angle between a surface of the object and a surface on which the object is formed is larger than 0° and smaller than 90° in a region of the end portion, preferably, larger than or equal to 5° and smaller than or equal to 70°, and the thickness continuously increases from the end portion.

In addition, the thickness of the insulating layer 134 is preferably smaller than the thickness of the insulating layer 131. When the insulating layer 134 is formed to be thin, the step coverage with a film formed over the end portion of the insulating layer 134 can be improved, for example.

Note that although the light-emitting element 110R is described as an example in FIG. 14, a similar structure can be applied to the light-emitting element 110G and the light-emitting element 110B.

FIG. 13A illustrates the connection electrode 111C that is electrically connected to the common electrode 113. The connection electrode 111C is supplied with a potential (e.g., an anode potential or a cathode potential) that is to be supplied to the common electrode 113. The connection electrode 111C is provided outside a display region where the light-emitting elements 110R and the like are arranged. In FIG. 13A, the common electrode 113 is denoted by a dashed line.

The connection electrode 111C can be provided along the outer periphery of the display region. For example, the connection electrode 111C may be provided along one side of the outer periphery of the display region or two or more sides of the outer periphery of the display region. That is, in the case where the display region has a rectangular top surface shape, the top surface shape of the connection electrode 111C can be a band shape, an L shape, a U shape (a square bracket shape), a quadrangular shape, or the like.

Figure 13D:
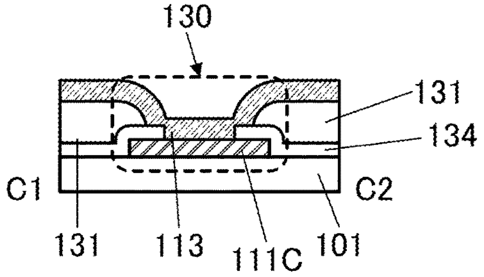

FIG. 13D is a schematic cross-sectional view taken along the dashed-dotted line C1-C2 in FIG. 13A. FIG. 13D illustrates the connection portion 130 in which the connection electrode 111C is electrically connected to the common electrode 113. In the connection portion 130, the common electrode 113 is provided on and in contact with the connection electrode 111C. The insulating layer 134 and the insulating layer 131 are provided to cover the end portion of the connection electrode 111C.

At least part of the structure examples, the manufacturing method examples, the drawings corresponding thereto, and the like described in this embodiment can be combined with the other structure examples, the other manufacturing method examples, the other drawings, and the like as appropriate. The terms or expressions used for describing the structure or manufacturing method in this specification can be appropriately used for defining another structure or manufacturing method.

At least part of this embodiment can be implemented in combination with the other embodiments described in this specification as appropriate.

Embodiment 6

Other structure examples of the display device of one embodiment of the present invention are described below with reference to drawings. Structure example 7 and the like are referred to for portions similar to those described in Structure example 7 and the like, and portions are not described.

FIG. 15 and FIG. 16 are schematic cross-sectional views of a display device 100F to a display device 100H, a display device 100J, and a display device 100K which are other structure examples of the display device of the present invention. Top views of the display device 100F to the display device 100H, the display device 100J, and the display device 100K are similar to that in FIG. 13A.

[Structure Example 8 of Display Device]

Figure 15A:
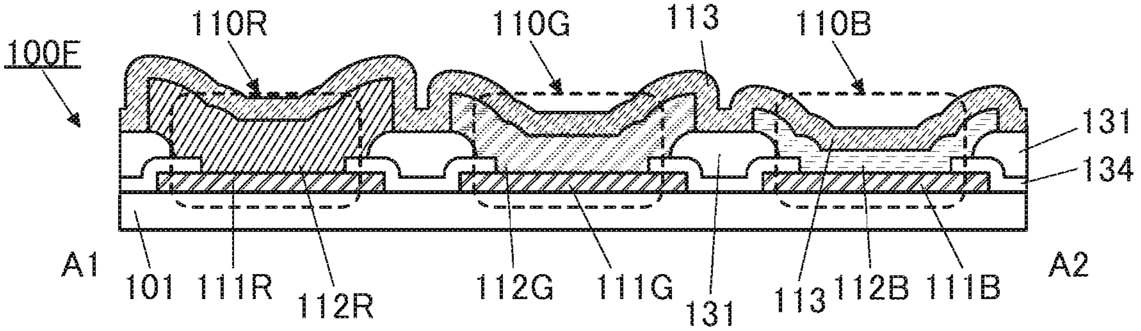
FIG. 15A to FIG. 15D are diagrams illustrating structure examples of display devices.

FIG. 15A is a schematic cross-sectional view of the display device 100F (corresponding to a cross-section in the X direction in FIG. 13A). The display device 100F is an example in which a microcavity structure is achieved by changing the thicknesses of the EL layer 112R, the EL layer 112G, and the EL layer 112B. Such a structure does not require an optical adjustment layer provided additionally, simplifying the process.

For example, in the display device 100F, the EL layer 112R of the light-emitting element 110R emitting light whose wavelength is longest has the largest thickness, and the EL layer 112B of the light-emitting element 110B emitting light whose wavelength is shortest has the smallest thickness. Without limitation to this, the thickness of each EL layer can be adjusted in consideration of the wavelength of light emitted by the light-emitting element, the optical characteristics of the layer included in the light-emitting element, the electrical characteristics of the light-emitting element, and the like.

[Structure Example 9 of Display Device]

Figure 15B:
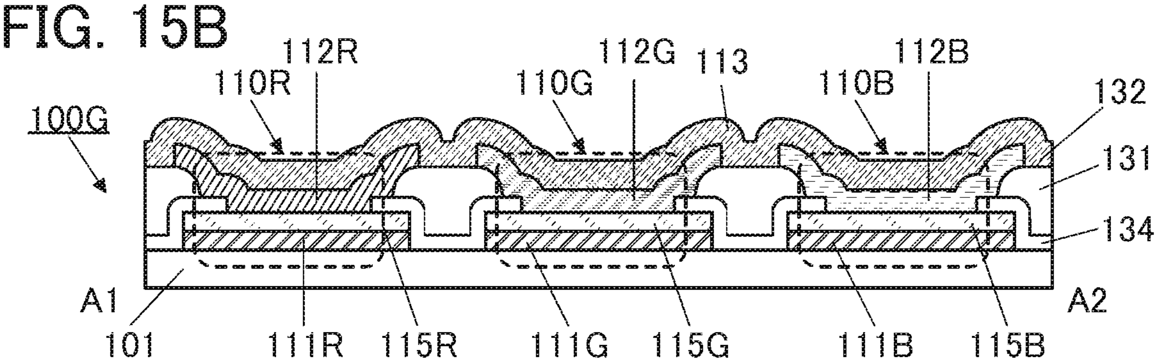

FIG. 15B is a schematic cross-sectional view of the display device 100G (corresponding to a cross section in the X direction in FIG. 13A). The display device 100G is an example in which an optical adjustment layer is provided.

The light-emitting element 110R includes the optical adjustment layer 115R between the pixel electrode 111R and the EL layer 112R. The light-emitting element 110G includes the optical adjustment layer 115G between the pixel electrode 111G and the EL layer 112G. The light-emitting element 110B includes the optical adjustment layer 115B between the pixel electrode 111B and the EL layer 112B.

Figure 24A:
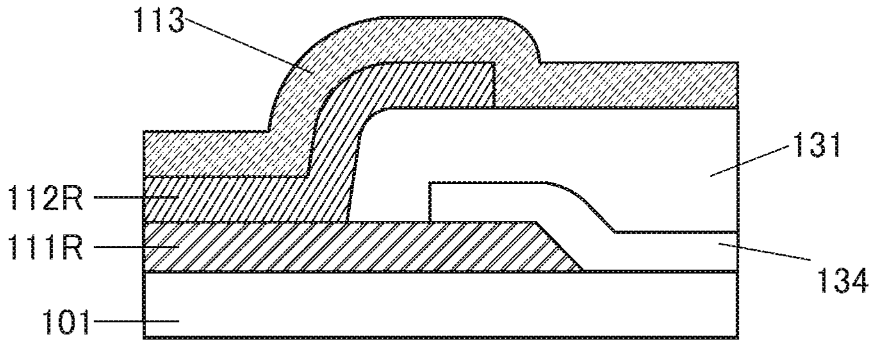
FIG. 24A to FIG. 24C are diagrams illustrating structure examples of a display device.
Figure 24B:
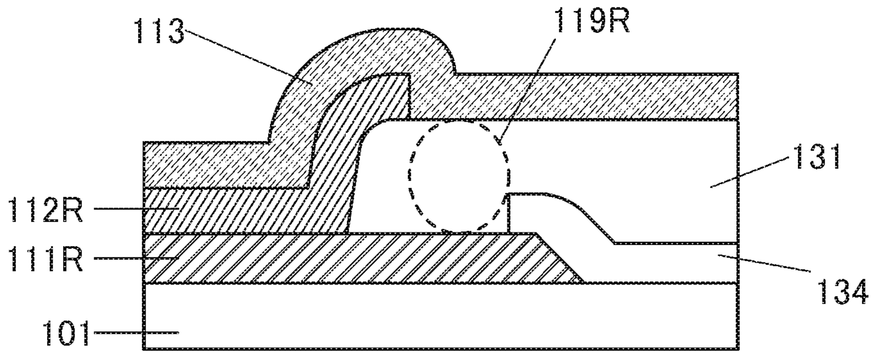
Figure 24C:
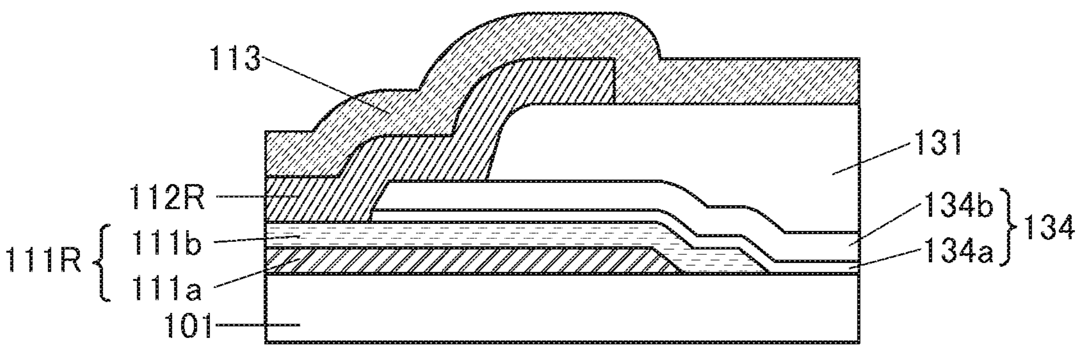

Each of the optical adjustment layer 115R, the optical adjustment layer 115G, and the optical adjustment layer 115B corresponds to the conductive layer 111*b* illustrated as an example in FIG. 24C and the like. In this case, the pixel electrode 111R, the pixel electrode 111G, and the pixel electrode 111B each correspond to the conductive layer 111*a*.

In addition, the optical adjustment layer 115R, the optical adjustment layer 115G, and the optical adjustment layer 115B each have a light-transmitting property with respect to visible light. The optical adjustment layer 115R, the optical adjustment layer 115G, and the optical adjustment layer 115B have different thicknesses. For example, each of the thicknesses may be adjusted such that the thickness of the optical adjustment layer 115R>the thickness of the optical adjustment layer 115G>the thickness of the optical adjustment layer 115B. Thus, the optical path lengths of the light-emitting elements can differ from one another. The optical adjustment layers preferably have a region overlapping with the insulating layer 134 and the insulating layer 131.

Here, a conductive film that has a reflective property with respect to visible light is used for the pixel electrode 111R and the like, and a conductive film that has properties of reflecting and transmitting visible light is used for the common electrode 113. Thus, the light-emitting elements have what is called a microcavity structure and intensify light with a specific wavelength. This can achieve a display device having a high color purity.

A conductive material having a light-transmitting property with respect to visible light can be used for each of the optical adjustment layers. For example, a conductive oxide such as indium oxide, indium tin oxide, indium zinc oxide, zinc oxide, zinc oxide containing gallium, indium-tin oxide containing silicon, or an indium-zinc oxide containing silicon can be used.

The optical adjustment layers can be formed after the formation of the pixel electrode 111R and the like and before the formation of a film to be the EL layer 112R (the EL film 112Rf) and the like. The optical adjustment layers may be formed using conductive films with different thicknesses from each other or may have a single-layer structure, a two-layer structure, a three-layer structure, or the like, in ascending order of thickness. Note that a layer in which the pixel electrode 111R and the optical adjustment layer 115R are stacked is sometimes referred to as a pixel electrode.

As the optical adjustment layer 115R and the like, an insulating layer including a film containing silicon nitride (also referred to as a silicon nitride film) or a film containing silicon oxide (also referred to as a silicon oxide film) may be used. With the use of either a single layer or a stacked layer of the above films, the thickness can be adjusted. For example, the number of layers may be changed for each color such that three insulating layers (a stack of a single silicon nitride film and two silicon oxide films) is used as the optical adjustment layer 115R, two insulating layers (a stack of a single silicon nitride film and a single silicon oxide film) is used as the optical adjustment layer 115G, and a single insulating layer (a silicon nitride film or a silicon oxide film) is used as the optical adjustment layer 115B. Note that the insulating layer may be provided only in a color that preferably has a larger thickness.

For the optical adjustment layers, the conductive film having a light-transmitting property with respect to visible light described above may be provided over these insulating layers. In that case, the conductive film functions as a pixel electrode of the light-emitting element. The pixel electrode 111R and the like can be used as a reflective film.

[Structure Example 10 of Display Device]

Figure 15C:
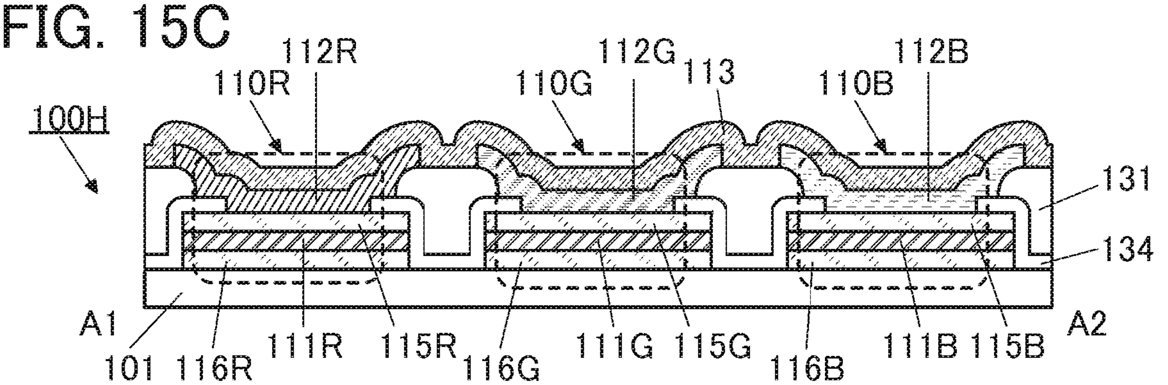

FIG. 15C is a schematic cross-sectional view of the display device 100H (corresponding to a cross section in the X direction in FIG. 13A).

The display device 100H is an example in which the conductive layer 116R and the like (referring to the conductive layer 116R, the conductive layer 116G, and the conductive layer 116B) are provided under the pixel electrode 111R and the like in addition to the display device 100G in FIG. 15B.

The pixel electrode 111R and the like are electrically connected to the layer 161 provided below the pixel electrode 111R and the like as illustrated in FIG. 14B and the like as an example. When the conductive layer 116R and the like are provided between the pixel electrode 111R and the like and the layer 161, the connection between the pixel electrode 111R and the like and the layer 161 becomes favorable in some cases. The conductive layer 116R and the like preferably include a region overlapping with the insulating layer 134 and the insulating layer 131.

The conductive layer 116R and the like can be formed using a material having a light-transmitting property or a material having a reflective property. As the material having a light-transmitting property, a material can be appropriately selected from the materials described for the optical adjustment layer 115R. In that case, the conductive layer 116R and the like are preferably formed using the same material as the optical adjustment layer 115R, but a different material may be used. As the material having a reflective property, a material can be appropriately selected from the materials described for the pixel electrode 111R. In that case, the conductive layer 116R and the like are preferably formed using a material different from that for the electrode 111R, but the same material may be used.

The conductive layer 116R and the like can include a single conductive layer or a two or more conductive layers. Note that a layer in which the conductive layer 116R and the like, the pixel electrode 111R and the like, and the optical adjustment layer 115R and the like are stacked is sometimes referred to as a pixel electrode.

[Structure Example 11 of Display Device]

Figure 15D:
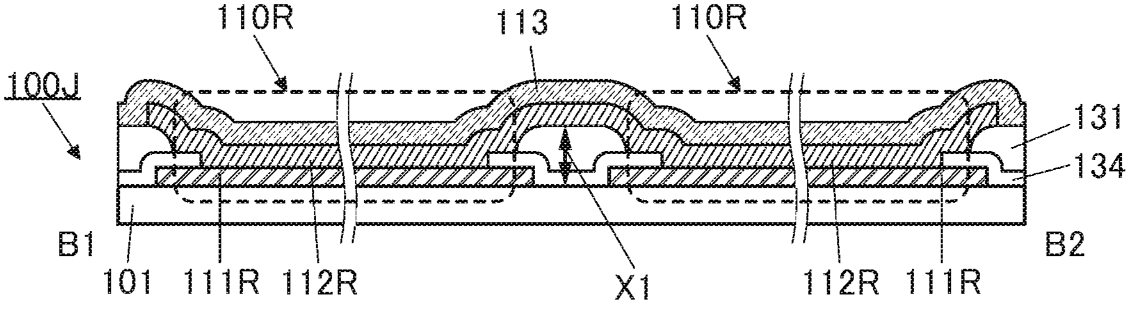

FIG. 15D is a schematic cross-sectional view of the display device 100J (corresponding to a cross-section in the Y direction in FIG. 13A). The display device 100J is an example of using the band-shaped EL layer 112R extending in the Y direction and the common electrode 113. FIG. 15D illustrates a cross section of the two light-emitting elements 110R arranged side by side in the Y direction. FIG. 15D illustrates a cross section of the partition X (e.g., the insulating layer 134 or the insulating layer 131) extending in the X direction.

When the EL layer 112R is formed in a band shape in the Y direction as illustrated in FIG. 15D, a space for dividing the EL layer 112R is not needed and thus the area of a non-light-emitting region between the light-emitting elements can be reduced, resulting in a higher aperture ratio.

The partition X extending in the X direction includes a region having the height X1 (FIG. 15D). In addition, the partition Y extending in the Y direction includes a region having the height Y1 (FIG. 13B). The height of the partition refers to the distance between the top surface of the substrate 101 to a top surface of the partition. The height X1 and the height Y1 may be different from each other. For example, the height X1 can be lower than the height Y1. Lowering the height X1 facilitates formation of the continuous EL layer 112R over the partition X. That is, the EL layer 112R easily extends in a band shape. Note that the height X1 can be lower than the height Y1.

In order to change the height of the partition, the number of layers of the partition (the insulating layer 134 and the insulating layer 131) in a low height region can be smaller than that in a high height region, for example. Moreover, it is also effective to set the thickness of the insulating layer in a low height region smaller than that in a high height region. Note that in the case where the EL layer 112R does not extend in a band shape as in FIG. 13C, for example, the means for adjusting the height of the partition can be employed. Note that a plurality of regions of the partition X can have different heights. For example, the heights of the partitions X in the end portion of the pixel electrode 111R, the end portion of the pixel electrode 111G, and the end portion of the pixel electrode 111B may be varied. Similarly, a plurality of regions of the partitions Y may have different heights.

[Structure Example 12 of Display Device]

Figure 16A:
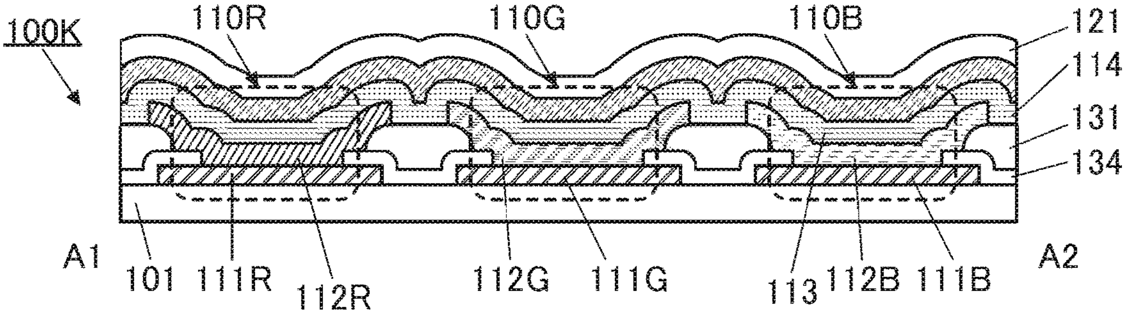
FIG. 16A to FIG. 16C are diagrams illustrating structure examples of a display device.

FIG. 16A is a schematic cross-sectional view of the display device 100K (corresponding to the cross-section in the X direction in FIG. 13A). The display device 100K is different from the display device 100 (FIG. 13) in including the EL layer 114 that is a common layer and including the protective layer 121.

The EL layer 114 is provided in contact with the top surfaces of the EL layer 112R, the EL layer 112G, and the EL layer 112B. As the EL layer 114, an electron-transport layer or an electron-injection layer can be used. Alternatively, as the EL layer 114, a hole-injection layer or a hole-transport layer can be used. When an electron-injection layer is used as the EL layer 114, for example, the electron-injection layer can be formed in the same step in the light-emitting element 110R, the light-emitting element 110G, and the light-emitting element 110B.

The protective layer 121 is positioned over the common electrode 113 and is provided over the light-emitting element 110R, the light-emitting element 110G, and the light-emitting element 110B. Note that a color filter, an electrode of a touch sensor, or a lens array may include a region overlapping with the end portion of the partition (e.g., the insulating layer 134 or the insulating layer 131) disclosed in this specification. Without limitation to this, the color filter, the electrode of the touch sensor, or the lens array does not necessarily include the overlapping region.

A layer (also referred to as a cap layer or as a protective layer) may be provided between the common electrode 113 and the protective layer 121. The cap layer has a function of preventing light emitted from the light-emitting elements from being totally reflected by light. The cap layer is preferably formed using a material having a higher refractive index than the common electrode 113. The cap layer can be formed using an organic substance or inorganic organic substance. The thickness of the cap layer is preferably larger than that of the common electrode 113. The cap layer may have a function of preventing diffusion of impurities such as water from the above into each of the light-emitting elements.

Note that in each of the structure examples, a structure in the vicinity of one end portion of the pixel electrode 111R and the like and a structure in the vicinity of the other of the end portion thereof may be different from each other. For example, as in FIG. 16B, a partition in the region 117R including one end portion of the pixel electrode 111R may have a larger overlap with the pixel electrode 111R than a partition in the region 118R including the other end portion thereof.

Figure 16B:
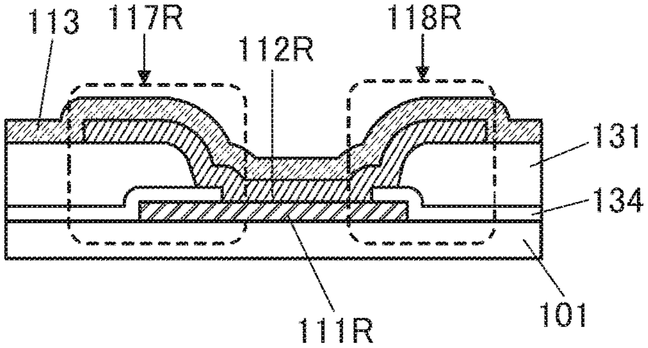
Figure 16C:
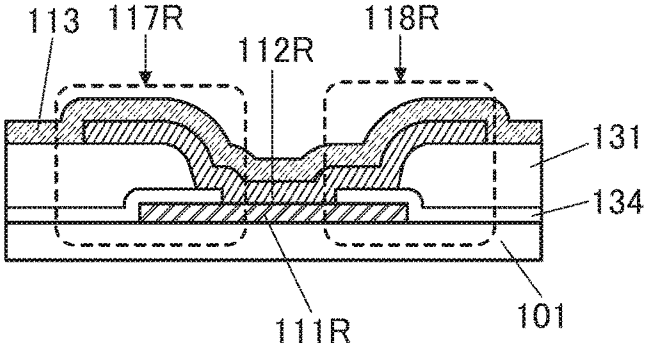

As in FIG. 16C, the end portion of the insulating layer 134 includes a portion protruding beyond the insulating layer 131 (also referred to as a protruding portion). A protruding portion in the region 117R may have a smaller overlap with the pixel electrode 111R than a protruding portion in the region 118R.

Note that the insulating layer 134 covers the insulating layer 131 over the pixel electrode 111R in some cases (FIG. 24A, FIG. 24B, or the like described later). Even in such a case, when the insulating layers 134 or the insulating layers 131 in the region 117R and the region 118R are formed with different sizes, the partition structures can be formed with different structures.

At least part of the structure examples, the manufacturing method examples, the drawings corresponding thereto, and the like described in this embodiment can be combined with the other structure examples, the other manufacturing method examples, the other drawings, and the like as appropriate. The terms or expressions used for describing the structure or manufacturing method in this specification can be appropriately used for defining another structure or manufacturing method.

At least part of this embodiment can be implemented in combination with the other embodiments described in this specification as appropriate.

Embodiment 7

One embodiment of a manufacturing method of the display device of the present invention is described below.

In one embodiment of the manufacturing method of the display device of the present invention described below, fine patterning of an EL layer can be performed without a shadow mask such as a metal mask. Thus, a display device that has high resolution and a high aperture ratio can be achieved as compared to the case of using a shadow mask. Moreover, the EL layers can be formed separately, enabling the display device to perform extremely clear display with high contrast and high display quality. The embodiment of the manufacturing method is described in detail below with reference to drawings.

[Manufacturing Method Example 3 of Display Device]

Figure 17A:
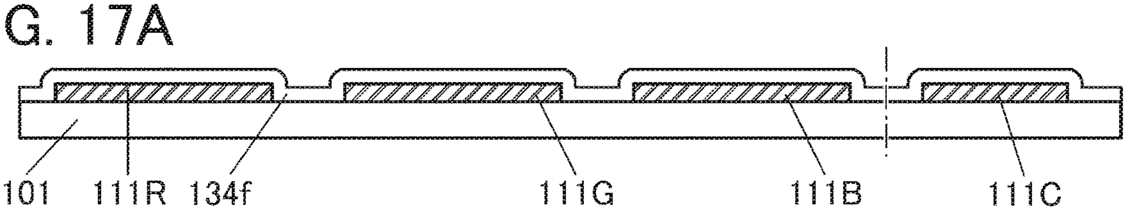
FIG. 17A to FIG. 17F are diagrams illustrating a manufacturing method example of a display device.

Description here is made using the display device 100K described in Structure example 12 as an example. FIG. 17A to FIG. 20C are schematic cross-sectional views in steps of the manufacturing method of the display device described below as an example. In FIG. 17A and the like, schematic cross-sectional views of the connection portion 130 and the vicinity thereof are also illustrated on the right side.

[Preparation for Substrate 101]

As the substrate 101, a substrate having at least heat resistance high enough to withstand the following heat treatment can be used (FIG. 17A). For example, a substrate over which the insulating layer 162 functioning as a planarization film is formed as illustrated in FIG. 14B or FIG. 14C is preferably used as the substrate 101.

[Formation of Pixel Electrodes 111R, 111G, and 111B and Connection Electrode 111C]

Next, the pixel electrode 111R, the pixel electrode 111G, the pixel electrode 111B, and the connection electrode 111C are formed over the substrate 101 (FIG. 17A). First, a conductive film to be a pixel electrode is deposited, a resist mask is formed by a photolithography method, and an unnecessary portion of the conductive film is removed by etching. After that, the resist mask is removed to form the pixel electrode 111R, the pixel electrode 111G, and the pixel electrode 111B.

[Formation of Insulating Film **134*f***]

Next, the insulating film **134*f* is formed to cover the pixel electrode 111R, the pixel electrode 111G, the pixel electrode 111B, and the connection electrode 111C (FIG. 17A). The insulating film 134*f* becomes the insulating layer 134** later.

The insulating film **134*f*** can be formed by a deposition method such as an ALD method, a sputtering method, a CVD method, a PLD method, or an evaporation method or a combination thereof.

[Formation of Insulating Layer 131]

Next, the insulating film **131*f* is deposited to cover the insulating film 134*f*. As the insulating film 131*f***, a film containing a photosensitive organic resin can be used.

The insulating film **131*f*** can be formed by a wet deposition method such as a spin coating method or an inkjet method. After the deposition, heat treatment may be performed to volatilize the solvent in the material or cure the material.

Figure 17B:
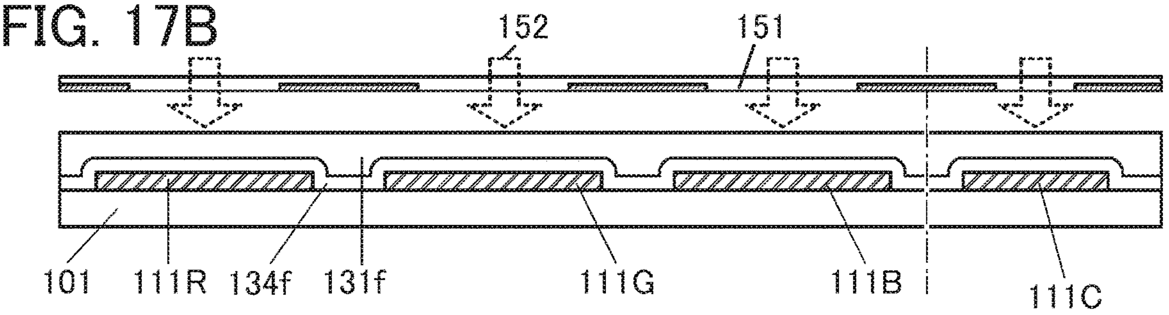

After the deposition of the insulating film **131*f*, the light 152 is irradiated with the use of the photomask 151 (FIG. 17B). Here, an example is described in which what is called a positive photosensitive material, whose solubility in a developer is improved by light exposure, is used for the insulating film 131*f***.

Figure 17C:
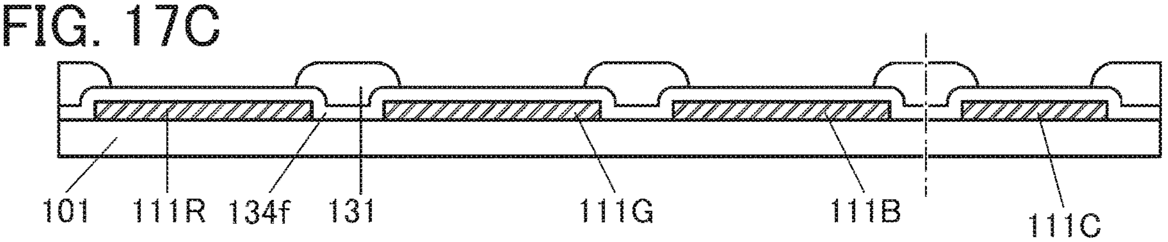

Then, development treatment is performed to form the insulating layer 131 (FIG. 17C).

In this case, the insulating layer 131 is preferably formed to have a pattern width smaller than the pattern width of a mask pattern of the photomask 151 by adjusting a light exposure time and an intensity of light exposure in light exposure treatment. For example, light exposure is performed under conditions where the amount of light exposure is larger than the proper value.

[Formation of Insulating Layer 134]

Figure 17D:
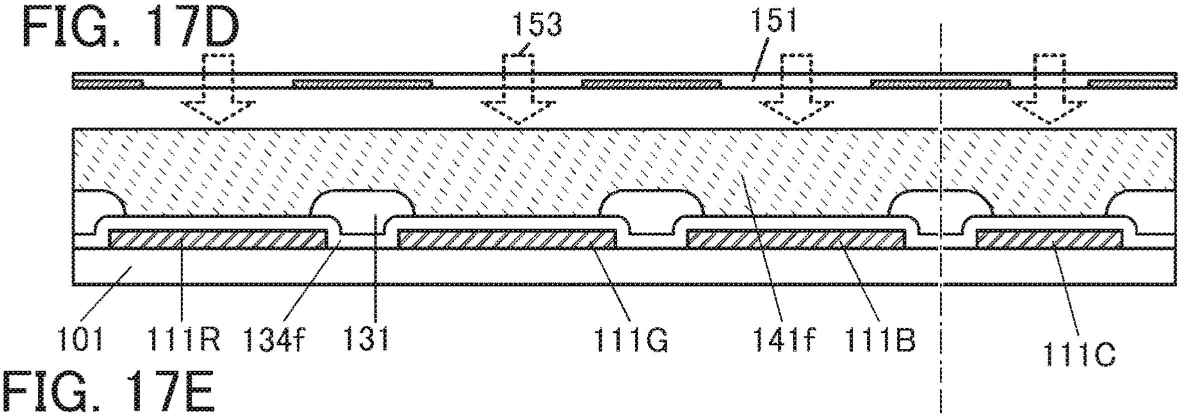

Next, the resist film 141*f* is deposited over the insulating film 134*f* and the insulating layer 131 (FIG. 17D).

For the resist film 141*f*, a resist material containing a photosensitive resin such as a positive type resist material or a negative type resist material can be used.

Next, the resist film 141*f* is irradiated with the light 153 with the use of the photomask 151 (FIG. 17D).

Figure 17E:
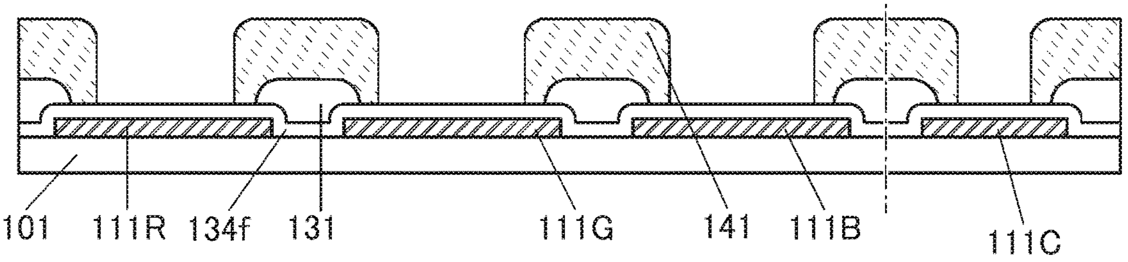

Next, the resist mask film 141*f* is subjected to development treatment to form the resist mask 141 (FIG. 17E).

Here, the photomask used in the formation of the insulating layer 131 can be the same as the photomask used in the formation of the resist mask 141. Note that exactly the same photomask is not necessarily used; a photomask manufactured for forming the same pattern can be used. Since the photomask 151 can be commonly used in the formation of the insulating layer 131 and in the formation of the resist mask 141, the manufacturing cost can be reduced.

Note that the photomask used for forming the insulating layer 131 may be different from the photomask used for forming the resist mask 141.

As illustrated in FIG. 17E, the resist mask 141 is preferably formed to cover the insulating layer 131.

Figure 17F:
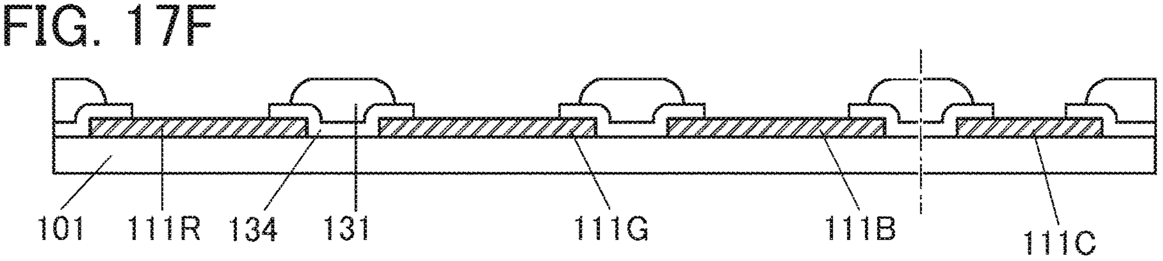

Next, a portion of the insulating film 134*f* that is not covered with the resist mask 141 is etched. After that, the resist mask 141 is removed. In this manner, the insulating layer 134 are formed (FIG. 17F). The end portion of the insulating layer 134 includes a portion protruding beyond the end portion of the insulating layer 131 over the pixel electrode 111R. Note that by changing the light exposure conditions, the etching conditions, or the like described above as appropriate, the structures of the partition (the insulating layer 134 and the insulating layer 131) disclosed in this specification can be formed.

When the insulating layer 131 and the insulating layer 134 are formed using different photomasks, a variety of structures can be formed. For example, one end portion of the insulating layer 134 may protrude beyond the insulating layer 131 (e.g., FIG. 17F), and the other end portion of the insulating layer 134 may be covered with the insulating layer 131 (e.g., FIG. 22F).

[Formation of EL Film 112Rf]

Figure 18A:
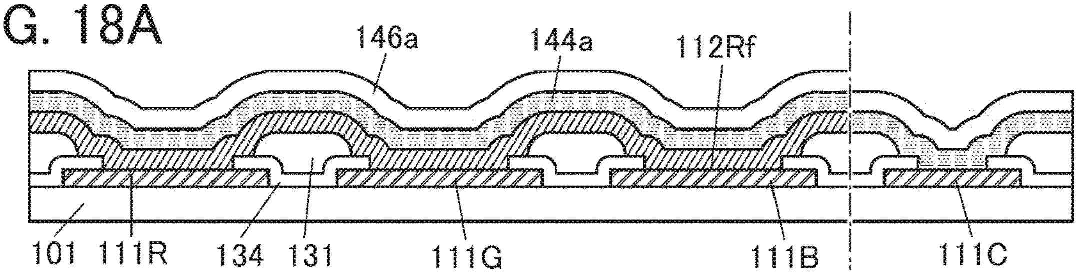
FIG. 18A to FIG. 18F are diagrams illustrating a manufacturing method example of a display device.

Next, the EL film 112Rf is deposited over the pixel electrode 111R, the pixel electrode 111G, the pixel electrode 111B, and the partition (over the insulating layer 134 and the insulating layer 131) (FIG. 18A). The EL film 112Rf becomes the EL layer 112R later.

The EL film 112Rf is preferably formed so as not to be provided over the connection electrode 111C. For example, in the case where the EL film 112Rf is formed by an evaporation method or a sputtering method, it is preferable that the EL film 112Rf be formed using a shielding mask so as not to be deposited over the connection electrode 111C.

[Formation of Sacrificial Film 144*a*]

Next, the sacrificial film 144*a* is formed to cover the EL film 112Rf (FIG. 18A). The sacrificial film 144*a* is provided in contact with the top surface of the connection electrode 111C.

As the sacrificial film 144*a*, it is possible to use a film highly resistant to etching treatment performed on the EL films such as the EL film 112Rf, i.e., a film having high etching selectivity with respect to the EL films. Furthermore, as the sacrificial film 144*a*, it is possible to use a film having high etching selectivity with respect to a sacrificial film such as the sacrificial film 146*a* described later. Moreover, as the sacrificial film 144*a*, it is particularly preferable to use a film that can be removed by a wet etching method that is less likely to cause damage to the EL films.

[Formation of Sacrificial Film 146*a*]

Next, the sacrificial film 146*a* is formed over the sacrificial film 144*a* (FIG. 18A).

The sacrificial film 146*a* is a film used for a hard mask when the sacrificial film 144*a* is etched later. In a later step of processing the sacrificial film 146*a*, the sacrificial film 144*a* is exposed. Thus, the combination of films having high etching selectivity therebetween is selected for the sacrificial film 144*a* and the sacrificial film 146*a*. It is thus possible to select a film that can be used for the sacrificial film 146*a* depending on an etching condition of the sacrificial film 144*a* and an etching condition of the sacrificial film 146*a*.

For example, in the case where dry etching using a gas containing fluorine (also referred to as a fluorine-based gas) is used for the etching of the sacrificial film 146*a*, silicon, silicon nitride, silicon oxide, tungsten, titanium, molybdenum, tantalum, tantalum nitride, an alloy containing molybdenum and niobium, an alloy containing molybdenum and tungsten, or the like can be used for the sacrificial film 146*a*. Here, a metal oxide film using IGZO, ITO, or the like is given as a film having high etching selectivity (that is, enabling low etching rate) in dry etching using the fluorine-based gas, and such a film can be used as the sacrificial film 144*a*.

Without being limited to the above, a material of the sacrificial film 146*a* can be selected from a variety of materials depending on an etching condition of the sacrificial film 144*a* and an etching condition of the sacrificial film 146*a*. For example, any of the films that can be used for the sacrificial film 144*a* can also be used.

Alternatively, as the sacrificial film 146*a*, an organic film that can be used as the EL film 112Rf or the like may be used. For example, the organic film that is used for the EL film 112Rf, the EL film 112Gf, or the EL film 112Bf can be used for the sacrificial film 146*a*. The use of such an organic film is preferable, in which case the deposition apparatus for the EL film 112Rf or the like can be used in common. In addition, when the EL film 112Rf or the like is etched using a layer to be a sacrificial layer as a mask, the organic film can be removed at the same time, so that the process can be simplified.

[Formation of Resist Mask 143*a*]

Figure 18B:
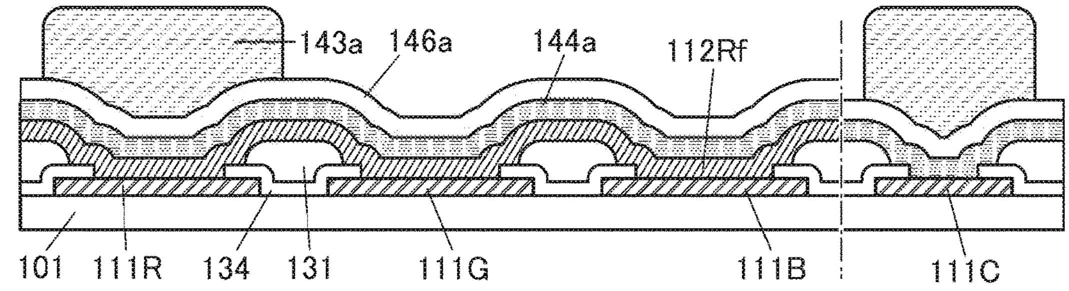

Then, over the sacrificial film 146*a*, the resist mask 143*a* is formed in each of a position overlapping with the pixel electrode 111R and a position overlapping with the connection electrode 111C (FIG. 18B).

For the resist mask 143*a*, a resist material containing a photosensitive resin such as a positive type resist material or a negative type resist material can be used.

Here, in the case where the resist mask 143*a* is formed over the sacrificial film 144*a* without using the sacrificial film 146*a*, there is a risk of dissolving the EL film 112Rf due to a solvent of the resist material if a defect such as a pinhole exists in the sacrificial film 144*a*. Such a defect can be prevented by using the sacrificial film 146*a*.

Note that in the case where a film in which a defect such as a pinhole is unlikely to be generated is used as the sacrificial film 144*a* or a material that is not dissolved in a solvent of the resist material is used for the EL film 112Rf, the resist mask 143*a* may be formed directly over the sacrificial film 144*a* without using the sacrificial film 146*a* in some cases.

[Etching of Sacrificial Film 146*a*]

Figure 18C:
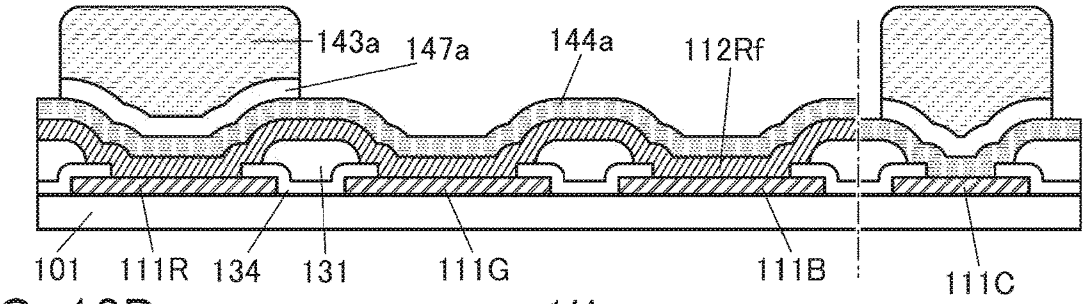

Next, part of the sacrificial film 146*a* that is not covered with the resist mask 143*a* is removed by etching, so that the band-shaped sacrificial layer 147*a* is formed (FIG. 18C). At the same time, the sacrificial layer 147*a* is formed also over the connection electrode 111C.

In the etching of the sacrificial film 146*a*, an etching condition with high selectivity is preferably employed so that the sacrificial film 144*a* is not removed by the etching. Either wet etching or dry etching can be performed for the etching of the sacrificial film 146*a*; with the use of dry etching, a shrinkage of the pattern of the sacrificial film 146*a* can be inhibited.

[Removal of Resist Mask 143*a*]

Figure 18D:
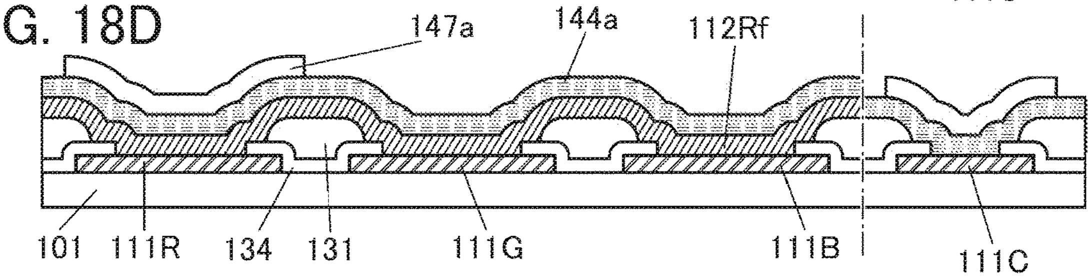

Next, the resist mask 143*a* is removed (FIG. 18D).

The removal of the resist mask 143*a* can be performed by wet etching or dry etching. It is particularly preferable to perform dry etching (also referred to as plasma ashing) using an oxygen gas as an etching gas to remove the resist mask 143*a*.

At this time, the removal of the resist mask 143*a* is performed in a state where the EL film 112Rf is covered with the sacrificial film 144*a*; thus, the influence on the EL film 112Rf is inhibited. In particular, when the EL film 112Rf is exposed to oxygen, the electrical characteristics are adversely affected in some cases; thus, it is suitable in the case where etching using an oxygen gas, such as plasma ashing, is performed.

[Etching of Sacrificial Film 144*a*]

Figure 18E:
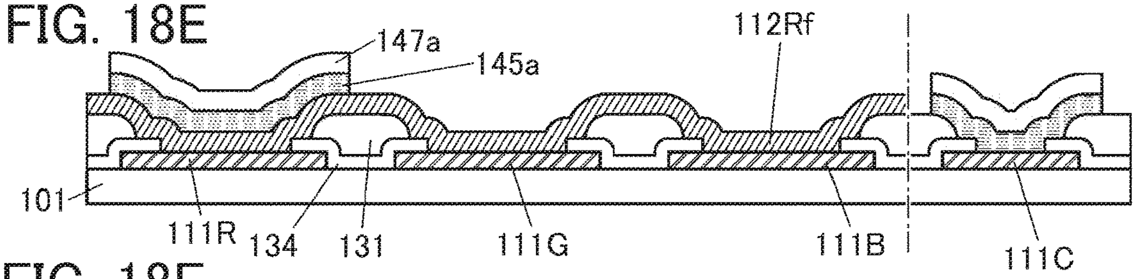

Next, part of the sacrificial film 144*a* that is not covered with the sacrificial layer 147*a* is removed by etching using the sacrificial layer 147*a* as a mask, so that the island-shaped or band-shaped sacrificial layer 145*a* is formed (FIG. 18E). At the same time, the sacrificial layer 145*a* is formed also over the connection electrode 111C.

Either wet etching or dry etching can be performed for the etching of the sacrificial film 144*a*; the use of dry etching is preferable, in which case a shrinkage of the pattern can be inhibited.

[Etching of EL Film 112Rf]

Figure 18F:
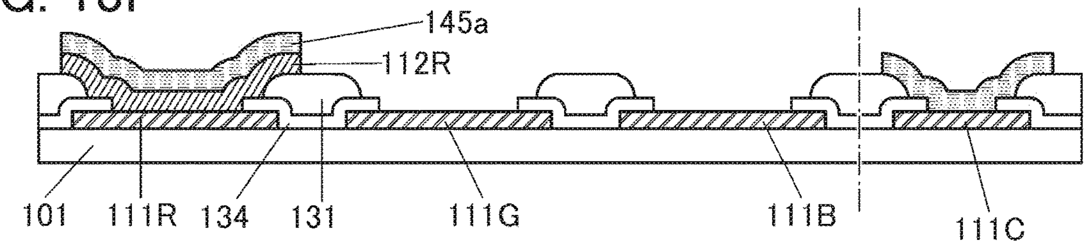

Next, part of the EL film 112Rf that is not covered with the sacrificial layer 145*a* is removed by etching, so that the island-shaped or band-shaped EL layer 112R is formed (FIG. 18F). By the etching of the EL film 112Rf, the top surfaces of the pixel electrode 111G, the pixel electrode 111B, and the insulating layer 131 are exposed.

Specifically, for the etching of the EL film 112Rf, it is preferable to perform dry etching using an etching gas that does not contain oxygen as its main component. This can inhibit the alteration of the EL film 112Rf to achieve a highly reliable display device. Examples of the etching gas that does not contain oxygen as its main component include $CF_4$, $C_4F_8$, $SF_6$, $CHF_3$, $Cl_2$, $H_2O$, $BCl_3$, $H_2$, and a noble gas such as He. Alternatively, a mixed gas of the above gas and a dilute gas that does not contain oxygen can be used as the etching gas.

Note that etching of the EL film 112Rf is not limited to the above and may be performed by dry etching using another gas or wet etching.

In addition, when dry etching using an oxygen gas or an etching gas containing an oxygen gas is used for the etching of the EL film 112Rf, the etching rate can be increased. Thus, etching under a low-power condition can be performed while the etching rate is kept adequately high; hence, damage due to the etching can be reduced. Furthermore, a defect such as attachment of a reaction product generated at the etching can be inhibited. For example, an etching gas obtained by adding an oxygen gas to the etching gas not containing oxygen as its main component can be used.

The insulating layer 131 is exposed when the EL film 112Rf is etched. At the time of etching the EL film 112Rf, an upper portion of the insulating layer 131 is etched and a portion not covered with the EL layer 112R is thinned in some cases. Part of the insulating layer 131 is removed in some cases. Even if part of the insulating layer 131 is removed, the insulating layer 134 below the insulating layer 131 becomes an etching stopper, so that the pixel electrode (excluding a display region) can be prevented from being exposed and removed.

The sacrificial layer 147*a* can be etched at the same time of etching the EL film 112Rf (FIG. 18F). The EL film 112Rf and the sacrificial layer 147*a* are preferably etched by the same treatment, in which case the process can be simplified and the manufacturing cost of the display device can be reduced. Note that the sacrificial layer 147*a* may be left without being etched. The EL film 112Rf can be protected when the sacrificial layer 147*a* is left. In that case, the sacrificial layer 147*a* may be etched during an etching of the sacrificial layer 145 in a later step.

[Formation of EL Film 112Gf]

Figure 19A:
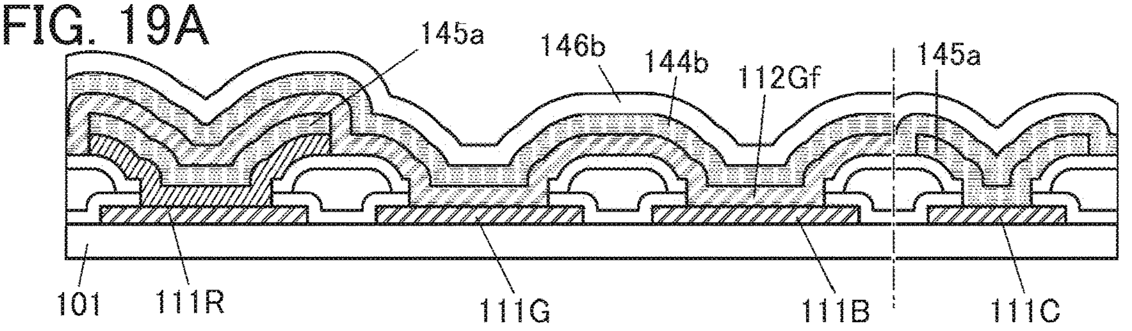
FIG. 19A to FIG. 19E are diagrams illustrating a manufacturing method example of a display device.

Subsequently, the EL film 112Gf to be the EL layer 112G later is deposited over the insulating layer 131, the pixel electrode 111G, and the pixel electrode 111B (FIG. 19A). In that case, similarly to the EL film 112Rf, the EL film 112Gf is preferably not provided over the connection electrode 111C.

The above description of the EL film 112Rf can be referred to for the formation method of the EL film 112Gf.

[Formation of Sacrificial Film 144*b*]

Subsequently, the sacrificial film 144*b* is formed over the EL film 112Gf (FIG. 19A). The sacrificial film 144*b* can be formed in a manner similar to that for the sacrificial film 144*a*. In particular, the sacrificial film 144*b* and the sacrificial film 144*a* are preferably formed using the same material.

At the same time, the sacrificial film 144*b* is formed over the connection electrode 111C to cover the sacrificial layer 145*a*.

[Formation of Sacrificial Film 146*b*]

Next, the sacrificial film 146*b* is formed over the sacrificial film 144*b* (FIG. 19A). The sacrificial film 146*b* can be formed in a manner similar to that for the sacrificial film 146*a*. In particular, the sacrificial film 146*b* and the sacrificial film 146*a* are preferably formed using the same material.

[Formation of Resist Mask 143*b*]

Figure 19B:
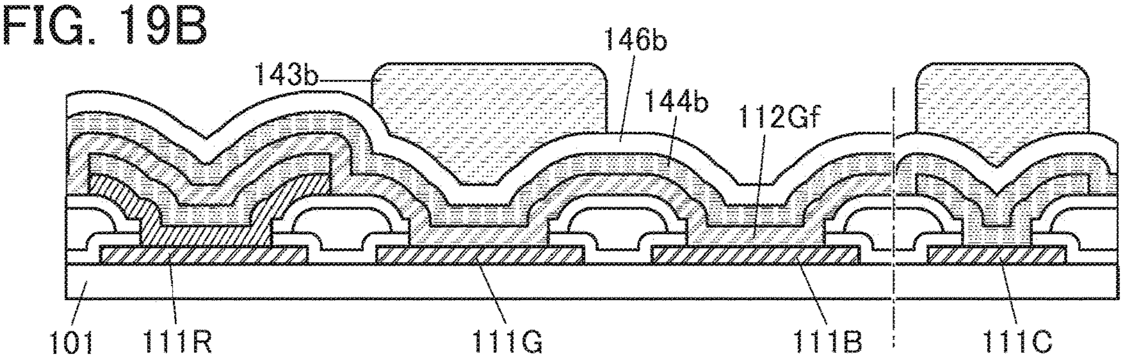

Next, the resist mask 143*b* is formed in a region that is over the sacrificial film 146*b* and overlaps with the pixel electrode 111G (FIG. 19B).

The resist mask 143*b* can be formed in a manner similar to that for the resist mask 143*a*.

Here, the connection electrode 111C is protected by the sacrificial layer 145*a*; thus, the resist mask 143*b* is not necessarily formed. Note that the resist mask 143*b* may be provided to cover the connection electrode 111C.

The resist mask 143*b* can be formed in a manner similar to that for the resist mask 143*a*.

[Etching of Sacrificial Film 146*b*]

Figure 19C:
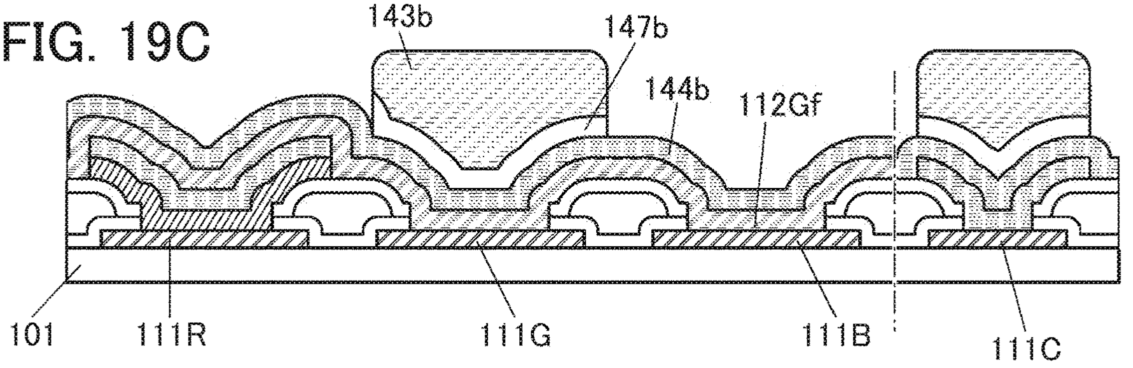

Next, part of the sacrificial film 146*b* that is not covered with the resist mask 143*b* is removed by etching, so that the island-shaped or band-shaped sacrificial layer 147*b* is formed (FIG. 19C). At that time, part of the sacrificial film

146*b* over the connection electrode 111C, which is not covered with the resist mask 143*b*, is also removed by etching.

The above description of the sacrificial film 146*a* can be referred to for the etching of the sacrificial film 146*b*.

[Removal of Resist Mask 143*b*]

Next, the resist mask 143*b* is removed. The above description of the resist mask 143*a* can be referred to for the removal of the resist mask 143*b*.

[Etching of Sacrificial Film 144*b*]

Figure 19D:
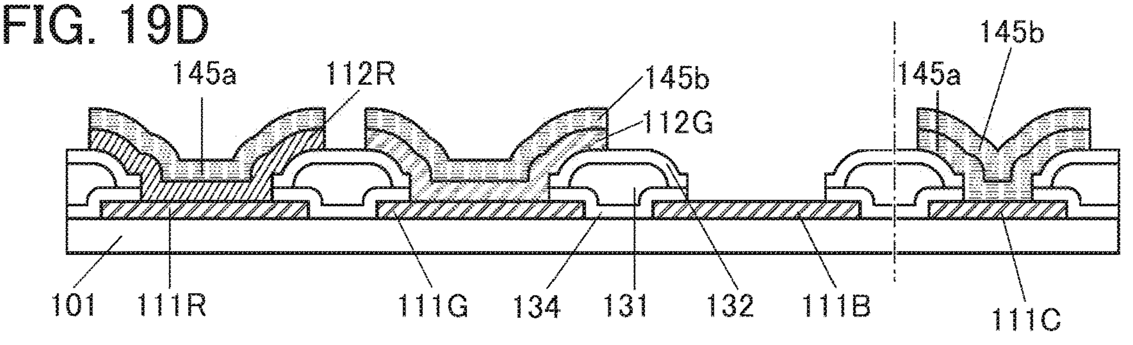

Next, part of the sacrificial film 144*b* that is not covered with the sacrificial layer 147*b* is removed by etching using the sacrificial layer 147*b* as a mask, so that the island-shaped or band-shaped sacrificial layer 145*b* is formed (FIG. 19D). At that time, part of the sacrificial film 144*b* over the connection electrode 111C, which is not covered with the sacrificial layer 147*b*, is also removed by etching.

The above description of the sacrificial film 144*a* can be referred to for the etching of the sacrificial film 144*b*.

[Etching of EL Film 112Gf]

Next, part of the EL film 112Gf that is not covered with the sacrificial layer 145*b* is removed by etching, so that the island-shaped or band-shaped EL layer 112G is formed (FIG. 19D).

The above description of the EL film 112Rf can be referred to for the etching of the EL film 112Gf. In that case, with the insulating layer 134 and the insulating layer 131, an effect similar to that in forming the EL layer 112R is attained.

The EL layer 112R and the connection electrode 111C are protected by the sacrificial layer 145*a* and thus can be prevented from being damaged in the etching step of the EL film 112Gf.

In this manner, the island-shaped or band-shaped EL layer 112R and the island-shaped or band-shaped EL layer 112G can be separately formed with high alignment accuracy.

[Formation of EL Layer 112B]

Figure 19E:
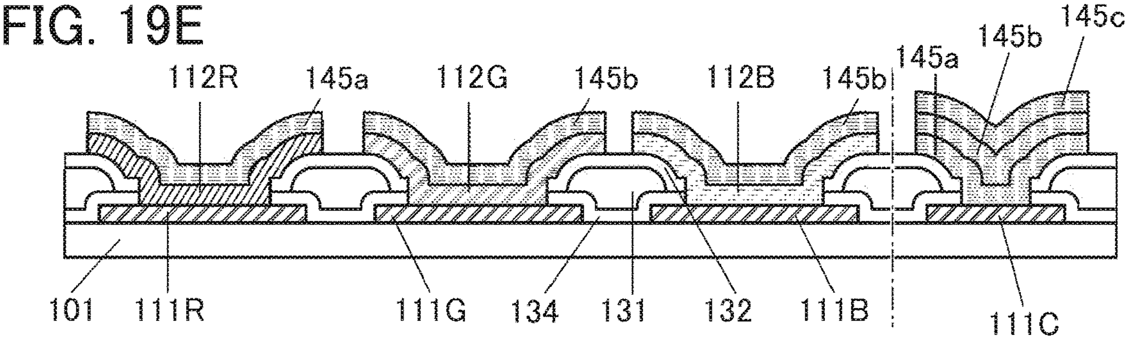

The above steps are performed on the EL film 112Bf (not illustrated), whereby the island-shaped or band-shaped EL layer 112B and the island-shaped or band-shaped sacrificial layer 145*c* can be formed (FIG. 19E).

That is, after the EL layer 112G is formed, the EL film 112Bf, the sacrificial film 144*c*, the sacrificial film 146*c*, and the resist mask 143*c* (each of which is not illustrated) are sequentially formed. Next, the sacrificial film 146*c* is etched to form the sacrificial layer 147*c* (not illustrated); then, the resist mask 143*c* is removed. Subsequently, the sacrificial film 144*c* is etched to form the sacrificial layer 145*c*. After that, the EL film 112Bf is etched to form the island-shaped or band-shaped EL layer 112B. In that case, with the insulating layer 134 and the insulating layer 131, an effect similar to that in forming the EL layer 112R is attained.

[Removal of Sacrificial Layer]

Figure 20A:
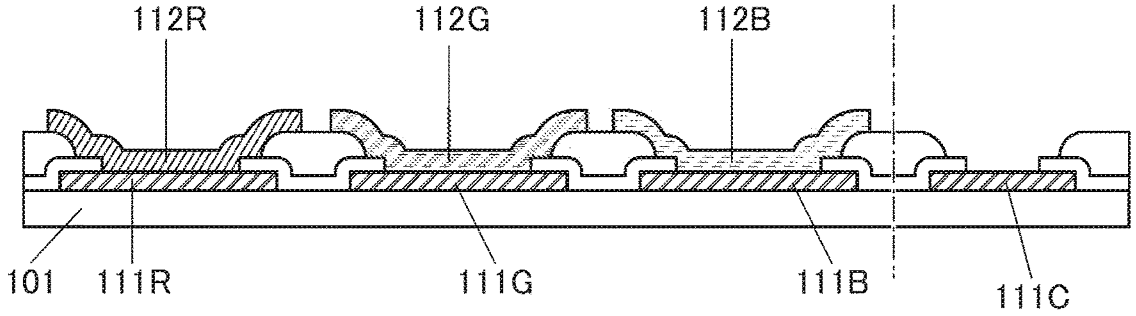
FIG. 20A to FIG. 20C are diagrams illustrating a manufacturing method example of a display device.

Next, the sacrificial layer 145*a*, the sacrificial layer 145*b*, and the sacrificial layer 145*c* are removed to expose the top surfaces of the EL layer 112R, the EL layer 112G, and the EL layer 112B (FIG. 20A). At the same time, the top surface of the connection electrode 111C is also exposed.

Etching of the sacrificial layer 145*a*, the sacrificial layer 145*b*, and the sacrificial layer 145*c* (hereinafter, collectively referred to as the sacrificial layer 145) is preferably performed in the same step.

The sacrificial layer 145 and the sacrificial layer 147 can be removed by wet etching or dry etching. In that case, a method that causes damage to the EL layer 112R, the EL layer 112G, and the EL layer 112B as little as possible is preferably employed. Specifically, a wet etching method is preferably used. For example, wet etching using a tetramethyl ammonium hydroxide (TMAH) aqueous solution, diluted hydrofluoric acid, oxalic acid, phosphoric acid, acetic acid, nitric acid, or a mixed solution thereof is preferably performed.

Alternatively, one or both of the sacrificial layer 145 and the sacrificial layer 147 are preferably removed by being dissolved in a solvent such as water or alcohol. Here, examples of the alcohol in which the sacrificial layer 145 and the sacrificial layer 147 can be dissolved include a variety of alcohol such as ethyl alcohol, methyl alcohol, isopropyl alcohol (IPA), and glycerin.

After the sacrificial layer 145 and the sacrificial layer 147 are removed, drying treatment is preferably performed to remove water contained in the EL layer 112R, the EL layer 112G, and the EL layer 112B and water adsorbed on the surfaces thereof. For example, heat treatment is preferably performed in an inert gas atmosphere or a reduced-pressure atmosphere. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 120° C. The heat treatment is preferably performed in a reduced-pressure atmosphere, in which case drying at a lower temperature is possible.

In this manner, the EL layer 112R, the EL layer 112G, and the EL layer 112B can be formed separately. Furthermore, by repeating the above-described steps, EL layers in light-emitting elements of four or more colors can be separately formed, so that a display device including light-emitting elements of four or more colors can be achieved. Note that some of the above steps can be employed also when a single light-emitting element is formed or when light-emitting elements of two or more colors are formed separately.

[Formation of EL Layer 114]

Figure 20B:
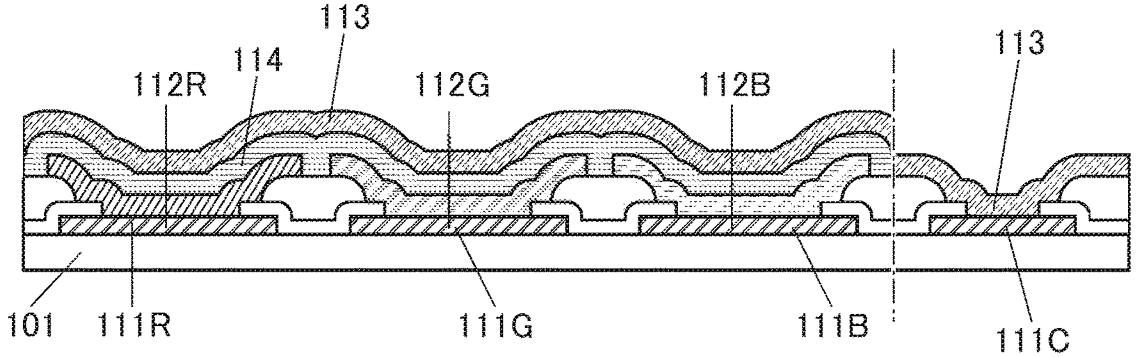

Next, the EL layer 114 is deposited to cover the EL layer 112R, the EL layer 112G, and the EL layer 112B (FIG. 20B).

The EL layer 114 can be deposited in a manner similar to that of the EL film 112Rf or the like. In the case where the EL layer 114 is deposited by an evaporation method, the EL layer 114 is preferably deposited using a shielding mask so as not to be deposited over the connection electrode 111C.

[Formation of Common Electrode 113]

Then, the common electrode 113 is formed to cover the EL layer 114 and the connection electrode 111C (FIG. 20B).

The common electrode 113 can be formed by a deposition method such as an evaporation method or a sputtering method. Alternatively, a film formed by an evaporation method and a film formed by a sputtering method may be stacked. In that case, the common electrode 113 is preferably formed so as to cover a region where the EL layer 114 is formed. That is, a structure in which the end portion of the EL layer 114 overlaps with the common electrode 113 can be obtained. The common electrode 113 is preferably formed using a shielding mask.

The common electrode 113 is electrically connected to the connection electrode 111C outside a display region.

[Formation of Protective Layer 121]

Figure 20C:
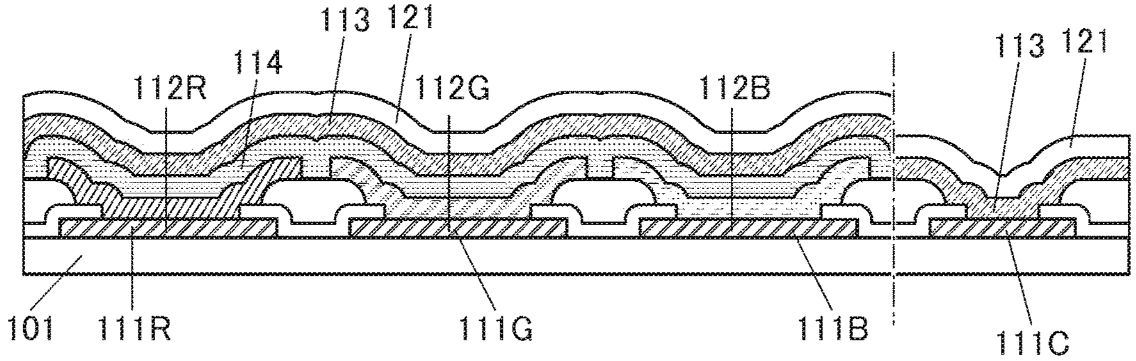

Next, the protective layer 121 is formed over the common electrode 113 (FIG. 20C). An inorganic insulating film used for the protective layer 121 is preferably deposited by a sputtering method, a PECVD method, or an ALD method. In particular, an ALD method is preferable because it provides excellent step coverage and is less likely to cause a defect such as a pinhole. An organic insulating film is preferably deposited by an inkjet method because a uniform film can be formed in a desired area.

Note that thin films included in the display device (e.g., insulating films, semiconductor films, and conductive films) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD: Plasma Enhanced CVD) method and a thermal CVD method. An example of the thermal CVD method is a metal organic chemical vapor deposition (MOCVD: Metal Organic CVD) method.

Alternatively, thin films included in the display device (e.g., insulating films, semiconductor films, and conductive films) can be formed by a method such as spin coating, dipping, spray coating, ink-jetting, dispensing, screen printing, offset printing, a doctor knife method, a slit coating, a roll coating, a curtain coating, or a knife coating.

When the thin films included in the display device are processed, a photolithography method or the like can be used. Besides, a nanoimprinting method, a sandblasting method, a lift-off method, or the like may be used for the processing of the thin films. Island-shaped thin films may be directly formed by a deposition method using a shielding mask such as a metal mask.

There are the following two typical methods of a photolithography method. In one of the methods, a resist mask is formed over a thin film that is to be processed, the thin film is processed by etching or the like, and then the resist mask is removed. In the other method, a photosensitive thin film is deposited and then processed into a desired shape by light exposure and development.

As the light used for light exposure in the photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Light exposure may be performed by liquid immersion exposure technique. As the light used for the light exposure, extreme ultraviolet (EUV) light, X-rays, or the like may be used. Furthermore, instead of the light used for the light exposure, an electron beam can also be used. It is preferable to use extreme ultraviolet light, X-rays, or an electron beam because extremely minute processing can be performed. Note that in the case of performing light exposure by scanning of a beam such as an electron beam, a photomask is not needed.

For etching of the thin film, a dry etching method, a wet etching method, a sandblasting method, or the like can be used.

Through the above steps, the display device 100K illustrated in FIG. 16A can be manufactured.

[Manufacturing Method Example 4 of Display Device]

Although the case where the common electrode 113 and the EL layer 114 are formed so as to have different top surface shapes is described above, they may be formed in the same region.

Figure 21A:
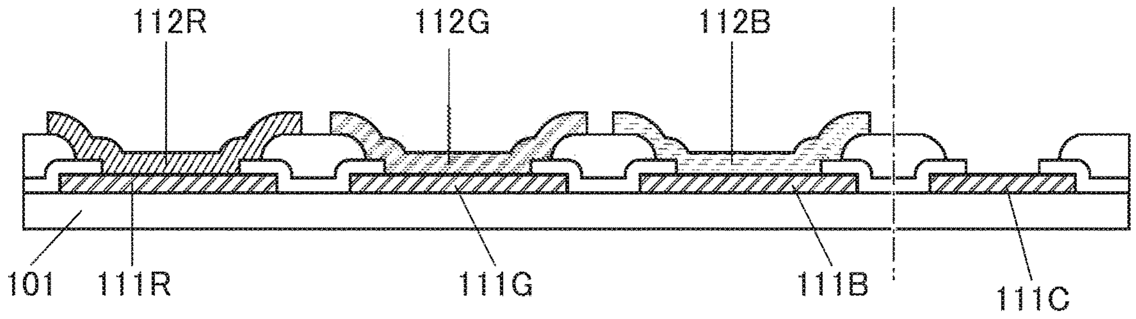
FIG. 21A to FIG. 21C are diagrams illustrating a manufacturing method example of a display device.
Figure 21B:
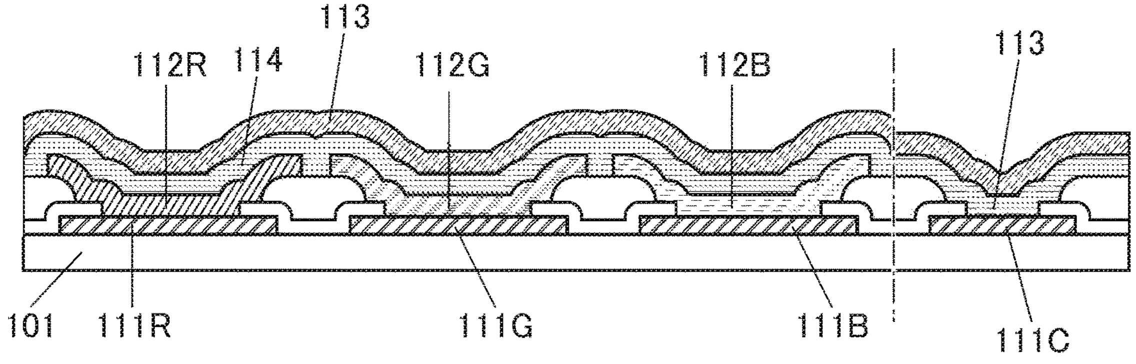

FIG. 21A is a schematic cross-sectional view after removal of the sacrificial layer in the above description. Next, as illustrated in FIG. 21B, the EL layer 114 and the common electrode 113 are formed using the same shielding mask or without using a shielding mask. Thus, manufacturing cost can be reduced as compared to the case where different shielding masks are used.

In this case, as illustrated in FIG. 21B, the connection portion 130 has a structure in which the EL layer 114 is sandwiched between the connection electrode 111C and the common electrode 113. In this case, for the EL layer 114, a material with as low electric resistance as possible is preferably used. Alternatively, it is preferable to form the EL layer 114 as thin as possible, in which case the electric resistance of the EL layer 114 in the thickness direction is reduced. For example, when a material which has an electron-injection property or a hole-injection property and whose thickness is larger than or equal to 1 nm and smaller than or equal to nm, preferably larger than or equal to 1 nm and smaller than or equal to 3 nm is used for the EL layer 114, the electric resistance between the connection electrode 111C and the common electrode 113 can be made small enough to be negligible in some cases.

Figure 21C:
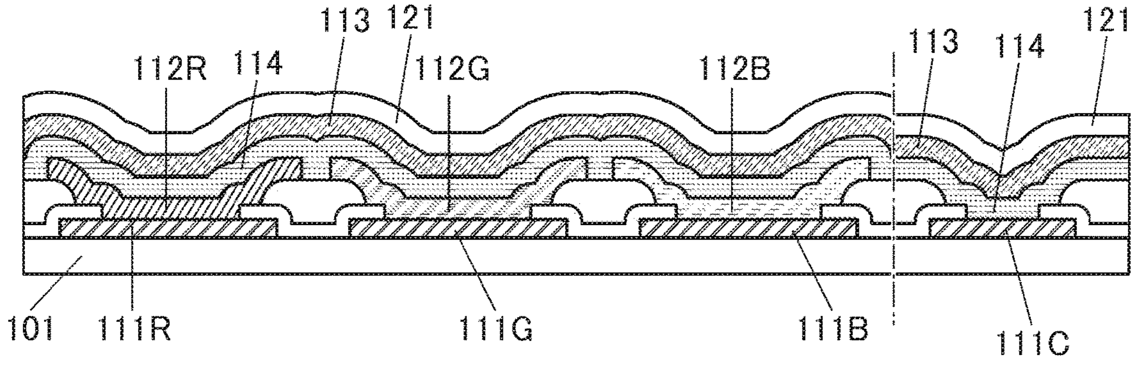

Subsequently, the protective layer 121 is formed as illustrated in FIG. 21C. In this case, the protective layer 121 is preferably provided to cover the end portion of the common electrode 113 and the end portion of the EL layer 114. Accordingly, diffusion of impurities such as water or oxygen from the outside into the EL layer 114 and the interface between the EL layer 114 and the common electrode 113 can be effectively prevented.

[Manufacturing Method Example 5 of Display Device]

Although the manufacturing method example in which part or all of the end portion of the insulating layer 134 protrudes beyond the end portion of the insulating layer 131 is described in the above, the insulating layer 131 can cover part or all of the end portion of the insulating layer 134. A manufacturing method example thereof is described with reference to FIG. 22. For a portion where a description is omitted or the like, Manufacturing method example 1 and the like can be referred to.

Figure 22A:
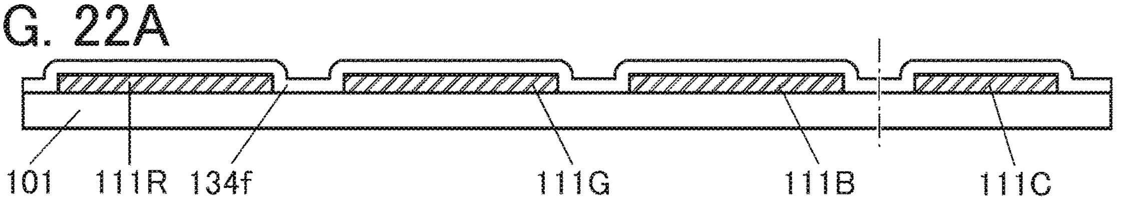
FIG. 22A to FIG. 22F are diagrams illustrating a manufacturing method example of a display device.

First, the insulating film 134*f* is formed over the pixel electrode 111R and the like (FIG. 22A).

Figure 22B:
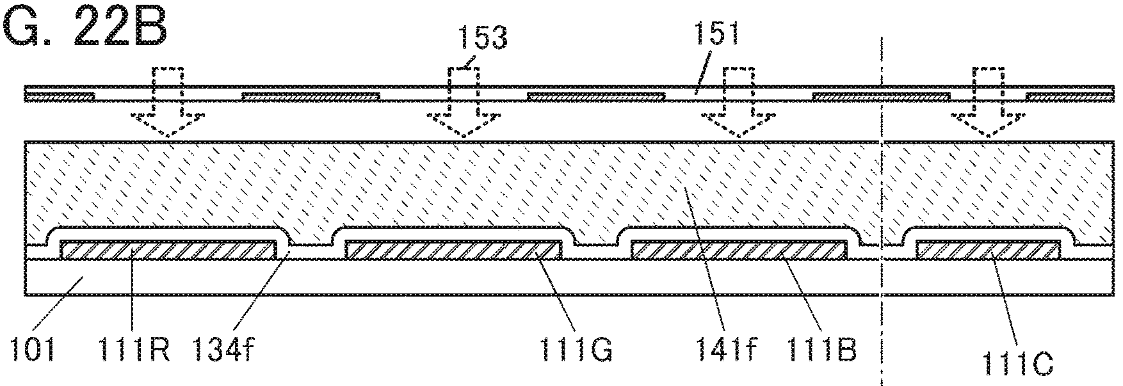

Next, the resist film 141*f* is formed over the insulating film 134*f* (FIG. 22B).

Figure 22C:
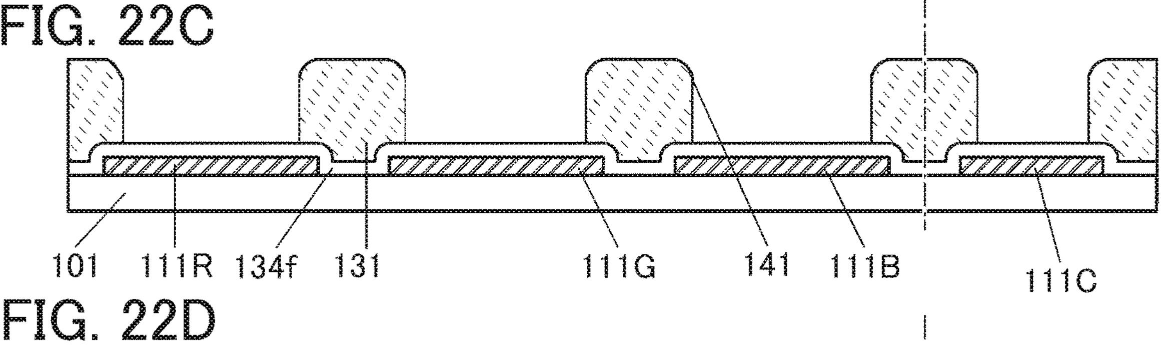

Next, after the resist film 141*f* is exposed (irradiated with the light 153) with the use of the photomask 151 (FIG. 22B), the resist film 141*f* is developed to form the resist mask 141 (FIG. 22C). When this light exposure time is increased, the width of the resist mask 141 can be reduced.

Figure 22D:
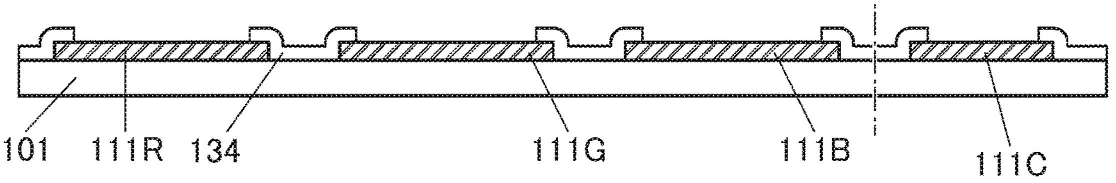

After that, the insulating film 134*f* is etched with the use of the resist mask 141 to form the insulating layer 134 (FIG. 22D).

Figure 22E:
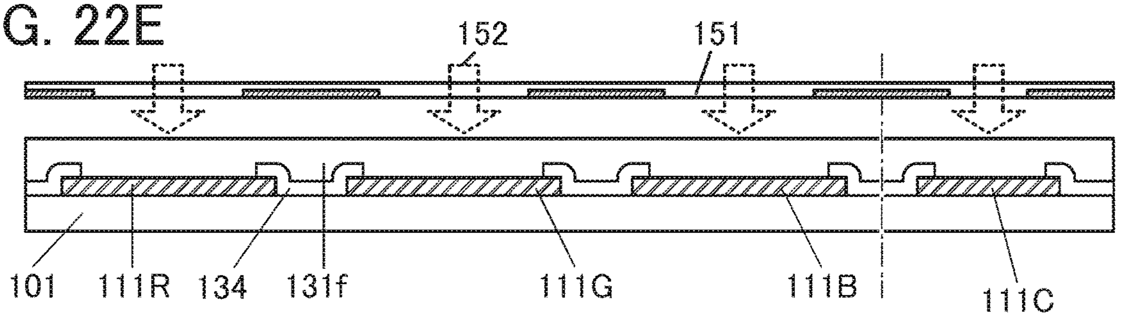

After the resist mask 141 is removed, the insulating film 131*f* is formed over the pixel electrode 111R and the like and over the insulating layer 134 (FIG. 22E).

Figure 22F:
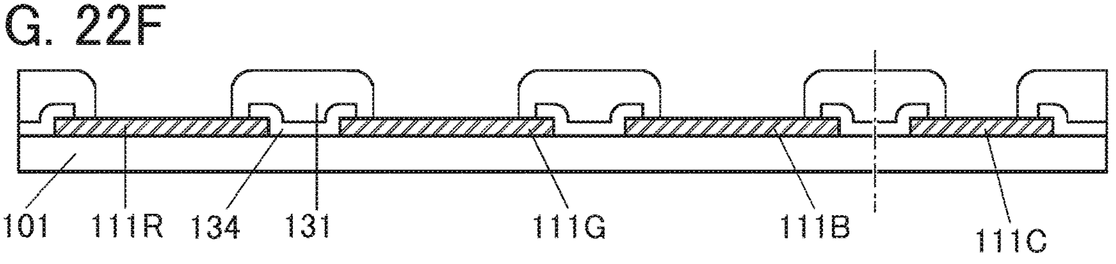

Next, after the insulating film 131*f* is exposed (irradiated with the light 152) with the use of the photomask 151 (FIG. 22E), the insulating film 131*f* is developed to form the insulating layer 131 (FIG. 22F). When this light exposure time is longer than the light exposure time of the resist film 141*f*, the width of the insulating layer 134 can be larger than the width of the resist mask 141. In this manner, the insulating layer 131 can cover the insulating layer 134 with the use of the photomask 151.

When the insulating layer 131 and the insulating layer 134 are formed using the different photomasks, a variety of structures can be formed. For example, one end portion of the insulating layer 134 can be covered with the insulating layer 131 (e.g., FIG. 22F), and the other end portion of the insulating layer 134 can protrude beyond the insulating layer 131 (e.g., FIG. 17F).

With the use of Manufacturing method example 1 to Manufacturing method example 5 as appropriate, the structures disclosed in this specification can be formed.

It is difficult to set the distance between the EL layers of different colors to be less than 10 μm with a formation method using a metal mask, for example; however, with the use of the above method, the distance can be decreased to be less than or equal to 3 μm, less than or equal to 2 μm, or less than or equal to 1 μm. For example, with the use of a light exposure apparatus for LSI, the distance can be decreased to be less than or equal to 500 nm, less than or equal to 200 nm, less than or equal to 100 nm, or less than or equal to 50 nm. Accordingly, the area of a non-light-emitting region that may exist between two light-emitting elements can be significantly reduced, and the aperture ratio can be close to 100%. For example, the aperture ratio higher than or equal to 50%, higher than or equal to 60%, higher than or equal to 70%, higher than or equal to 80% or higher than or equal to 90% and lower than 100% can be achieved.

Furthermore, a pattern of the EL layer itself can be made extremely smaller than that in the case of using a metal mask. For example, in the case of using a metal mask for forming EL layers separately, a variation in the thickness of the pattern occurs between the center and the edge of the pattern. This causes a reduction in an effective area that can be used as a light-emitting region with respect to the entire pattern area. By contrast, in the above manufacturing method, a pattern is formed by processing a film deposited to have a uniform thickness, which enables a uniform thickness in the pattern. Thus, even with a fine pattern, almost the entire area can be used as a light-emitting region. Therefore, the above manufacturing method makes it possible to achieve both high resolution and a high aperture ratio.

The partition (the insulating layer 134 or the insulating layer 131) provided between two adjacent pixel electrodes is provided to cover the end portions of the pixel electrodes. Since a region covered with the partition over the pixel electrode does not function as a light-emitting region of the light-emitting element, the smaller the width of a region where the partition and the pixel electrode overlap with each other becomes, the more effective light-emitting area ratio, i.e., the aperture ratio of the display device, can be increased.

The end portions of the EL layers are positioned over the partition. In that case, the end portions (side surfaces) of two of the EL layers are placed to face each other over the partition. When the distance between the two EL layers is decreased, the width of the partition can also be decreased; thus, the aperture ratio of the display device can be increased. For example, the distance between the side surfaces of the two EL layers facing each other can be less than or equal to 5 μm, preferably less than or equal to 4 μm, further preferably less than or equal to 3 μm, still further preferably less than or equal to 2 μm, yet further preferably less than or equal to 1 μm and greater than or equal to 10 nm, 50 nm, or greater than or equal to 100 nm.

As described above, one embodiment of the present invention can achieve a display device in which minute light-emitting elements are integrated. It is not necessary to conduct a pseudo improvement in resolution by employing a unique pixel arrangement such as a PenTile arrangement; thus, the display device can achieve resolution higher than or equal to 500 ppi, higher than or equal to 1000 ppi, higher than or equal to 2000 ppi, higher than or equal to 3000 ppi, or higher than or equal to 5000 ppi while having what is called a stripe pattern where R, G, and B are arranged in one direction. Furthermore, a display device with an effective light-emitting area ratio (aperture ratio) of higher than or equal to 50%, higher than or equal to 60%, higher than or equal to 70% and lower than 100% can be achieved.

In one embodiment of the present invention, a minute light-emitting element can be manufactured with high accuracy, so that a complex arrangement method of pixels can be achieved. For example, various arrangement methods such as an S-stripe arrangement, a Bayer arrangement, and a delta alignment can be employed in addition to a stripe arrangement.

Note that in this specification and the like, the effective light-emitting area ratio refers to a proportion of an area of a region that can be regarded as a light-emitting region of one pixel in an area of one pixel calculated from a repeated pixel pitch in a display device.

The above is the description of a manufacturing method example of a display device.

At least part of the structure examples, the manufacturing method examples, the drawings corresponding thereto, and the like described in this embodiment can be combined with the other structure examples, the other manufacturing method examples, the other drawings, and the like as appropriate. The terms or expressions used for describing the structure or manufacturing method in this specification can be appropriately used for defining another structure or manufacturing method.

At least part of this embodiment can be implemented in combination with the other embodiments described in this specification as appropriate.

Embodiment 8

In this embodiment, a preferable structure of the insulating layer 131, the insulating layer 134, and the vicinity thereof in the display device of one embodiment of the present invention is described in detail. It is particularly effective to use the structure in the vicinity of the contact hole 163 in FIG. 14.

FIG. 23 and FIG. 24 are enlarged views of the vicinity of one end portion of the light-emitting element 110R in FIG. 13 and the like. Note that only the vicinity of one end portion of the light-emitting element 110R is illustrated here for simple description; however, a similar structure can be applied to the other end portion of the light-emitting element 110R, the end portions of the light-emitting element 110G, and the end portions of the light-emitting element 110B FIG. 23A illustrates a structure in which the end portion of the insulating layer 134 and the end portion of the insulating layer 131 have tapered shapes. An angle formed by a bottom surface and a side surface of the end portion of the insulating layer 134 is denoted as the angle $\theta_1$ and an angle formed by a bottom surface and a side surface of the end portion of the insulating layer 131 is denoted as the angle $\theta_2$. Note that since the surface of the insulating layer 131 in the vicinity of the end portion has a curved shape, a tangent of the end portion of the insulating layer 131 is illustrated by a dashed-dotted line.

The angle $\theta_2$ of the insulating layer 131 can be larger than 0° and smaller than 90°, preferably larger than or equal to 5° and smaller than or equal to 70°, further preferably larger than or equal to 10° and smaller than or equal to 60°, still further preferably larger than or equal to 15° and smaller than or equal to 50°.

The angle $\theta_1$ of the insulating layer 134 can be larger than or equal to 0° and smaller than 90°, preferably larger than or equal to 10° and smaller than or equal to 85°, further preferably larger than or equal to 20° and smaller than or equal to 80°, still further preferably larger than or equal to 25° and smaller than or equal to 75°. Note that the angle A is sometimes larger than or equal to 90° depending on the processing conditions of the insulating layer 134.

The angle $\theta_2$ of the insulating layer 131 is preferably smaller than the angle A of the insulating layer 134. When the taper angle $\theta_2$ of the insulating layer 131 is reduced, formation of a low-density region in the insulating layer 134 can be inhibited.

When the taper angles are set to $\theta_2<\theta_1$, the step coverage with the EL layer 112R can be improved. When the taper angle of the smaller thickness of the insulating layer 134 and the insulating layer 131 is increased, the step coverage with the EL layer 112R can be improved. For example, when the thickness of the insulating layer 134 is smaller than the thickness of the insulating layer 131, the taper angles are preferably set to $\theta_1>\theta_2$. By contrast, when the thickness of the insulating layer 134 is larger than the thickness of the insulating layer 131, the taper angles are preferably set to $\theta_1<\theta_2$.

Note that when the surface of the insulating layer 131 is curved, the top surface and the side surface are continuous and cannot be distinguished from each other in some cases. In that case, in the surface of the insulating layer 131 in the vicinity of the end portion, the surface of a portion whose thickness is increased from the end portion can be regarded as the side surface, and the surface of a portion whose thickness is constant can be regarded as the top surface.

Figure 23A:
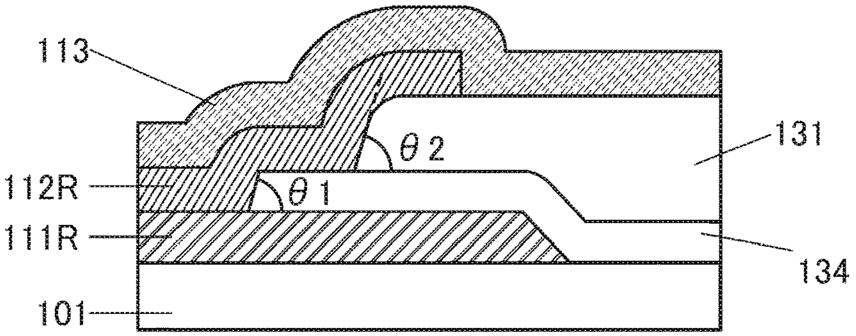
FIG. 23A to FIG. 23D are diagrams illustrating structure examples of a display device.
Figure 23B:
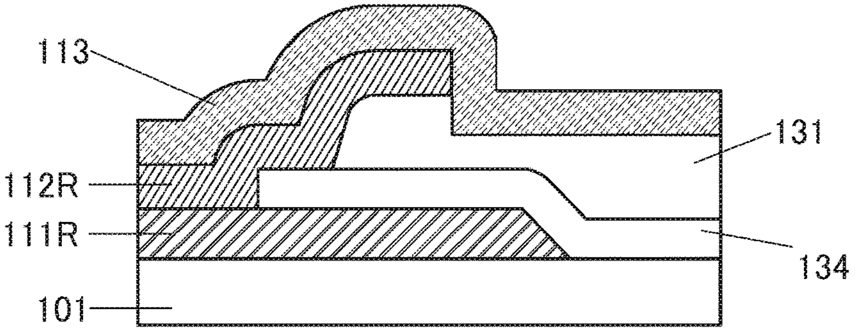

FIG. 23B illustrates a structure in which a depression is provided in part of the insulating layer 131. For example, in some cases, part of the insulating layer 131 is removed and a depression is formed when the EL layer 112R is etched.

Figure 23C:
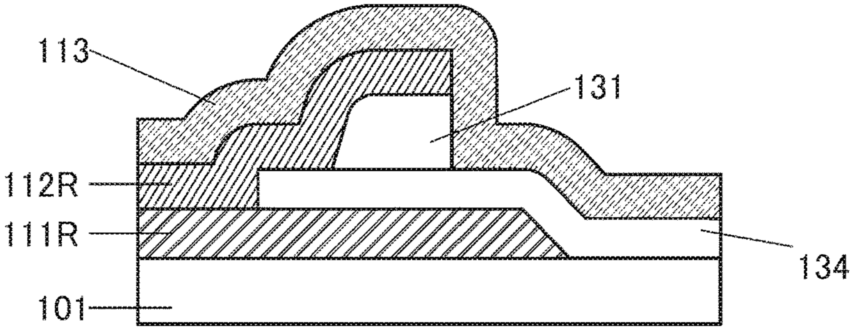

FIG. 23C illustrates a structure in which part of the insulating layer 131 is removed and part of the insulating layer 134 is exposed. In this structure, the common electrode 113 is in contact with the insulating layer 131. Between the light-emitting element 110R and the adjacent light-emitting element, a portion of the insulating layer 131 that is not covered with the EL layer is removed by etching and is divided into two in some cases.

Note that in the case where the EL layer 114 (common layer) is provided between the EL layer 112R and the common electrode 113, the EL layer 114 is in contact with the insulating layer 134.

Figure 23D:
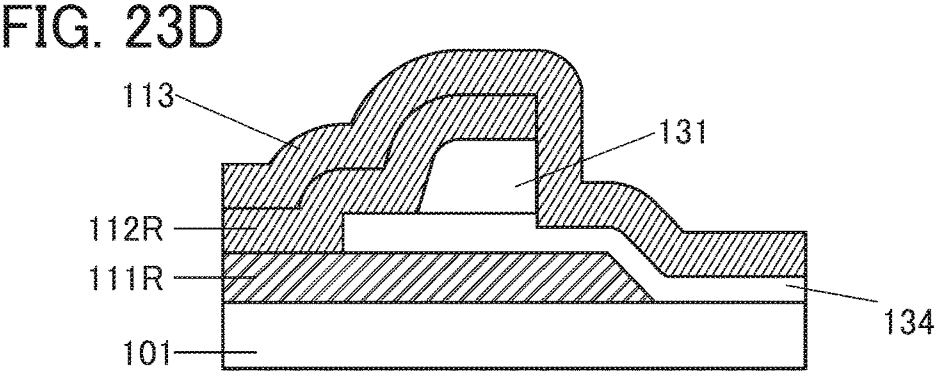

FIG. 23D illustrates a structure in which a depression is provided in part of the insulating layer 134. For example, in some cases, part of the insulating layer 134 is removed and a depression is formed when the EL layer 112R is etched. The depression is a region with a smaller thickness than a region of the insulating layer 134 on which etching is not performed. In this structure, the common electrode 113 (or the EL layer 114) is in contact with the insulating layer 134 in the depression.

FIG. 24A and FIG. 24B illustrate structures in which the end portion of the insulating layer 134 is covered with the insulating layer 131. When the end portion of the insulating layer 131 is gently tapered, the step coverage with the EL layer 112R can be improved. This can be manufactured by Manufacturing method example 3 described above.

Note that in FIG. 24B, the insulating layer 131 includes a region 119R overlapping with neither the insulating layer 134 nor the EL layer 112R.

FIG. 24C illustrates an example in which the insulating layer 134 and the pixel electrode 111R each have a stacked-layer structure.

The insulating layer 134 has a stacked-layer structure in which the insulating layer 134*a* and the insulating layer 134*b* are stacked from the substrate 101 side. The insulating layer 134*b* is thicker than the insulating layer 134*a*. In that case, the taper angle of the insulating layer 134*b* is preferably smaller than the taper angle of the insulating layer 134*a*. In contrast, the insulating layer 134*b* may be thinner than the insulating layer 134*a*, in which case the taper angle of the insulating layer 134*b* is preferably larger than the taper angle of the insulating layer 134*a*.

As described above, in the case where the insulating layer 134 has a stacked-layer structure, the step coverage with the EL layer 112R can be improved by making the thicker film have a smaller taper angle.

Note that without being limited to the above, the taper angle of the thinner film may be smaller than that of the thicker film. The insulating layer 134 may have a stacked-layer structure of three or more layers.

In the pixel electrode 111R, the conductive layer 111*a* and the conductive layer 111*b* are stacked from the substrate 101 side. Here, an example in which the conductive layer 111*b* is provided to cover the end portion of the conductive layer 111*a* is illustrated. Thus, the surface of the conductive layer 111*a* can be protected by the conductive layer 111*b*.

For the conductive layer 111*a*, a film having a reflective property with respect to light emitted by the EL layer 112R can be used. In contrast, for the conductive layer 111*b*, a film having a transmitting property with respect to the light can be used.

For the conductive layer 111*a*, for example, a metal film or an alloy film can be used. A metal film having a high reflective property with respect to visible light, such as a film of aluminum or silver, or an alloy film of them is preferably used for the conductive layer 111*a*, in which case the light extraction efficiency of the light-emitting element 110R can be increased. For the conductive layer 111*b*, a conductive material having a light-transmitting property with respect to visible light can be used. For example, conductive oxide such as indium oxide, indium tin oxide, indium zinc oxide, indium tin oxide containing silicon, or indium zinc oxide containing silicon can be used.

Note that one end portion (the region 117R) of the pixel electrode 111R illustrated in FIG. 16B or FIG. 16C may employ any of the structures in FIG. 23 or FIG. 24, and the other end portion (the region 118R) may employ any of the other structures in FIG. 23 or FIG. 24. As described above, it is also effective to form partitions with different structures in end portions of one pixel electrode.

At least part of the structure examples, the manufacturing method examples, the drawings corresponding thereto, and the like described in this embodiment can be combined with the other structure examples, the other manufacturing method examples, the other drawings, and the like as appropriate. The terms or expressions used for describing the structure or manufacturing method in this specification can be appropriately used for defining another structure or manufacturing method.

Embodiment 9

In this embodiment, structure examples of the display device of one embodiment of the present invention are described.

The display device of this embodiment can be a high-definition display device or a large-sized display device. Accordingly, the display device of this embodiment can be used for display portions of electronic devices such as a digital camera, a digital video camera, a digital photo frame, a mobile phone, a portable game console, a smart phone, a wristwatch terminal, a tablet terminal, a portable information terminal, and an audio reproducing device, in addition to display portions of electronic devices with a relatively large screen, such as a television device, a desktop or notebook personal computer, a monitor of a computer or the like, digital signage, and a large game machine such as a pachinko machine.

[Display Device 400A]

Figure 25:
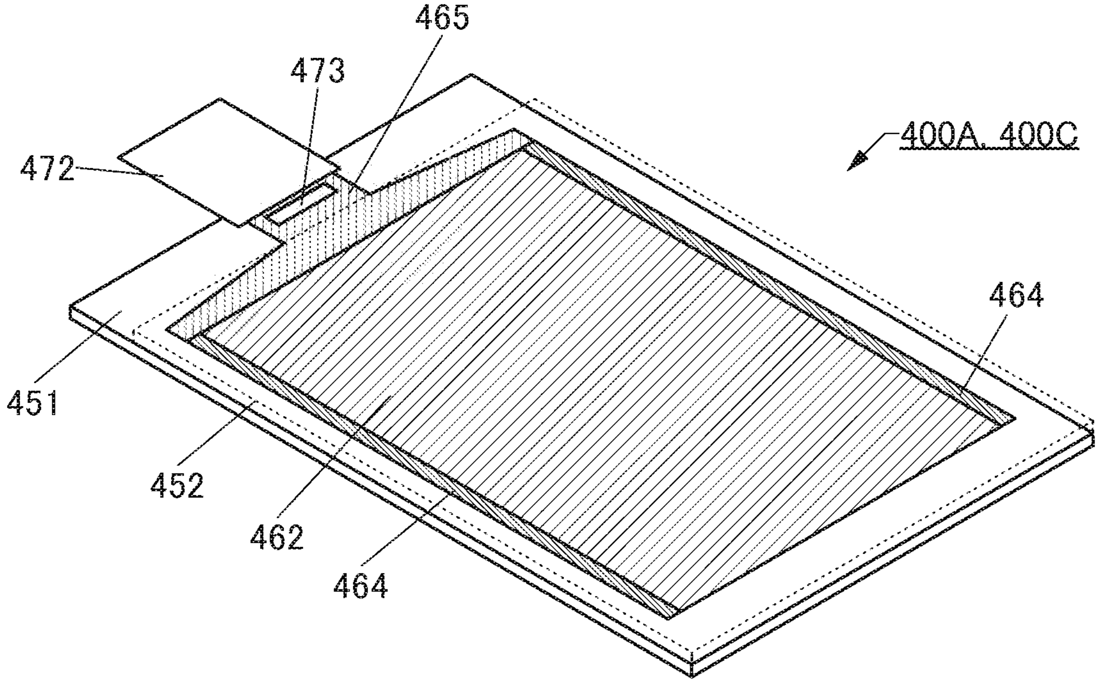
FIG. 25 is a perspective view illustrating an example of a display device.
Figure 26A:
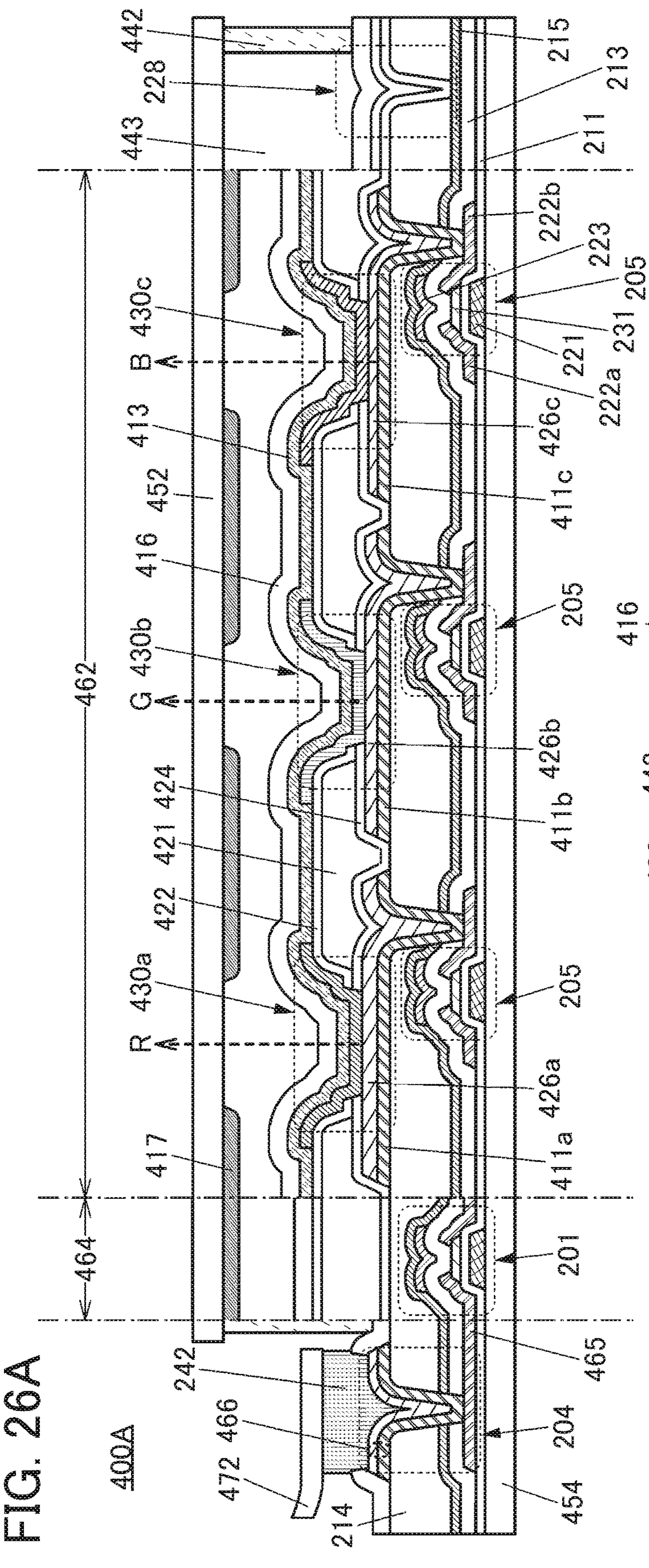
FIG. 26A and FIG. 26B are cross-sectional views illustrating examples of a display device.

FIG. 25 is a perspective view of a display device 400A, and FIG. 26A is a cross-sectional view of the display device 400A.

The display device 400A has a structure in which a substrate 452 and a substrate 451 are bonded to each other. In FIG. 25, the substrate 452 is denoted by a dashed line.

The display device 400A includes a display portion 462, a circuit 464, a wiring 465, and the like. FIG. 25 illustrates an example in which an IC 473 and an FPC 472 are mounted on the display device 400A. Thus, the structure illustrated in FIG. 25 can be regarded as a display module including the display device 400A, the IC (integrated circuit), and the FPC.

For the circuit 464, for example, a scan line driver circuit can be used.

The wiring 465 has a function of supplying a signal and power to the display portion 462 and the circuit 464. The signal and power are input to the wiring 465 from the outside through the FPC 472 or input to the wiring 465 from the IC 473.

FIG. 25 illustrates an example in which the IC 473 is provided over the substrate 451 by a COG (Chip On Glass) method, a COF (Chip on Film) method, or the like. An IC including a scan line driver circuit, a signal line driver circuit, or the like can be used as the IC 473, for example. Note that the display device 400A and the display module are not necessarily provided with an IC. The IC may be mounted on the FPC by a COF method or the like.

FIG. 26A illustrates an example of cross sections of part of a region including the FPC 472, part of the circuit 464, part of the display portion 462, and part of a region including an end portion in the display device 400A.

The display device 400A illustrated in FIG. 26A includes a transistor 201, a transistor 205, a light-emitting element 430*a* that emits red light, a light-emitting element 430*b* that emits green light, a light-emitting element 430*c* that emits blue light, and the like between the substrate 451 and the substrate 452.

The light-emitting element described in other descriptions can be used for the light-emitting element 430*a*, the light-emitting element 430*b*, and the light-emitting element 430*c*. FIG. 26A is an example in which the light-emitting elements illustrated in FIG. 3B and the like are used.

Here, in the case where the pixel of the display device includes three kinds of subpixels including light-emitting elements that emit different colors, as the three subpixels, subpixels of three colors of red (R), green (G), and blue (B), subpixels of three colors of yellow (Y), cyan (C), and magenta (M), and the like can be given. In the case where the pixel includes four subpixels each including a light-emitting element, as the four subpixels, subpixels of four colors of R, G, B, and white (W), subpixels of four colors of R, G, B, and Y, and the like can be given.

A protective layer 416 and the substrate 452 are bonded to each other with an adhesive layer 442 therebetween. A solid sealing structure, a hollow sealing structure, or the like can be employed to seal the light-emitting elements. In FIG. 26A, a hollow sealing structure is employed in which a space 443 surrounded by the substrate 452, the adhesive layer 442, and the substrate 451 is filled with an inert gas (e.g., nitrogen or argon). The adhesive layer 442 may be provided to overlap with the light-emitting elements. The space 443 surrounded by the substrate 452, the adhesive layer 442, and the substrate 451 may be filled with a resin different from that of the adhesive layer 442. In that case, the adhesive layer 442 is not necessarily provided.

The light-emitting element 430*a*, the light-emitting element 430*b*, and the light-emitting element 430*c* each have an optical adjustment layer between the pixel electrode and the EL layer. The light-emitting element 430*a* includes an optical adjustment layer 426*a*, the light-emitting element 430*b* includes an optical adjustment layer 426*b*, and the light-emitting element 430*c* includes an optical adjustment layer 426*c*. For details of the light-emitting element, other descriptions in this specification can be referred to.

A pixel electrode 411*a*, a pixel electrode 411*b*, and a pixel electrode 411*c* are each connected to a conductive layer 222*b* included in the transistor 205 through an opening provided in an insulating layer 214.

End portions of the pixel electrode and the optical adjustment layer are covered with the partition (the insulating layer 424, the insulating layer 421, or the insulating layer 422). It is preferable that the insulating layer 421 contain an organic resin and the insulating layer 424 and the insulating layer 422 include an inorganic insulating film. The pixel electrode contains a material that reflects visible light, and a counter electrode contains a material that transmits visible light. For the details of the partition, other descriptions in this specification (e.g., the insulating layer 134, the insulating layer 131, or the insulating layer 132 in FIG. 1 and the like) can be referred to.

Light emitted from the light-emitting element is emitted toward the substrate 452 side. For the substrate 452, a material having a high transmitting property with respect to visible light is preferably used.

The transistor 201 and the transistor 205 are formed over the substrate 451. These transistors can be manufactured using the same materials in the same steps.

An insulating layer 211, an insulating layer 213, an insulating layer 215, and the insulating layer 214 are provided in this order over the substrate 451. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that there is no limitation on the number of gate insulating layers and the number of insulating layers covering the transistors, and each insulating layer may have either a single layer or two or more layers.

A material through which impurities such as water and hydrogen do not easily diffuse is preferably used for at least one of the insulating layers that cover the transistors. This allows the insulating layer to function as a barrier layer. Such a structure can effectively inhibit diffusion of impurities into the transistors from the outside and increase the reliability of the display device.

An inorganic insulating film is preferably used as each of the insulating layer 211, the insulating layer 213, and the insulating layer 215. For the inorganic insulating film, a silicon nitride film, a silicon oxynitride film, a silicon oxide film, a silicon nitride oxide film, an aluminum oxide film, an aluminum nitride film, or the like can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above inorganic insulating films may also be used.

Here, an organic insulating film often has a lower barrier property than an inorganic insulating film. Therefore, the organic insulating film preferably has an opening in the vicinity of an end portion of the display device 400A. This can inhibit entry of impurities from the end portion of the display device 400A through the organic insulating film. Alternatively, the organic insulating film may be formed so that an end portion of the organic insulating film is positioned inward from the end portion of the display device 400A, to prevent the organic insulating film from being exposed at the end portion of the display device 400A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 26A, an opening is formed in the insulating layer 214. This can inhibit entry of impurities into the display portion 462 from the outside through the insulating layer 214 even when an organic insulating film is used as the insulating layer 214. Thus, the reliability of the display device 400A can be increased.

In the region 228, the insulating layer (the insulating layer 424, the insulating layer 421, or the insulating layer 422) included in the partition is preferably placed to cover the opening of the insulating layer 214. In the example of FIG. 26A, the insulating layer 424 and the insulating layer 422 are provided inside the opening of the insulating layer 214.

Each of the transistor 201 and the transistor 205 includes a conductive layer 221 functioning as a gate, the insulating layer 211 functioning as the gate insulating layer, a conductive layer 222*a* and the conductive layer 222*b* functioning as a source and a drain, a semiconductor layer 231, the insulating layer 213 functioning as the gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device of this embodiment. For example, a planar transistor, a staggered transistor, an inverted staggered transistor, or the like can be used. A top-gate or a bottom-gate transistor structure may be employed. Alternatively, gates may be provided above and below the semiconductor layer in which a channel is formed.

The structure in which the semiconductor layer where a channel is formed is sandwiched between two gates is used for the transistor 201 and the transistor 205. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the semiconductor layer of the transistor, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity is preferably used, in which case deterioration of the transistor characteristics can be inhibited.

The semiconductor layer of the transistor preferably includes a metal oxide (also referred to as an oxide semiconductor). That is, a transistor including a metal oxide in its channel formation region (hereinafter, also referred to as an OS transistor) is preferably used for the display device of this embodiment.

The band gap of a metal oxide used for the semiconductor layer of the transistor is preferably 2 eV or more, further preferably 2.5 eV or more. With the use of a metal oxide having a wide bandgap, the off-state current of the OS transistor can be reduced.

A metal oxide preferably contains at least indium or zinc and further preferably contains indium and zinc. A metal oxide preferably contains indium, M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. In particular, M is preferably one or more kinds selected from gallium, aluminum, yttrium, and tin, and Mis further preferably gallium. Hereinafter, a metal oxide containing indium, M, and zinc is referred to as In-M-Zn oxide in some cases.

When a metal oxide is an In-M-Zn oxide, the atomic ratio of In is preferably higher than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio. By increasing the proportion of the number of indium atoms in the metal oxide, the on-state current, field-effect mobility, or the like of the transistor can be improved.

For example, in the case of describing an atomic ratio of In:Ga:Zn=4:2:3 or a composition in the neighborhood thereof, the case is included in which with the atomic ratio of In being 4, the atomic ratio of Ga is greater than or equal to 1 and less than or equal to 3 and the atomic ratio of Zn is greater than or equal to 2 and less than or equal to 4. In the case of describing an atomic ratio of In:Ga:Zn=5:1:6 or a composition in the neighborhood thereof, the case is included in which with the atomic ratio of In being 5, the atomic ratio of Ga is greater than 0.1 and less than or equal to 2 and the atomic ratio of Zn is greater than or equal to 5 and less than or equal to 7. In the case of describing an atomic ratio of In:Ga:Zn=1:1:1 or a composition in the neighborhood thereof, the case is included in which with the atomic ratio of In being 1, the atomic ratio of Ga is greater than 0.1 and less than or equal to 2 and the atomic ratio of Zn is greater than 0.1 and less than or equal to 2.

The atomic ratio of In may be less than the atomic ratio of M in the In-M-Zn oxide. Examples of the atomic ratio of the metal elements in such an In-M-Zn oxide include In:M:Zn=1:3:2 or a composition in the neighborhood thereof, In:M:Zn=1:3:3 or a composition in the neighborhood thereof, In:M:Zn=1:3:4 or a composition in the neighborhood thereof. By increasing the proportion of the number of M atoms in the metal oxide, the band gap of the In-M-Zn oxide is further increased; thus, the resistance to a negative bias stress test with light irradiation can be improved. Specifically, the amount of change in the threshold voltage or the amount of change in the shift voltage (Vsh) measured in a NBTIS (Negative Bias Temperature Illumination Stress) test of the transistor can be decreased. Note that the shift voltage (Vsh) is defined as Vg at which, in a drain current (Id)-gate voltage (Vg) curve of a transistor, the tangent at a point where the slope of the curve is the steepest intersects the straight line of Id=1 pA.

Alternatively, the semiconductor layer of the transistor may contain silicon. Examples of silicon include amorphous silicon and crystalline silicon (e.g., low-temperature polysilicon or single crystal silicon).

Alternatively, a semiconductor layer of a transistor may contain a layered material that functions as a semiconductor. The layered material is a general term of a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, a transistor having a high on-state current can be provided.

Examples of the layered materials include graphene, silicene, and chalcogenide. Chalcogenide is a compound containing chalcogen (an element belonging to Group 16). Examples of chalcogenide include transition metal chalcogenide and chalcogenide of Group 13 elements. Specific examples of the transition metal chalcogenide which can be used for a semiconductor layer of a transistor include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

The transistor included in the circuit 464 and the transistor included in the display portion 462 may have the same structure or different structures. A plurality of transistors included in the circuit 464 may have the same structure or two or more kinds of structures. Similarly, a plurality of transistors included in the display portion 462 may have the same structure or two or more kinds of structures.

A connection portion 204 is provided in a region of the substrate 451 that does not overlap with the substrate 452. In the connection portion 204, the wiring 465 is electrically connected to the FPC 472 through a conductive layer 466 and a connection layer 242. An example is illustrated in which the conductive layer 466 has a stacked-layer structure of a conductive film obtained by processing the same conductive film as the pixel electrode and a conductive film obtained by processing the same conductive film as the optical adjustment layer. On a top surface of the connection portion 204, the conductive layer 466 is exposed. Thus, the connection portion 204 and the FPC 472 can be electrically connected to each other through the connection layer 242.

A light-blocking layer 417 is preferably provided on a surface of the substrate 452 on the substrate 451 side. A variety of optical members can be arranged on the outer side of the substrate 452. Examples of the optical members include a polarizing plate, a retardation plate, a light diffusion layer (a diffusion film or the like), an anti-reflective layer, and a light-condensing film. Furthermore, an antistatic film inhibiting the attachment of dust, a water repellent film inhibiting the attachment of stain, a hard coat film inhibiting generation of a scratch caused by the use, a shock absorption layer, or the like may be provided on the outer side of the substrate 452.

The light-blocking layer 417 can be provided to overlap with an end portion of the partition. In particular, over the pixel electrode, the insulating layer 424 preferably includes a region in contact with the insulating layer 421, and the region is preferably provided to overlap with an end portion of the light-blocking layer 417. In that case, the light-blocking property can be improved. Note that the region does not necessarily overlap with the light-blocking layer 417, in which case a display region might be larger.

With provision of the protective layer 416 that covers the light-emitting element, entry of impurities such as water into the light-emitting element can be inhibited, leading to an increase in the reliability of the light-emitting element.

In the region 228 in the vicinity of the end portion of the display device 400A, the insulating layer 215 and the protective layer 416 are preferably in contact with each other through the opening in the insulating layer 214. In particular, the inorganic insulating film included in the insulating layer 215 and the inorganic insulating film included in the protective layer 416 are preferably in contact with each other. Thus, entry of impurities into the display portion 462 from the outside through an organic insulating film can be inhibited. Thus, the reliability of the display device 400A can be increased.

Figure 26B:
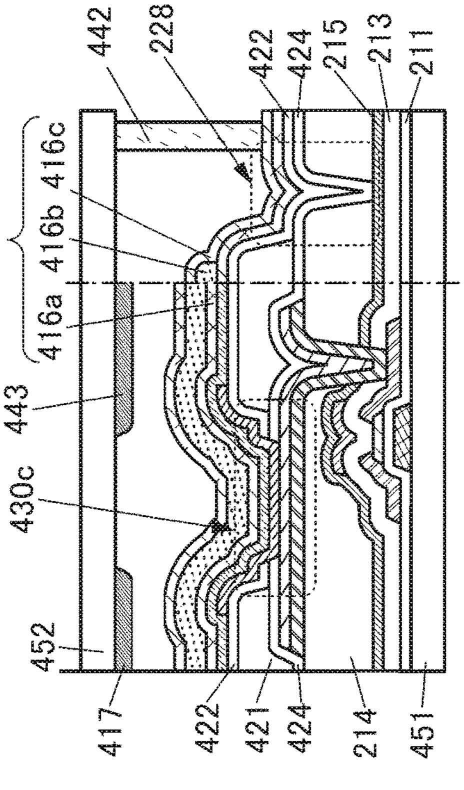

FIG. 26B illustrates an example in which the protective layer 416 has a three-layer structure. In FIG. 26B, the protective layer 416 includes an inorganic insulating layer 416*a* over the light-emitting element 430*c*, an organic insulating layer 416*b* over the inorganic insulating layer 416*a*, and an inorganic insulating layer 416*c* over the organic insulating layer 416*b*.

The inorganic insulating layer 416*a* and the inorganic insulating layer 416*c* extend beyond an end portion of the organic insulating layer 416*b* and are in contact with each other. The inorganic insulating layer 416*a* and the insulating layer 422 are in contact with each other in a region where a common electrode 413 is not provided. The insulating layer 422 is in contact with the insulating layer 215 (inorganic insulating layer) through the opening in the insulating layer 214 (organic insulating layer). Thus, the light-emitting element can be surrounded by the insulating layer 215 and the protective layer 416, so that the reliability of the light-emitting element can be increased.

As described above, the protective layer 416 may have a stacked-layer structure of an organic insulating film and an inorganic insulating film. In that case, an end portion of the inorganic insulating film preferably extends beyond an end portion of the organic insulating film.

For each of the substrate 451 and the substrate 452, glass, quartz, ceramic, sapphire, a resin, a metal, an alloy, a semiconductor, or the like can be used. The substrate on the side where light from the light-emitting element is extracted is formed using a material that transmits the light. When a flexible material is used for the substrate 451 and the substrate 452, the flexibility of the display device can be increased. Furthermore, a polarizing plate may be used as the substrate 451 or the substrate 452.

For each of the substrate 451 and the substrate 452, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Glass that is thin enough to have flexibility may be used for one or both of the substrate 451 and the substrate 452.

In the case where a circularly polarizing plate overlaps with the display device, a highly optically isotropic substrate is preferably used as the substrate included in the display device. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the films having high optical isotropy include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of a display panel might be changed, e.g., creases are generated. Thus, for the substrate, a film with a low water absorption rate is preferably used. For example, the water absorption rate of the film is preferably lower than or equal to 1%, further preferably lower than or equal to 0.1%, still further preferably lower than or equal to 0.01%.

For the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

For the connection layer 242, an anisotropic conductive film (ACF), an anisotropic conductive paste (ACP), or the like can be used.

Examples of materials that can be used for a gate, a source, and a drain of a transistor and conductive layers such as a variety of wirings and electrodes included in a display device include metals such as aluminum, titanium, chromium, nickel, copper, yttrium, zirconium, molybdenum, silver, tantalum, or tungsten, and an alloy containing any of these metals as its main component. A film containing any of these materials can be used in a single layer or as a stacked-layer structure.

For a conductive material having a light-transmitting property, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to be able to transmit light. A stacked film of any of the above materials can be used as a conductive layer. For example, a stacked film of indium tin oxide and an alloy of silver and magnesium, or the like is preferably used for increased conductivity. These materials can also be used, for example, for the conductive layers such as a variety of wirings and electrodes included in a display device, and conductive layers (conductive layers functioning as a pixel electrode or a common electrode) included in the light-emitting element.

For an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

[Display Device 400B]

Figure 27A:
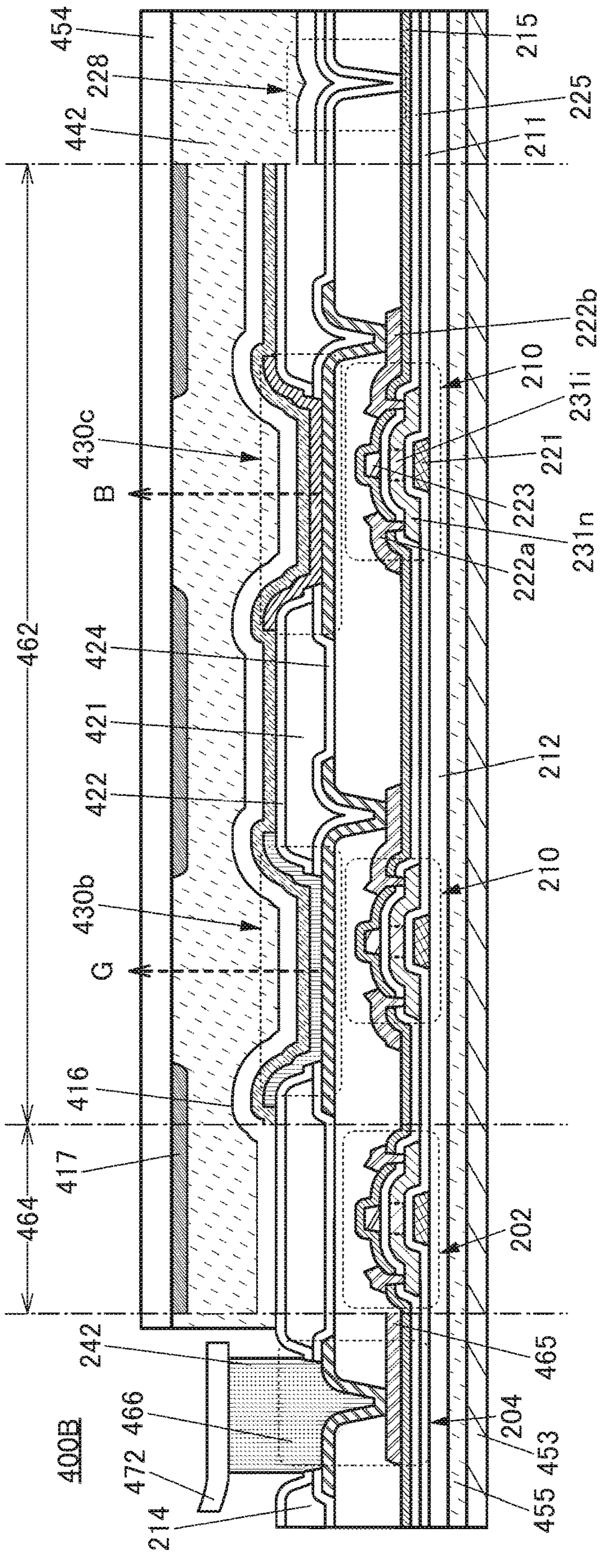
FIG. 27A is a cross-sectional view illustrating an example of a display device.

FIG. 27A is a cross-sectional view of a display device 400B. A perspective view of the display device 400B is similar to that of the display device 400A illustrated in FIG. 25. FIG. 27A illustrates an example of a cross section including part of a region including the FPC 472, part of the circuit 464, and part of the display portion 462 in the display device 400B. FIG. 27A specifically illustrates an example of a cross section of a region including the light-emitting element 430*b* that emits green light and the light-emitting element 430*c* that emits blue light in the display portion 462. Note that portions similar to those of the display device 400A are not described in some cases.

The display device 400B illustrated in FIG. 27A includes a transistor 202, a transistor 210, the light-emitting element 430*b*, the light-emitting element 430*c*, and the like between a substrate 453 and a substrate 454.

The substrate 454 and the protective layer 416 are bonded to each other with the adhesive layer 442. The adhesive layer 442 is provided to overlap with the light-emitting element 430*b* and the light-emitting element 430*c*; that is, the display device 400B employs a solid sealing structure.

The substrate 453 and an insulating layer 212 are bonded to each other with an adhesive layer 455.

In a manufacturing method of the display device 400B, first, a formation substrate provided with the insulating layer 212, the transistors, the light-emitting elements, and the like is bonded to the substrate 454 provided with the light-blocking layer 417 with the adhesive layer 442. Then, the substrate 453 is attached to a surface exposed by separation of the formation substrate, whereby the components formed over the formation substrate are transferred onto the substrate 453. The substrate 453 and the substrate 454 preferably have flexibility. This can increase the flexibility of the display device 400B.

The inorganic insulating film that can be used for the insulating layer 211, the insulating layer 213, and the insulating layer 215 can be used for the insulating layer 212.

The pixel electrode is connected to the conductive layer 222*b* included in the transistor 210 through an opening provided in the insulating layer 214. The transistor 210 has a function of controlling driving of the light-emitting element.

An end portion of the pixel electrode is covered with the partition (the insulating layer 424, the insulating layer 421, or the insulating layer 422). For the details of the partition, other descriptions in this specification can be referred to.

Light emitted by the light-emitting element 430*b* and the light-emitting element 430*c* is emitted toward the substrate 454 side. For the substrate 454, a material having a high transmitting property with respect to visible light is preferably used.

The connection portion 204 is provided in a region of the substrate 453 that does not overlap with the substrate 454. In the connection portion 204, the wiring 465 is electrically connected to the FPC 472 through the conductive layer 466 and the connection layer 242. The conductive layer 466 can be obtained by processing the same conductive film as the pixel electrode. Thus, the connection portion 204 and the FPC 472 can be electrically connected to each other through the connection layer 242.

Each of the transistor 202 and the transistor 210 includes the conductive layer 221 functioning as a gate, the insulating layer 211 functioning as a gate insulating layer, a semiconductor layer 231 including a channel formation region 231*i* and a pair of low-resistance regions 231*n*, the conductive layer 222*a* connected to one of the pair of low-resistance regions 231*n*, the conductive layer 222*b* connected to the other of the pair of low-resistance regions 231*n*, the insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned between the conductive layer 223 and the channel formation region 231*i*.

The conductive layer 222*a* and the conductive layer 222*b* are connected to the corresponding low-resistance regions 231*n* through openings provided in the insulating layer 215. One of the conductive layer 222*a* and the conductive layer 222*b* functions as a source, and the other functions as a drain.

FIG. 27A illustrates an example in which the insulating layer 225 covers a top surface and a side surface of the semiconductor layer. The conductive layer 222*a* and the conductive layer 222*b* are connected to the corresponding low-resistance regions 231*n* through openings provided in the insulating layer 225 and the insulating layer 215.

Figure 27B:
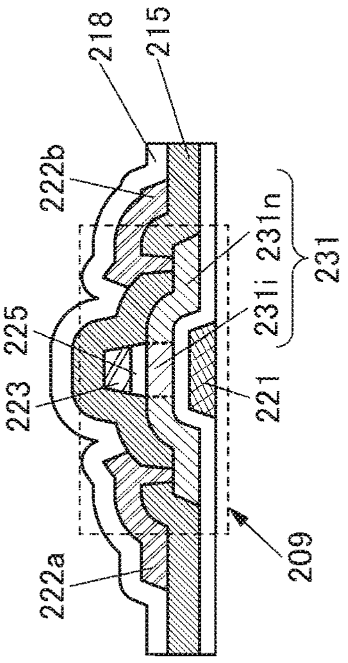
FIG. 27B is a cross-sectional view illustrating an example of a transistor.

Meanwhile, in a transistor 209 illustrated in FIG. 27B, the insulating layer 225 overlaps with the channel formation region 231*i* of the semiconductor layer 231 and does not overlap with the low-resistance regions 231*n*. The structure illustrated in FIG. 27B can be manufactured by processing the insulating layer 225 using the conductive layer 223 as a mask, for example. In FIG. 27B, the insulating layer 215 is provided to cover the insulating layer 225 and the conductive layer 223, and the conductive layer 222*a* and the conductive layer 222*b* are connected to the low-resistance regions 231*n* through the openings in the insulating layer 215. Furthermore, an insulating layer 218 covering the transistor may be provided.

[Display Device 400C]

Figure 28A:
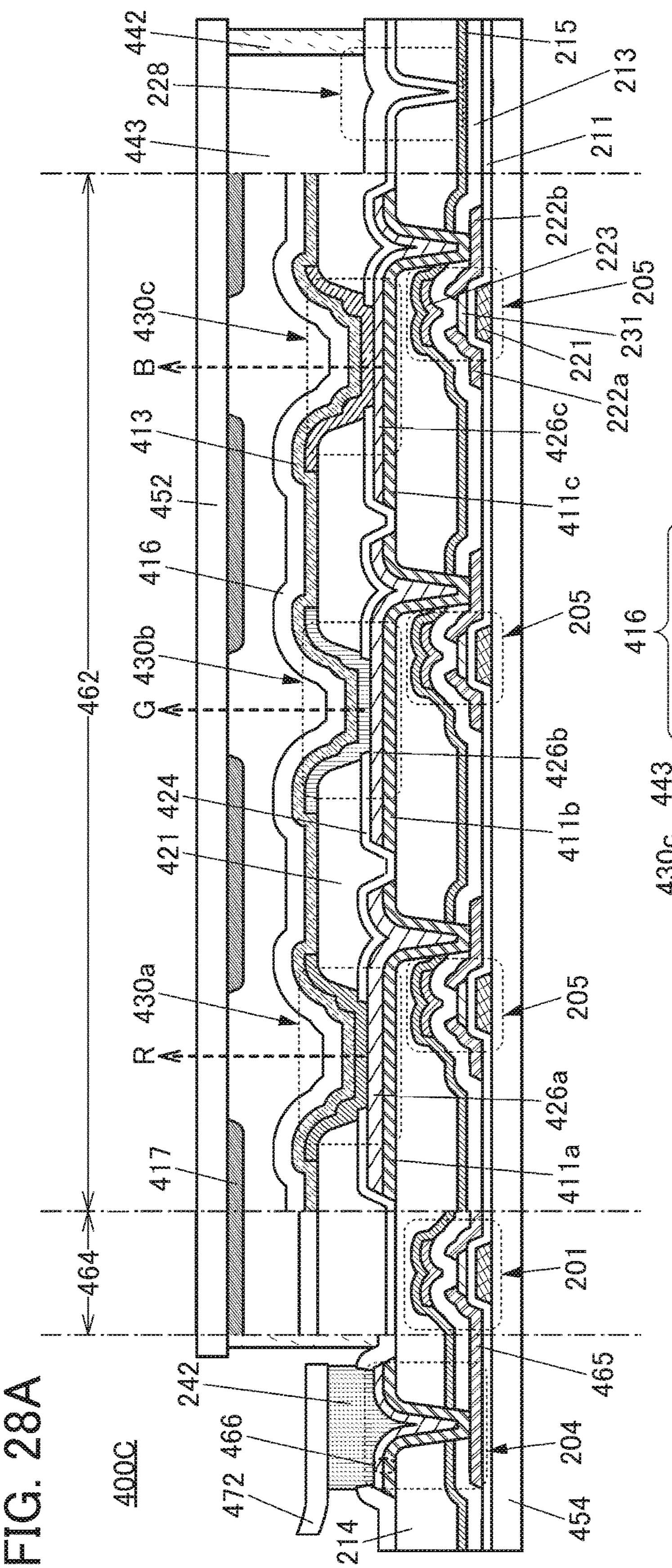
FIG. 28A and FIG. 28B are cross-sectional views illustrating examples of a display device.

The perspective view of 400C is illustrated in FIG. 25 described above. FIG. 28A is a cross-sectional view of the display device 400C.

FIG. 28A illustrates an example of cross sections of part of a region including the FPC 472, part of the circuit 464, part of the display portion 462, and part of a region including an end portion in the display device 400C.

The display device 400C illustrated in FIG. 28A includes the transistor 201, the transistor 205, the light-emitting element 430*a* that emits red light, the light-emitting element 430*b* that emits green light, the light-emitting element 430*c* that emits blue light, and the like between the substrate 451 and the substrate 452.

The light-emitting element described in other descriptions can be used for the light-emitting element 430*a*, the light-emitting element 430*b*, and the light-emitting element 430*c*. FIG. 28A is an example in which the light-emitting elements illustrated in FIG. 15B and the like are used.

The protective layer 416 and the substrate 452 are bonded to each other with the adhesive layer 442 therebetween. A solid sealing structure, a hollow sealing structure, or the like can be employed to seal the light-emitting elements. In FIG. 28A, a hollow sealing structure is employed in which the space 443 surrounded by the substrate 452, the adhesive layer 442, and the substrate 451 is filled with an inert gas (e.g., nitrogen or argon). The adhesive layer 442 may be provided to overlap with the light-emitting elements. The space 443 surrounded by the substrate 452, the adhesive layer 442, and the substrate 451 may be filled with a resin different from that of the adhesive layer 442. In that case, the adhesive layer 442 is not necessarily provided.

The light-emitting element 430*a*, the light-emitting element 430*b*, and the light-emitting element 430*c* each have an optical adjustment layer between the pixel electrode and the EL layer. The light-emitting element 430*a* includes the optical adjustment layer 426*a*, the light-emitting element 430*b* includes the optical adjustment layer 426*b*, and the light-emitting element 430*c* includes the optical adjustment layer 426*c*. For details of the light-emitting element, other descriptions in this specification can be referred to.

The pixel electrode 411*a*, the pixel electrode 411*b*, and the pixel electrode 411*c* are each connected to the conductive layer 222*b* included in the transistor 205 through an opening provided in an insulating layer 214.

End portions of the pixel electrode and the optical adjustment layer are covered with the partition (the insulating layer 424 or the insulating layer 421). It is preferable that the insulating layer 421 contain an organic resin and the insulating layer 424 include an inorganic insulating film. The pixel electrode contains a material that reflects visible light, and a counter electrode contains a material that transmits visible light. For the details of the partition, other descriptions in this specification (e.g., the insulating layer 134 or the insulating layer 131 in FIG. 13 and the like) can be referred to.

Light emitted from the light-emitting element is emitted toward the substrate 452 side. For the substrate 452, a material having a high transmitting property with respect to visible light is preferably used.

The transistor 201 and the transistor 205 are formed over the substrate 451. These transistors can be manufactured using the same materials in the same steps.

The insulating layer 211, the insulating layer 213, the insulating layer 215, and the insulating layer 214 are provided in this order over the substrate 451. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that there is no limitation on the number of gate insulating layers and the number of insulating layers covering the transistors, and each insulating layer may have either a single layer or two or more layers.

An inorganic insulating film is preferably used as each of the insulating layer 211, the insulating layer 213, and the insulating layer 215.

Here, an organic insulating film often has a lower barrier property than an inorganic insulating film. Therefore, the organic insulating film preferably has an opening in the vicinity of an end portion of the display device 400C. This can inhibit entry of impurities from the end portion of the display device 400C through the organic insulating film. Alternatively, the organic insulating film may be formed so that an end portion of the organic insulating film is positioned inward from the end portion of the display device 400C, to prevent the organic insulating film from being exposed at the end portion of the display device 400C.

An organic insulating film is suitable for the insulating layer 214 functioning as a planarization layer.

In the region 228 illustrated in FIG. 28A, an opening is formed in the insulating layer 214. This can inhibit entry of impurities into the display portion 462 from the outside through the insulating layer 214 even when an organic insulating film is used as the insulating layer 214. Thus, the reliability of the display device 400C can be increased.

In the region 228, the insulating layer (the insulating layer 424 or the insulating layer 421) included in the partition is preferably placed to cover the opening of the insulating layer 214. In the example of FIG. 28A, the insulating layer 424 is provided inside the opening of the insulating layer 214.

Each of the transistor 201 and the transistor 205 includes the conductive layer 221 functioning as a gate, the insulating layer 211 functioning as the gate insulating layer, the conductive layer 222*a* and the conductive layer 222*b* functioning as a source and a drain, the semiconductor layer 231, the insulating layer 213 functioning as the gate insulating layer, and the conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

The structure in which the semiconductor layer where a channel is formed is sandwiched between two gates is used for the transistor 201 and the transistor 205. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

The connection portion 204 is provided in a region of the substrate 451 that does not overlap with the substrate 452. In the connection portion 204, the wiring 465 is electrically connected to the FPC 472 through the conductive layer 466 and the connection layer 242. An example is illustrated in which the conductive layer 466 has a stacked-layer structure of a conductive film obtained by processing the same conductive film as the pixel electrode and a conductive film obtained by processing the same conductive film as the optical adjustment layer. On the top surface of the connection portion 204, the conductive layer 466 is exposed. Thus, the connection portion 204 and the FPC 472 can be electrically connected to each other through the connection layer 242.

The light-blocking layer 417 is preferably provided on a surface of the substrate 452 on the substrate 451 side. A variety of optical members can be arranged on the outer side of the substrate 452. Furthermore, an antistatic film inhibiting the attachment of dust, a water repellent film inhibiting the attachment of stain, a hard coat film inhibiting generation of a scratch caused by the use, a shock absorption layer, or the like may be provided on the outer side of the substrate 452.

The light-blocking layer 417 can be provided to overlap with an end portion of the partition. In particular, over the pixel electrode, an end portion of the insulating layer 424 preferably includes a region protruding beyond an end portion of the insulating layer 421 (also referred to as an extending region), and the region is preferably provided to overlap with an end portion of the light-blocking layer 417. In the case where the insulating layer 421 covers the end portion of the insulating layer 424, the end portion of the insulating layer 421 includes a region not overlapping with the insulating layer 424. In that case, the region is preferably provided to overlap with the end portion of the light-blocking layer 417. With such a structure, the light-blocking property can be improved. Note that these regions do not necessarily overlap with the light-blocking layer 417, in which case a display region might be larger.

With provision of the protective layer 416 that covers the light-emitting element, entry of impurities such as water into the light-emitting element can be inhibited, leading to an increase in the reliability of the light-emitting element.

In the region 228 in the vicinity of the end portion of the display device 400C, the insulating layer 215 and the protective layer 416 are preferably in contact with each other through the opening in the insulating layer 214. In particular, the inorganic insulating film included in the insulating layer 215 and the inorganic insulating film included in the protective layer 416 are preferably in contact with each other. Thus, entry of impurities into the display portion 462 from the outside through an organic insulating film can be inhibited. Thus, the reliability of the display device 400C can be increased.

Figure 28B:
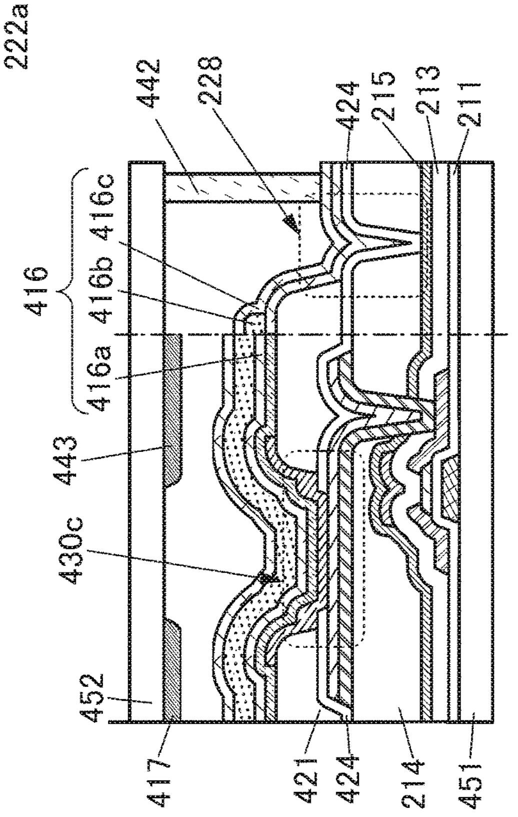

FIG. 28B illustrates an example in which the protective layer 416 has a three-layer structure. In FIG. 28B, the protective layer 416 includes the inorganic insulating layer 416*a* over the light-emitting element 430*c*, the organic insulating layer 416*b* over the inorganic insulating layer 416*a*, and the inorganic insulating layer 416*c* over the organic insulating layer 416*b*.

The inorganic insulating layer 416*a* and the inorganic insulating layer 416*c* extend beyond the end portion of the organic insulating layer 416*b* and are in contact with each other. The inorganic insulating layer 416*a* and the insulating layer 424 are in contact with each other in a region where the common electrode 413 is not provided. The inorganic insulating layer 424 is in contact with the insulating layer 215 (inorganic insulating layer) through the opening in the insulating layer 214 (organic insulating layer). Thus, the light-emitting element can be surrounded by the insulating layer 215 and the protective layer 416, so that the reliability of the light-emitting element can be increased.

As described above, the protective layer 416 may have a stacked-layer structure of an organic insulating film and an inorganic insulating film. In that case, an end portion of the inorganic insulating film preferably extends beyond an end portion of the organic insulating film.

[Display Device 400D]

Figure 29:
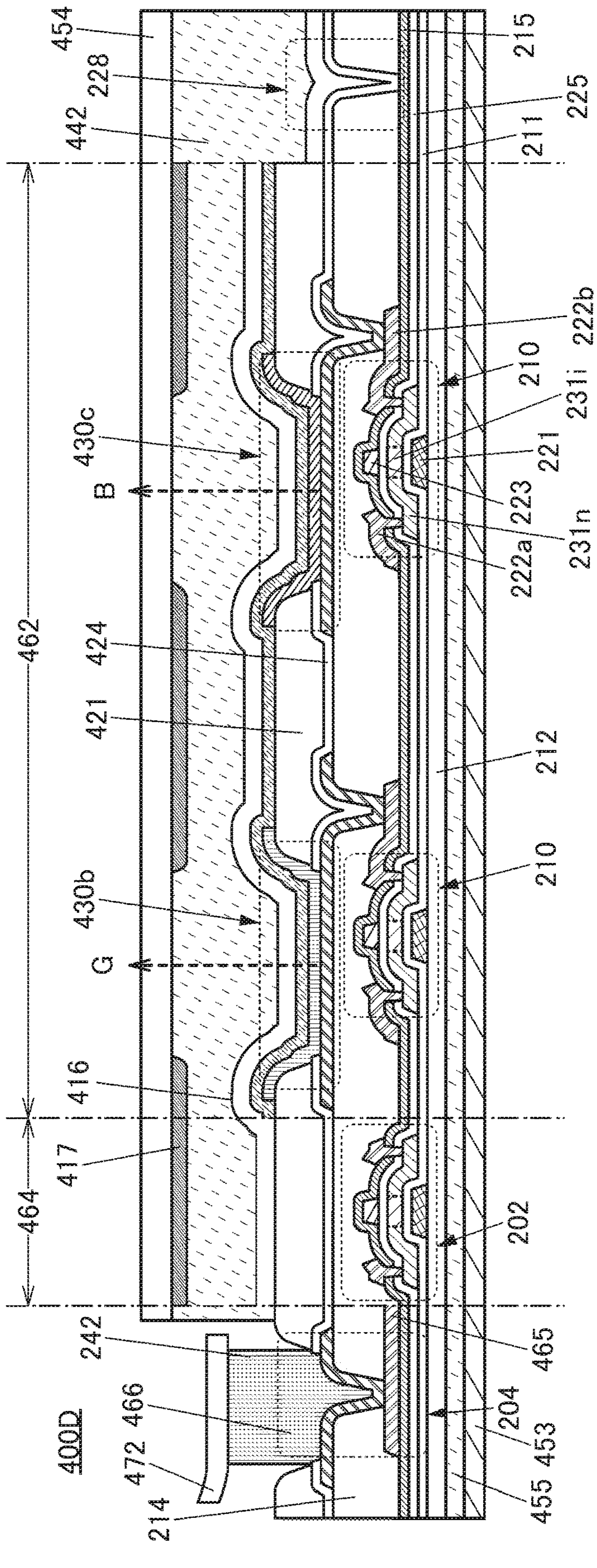
FIG. 29 is a cross-sectional view illustrating an example of a display device.

FIG. 29 is a cross-sectional view of a display device 400D. A perspective view of the display device 400D is similar to that of the display device 400C illustrated in FIG. 13. FIG. 29 illustrates an example of a cross section including part of a region including the FPC 472, part of the circuit 464, and part of the display portion 462 in the display device 400D. FIG. 29 specifically illustrates an example of a cross section of a region including the light-emitting element 430*b* that emits green light and the light-emitting element 430*c* that emits blue light in the display portion 462. Note that portions similar to those of the display device 400C are not described in some cases.

The display device 400D illustrated in FIG. 29 includes the transistor 202, the transistor 210, the light-emitting element 430*b*, the light-emitting element 430*c*, and the like between the substrate 453 and the substrate 454.

The substrate 454 and the protective layer 416 are bonded to each other with the adhesive layer 442. The adhesive layer 442 is provided to overlap with the light-emitting element 430*b* and the light-emitting element 430*c*; that is, the display device 400D employs a solid sealing structure.

The substrate 453 and the insulating layer 212 are bonded to each other with the adhesive layer 455.

In a manufacturing method of the display device 400D, first, a formation substrate provided with the insulating layer 212, the transistors, the light-emitting elements, and the like is bonded to the substrate 454 provided with the light-blocking layer 417 with the adhesive layer 442. Then, the substrate 453 is attached to a surface exposed by separation of the formation substrate, whereby the components formed over the formation substrate are transferred onto the substrate 453. The substrate 453 and the substrate 454 preferably have flexibility. This can increase the flexibility of the display device 400D.

The inorganic insulating film that can be used for the insulating layer 211, the insulating layer 213, and the insulating layer 215 can be used for the insulating layer 212.

The pixel electrode is connected to the conductive layer 222*b* included in the transistor 210 through an opening provided in the insulating layer 214. The transistor 210 has a function of controlling driving of the light-emitting element.

An end portion of the pixel electrode is covered with the partition (the insulating layer 424 or the insulating layer 421). For the details of the partition, other descriptions in this specification can be referred to.

Light emitted by the light-emitting element 430*b* and the light-emitting element 430*c* is emitted toward the substrate 454 side. For the substrate 454, a material having a high transmitting property with respect to visible light is preferably used.

The connection portion 204 is provided in a region of the substrate 453 that does not overlap with the substrate 454. In the connection portion 204, the wiring 465 is electrically connected to the FPC 472 through the conductive layer 466 and the connection layer 242. The conductive layer 466 can be obtained by processing the same conductive film as the pixel electrode. Thus, the connection portion 204 and the FPC 472 can be electrically connected to each other through the connection layer 242.

At least part of the structure examples, the drawings corresponding thereto, and the like described in this embodiment can be combined with the other structure examples, the other drawings, and the like as appropriate.

At least part of this embodiment can be implemented in combination with the other embodiments described in this specification as appropriate.

Embodiment 10

In this embodiment, light-emitting elements (also referred to as light-emitting devices) that can be used in the display device of one embodiment of the present invention are described.

In this specification and the like, a device manufactured using a metal mask or an FMM (fine metal mask) is sometimes referred to as a device having an MM (metal mask) structure. In this specification and the like, a device manufactured without using a metal mask or an FMM is sometimes referred to as a device having an MML (metal maskless) structure.

In this specification and the like, a structure in which light-emitting layers in light-emitting devices of different colors (here, blue (B), green (G), and red (R)) are separately formed or separately patterned is sometimes referred to as an SBS (Side By Side) structure. In this specification and the like, a light-emitting device capable of emitting white light is sometimes referred to as a white-light-emitting device. Note that a combination of white-light-emitting devices with coloring layers (e.g., color filters) enables a full-color display device.

Structures of light-emitting devices can be classified roughly into a single structure and a tandem structure. A device with a single structure includes one light-emitting unit between a pair of electrodes, and the light-emitting unit preferably includes one or more light-emitting layers. To obtain white light emission in a single structure, two or more light-emitting layers are selected such that emission colors of the light-emitting layers are complementary colors. For example, when emission colors of a first light-emitting layer and a second light-emitting layer are complementary colors, the light-emitting device can be configured to emit white light as a whole. The same applies to a light-emitting device including three or more light-emitting layers.

A device with a tandem structure includes two or more light-emitting units between a pair of electrodes, and each light-emitting unit preferably includes one or more light-emitting layers. When light-emitting layers that emit light of the same color are used in each light-emitting unit, luminance per predetermined current can be increased, and the light-emitting device can have higher reliability than that with a single structure. To obtain white light emission in a tandem structure, the structure is made so that light from light-emitting layers of the plurality of light-emitting units can be combined to be white light. Note that a combination of emission colors for obtaining white light emission is similar to a structure in the case of a single structure. In the device with a tandem structure, an intermediate layer such as a charge-generation layer is suitably provided between the plurality of light-emitting units.

When the white-light-emitting device (having a single structure or a tandem structure) and a light-emitting device having an SBS structure are compared to each other, the light-emitting device having an SBS structure can have lower power consumption than the white-light-emitting device. To reduce power consumption, a light-emitting device having an SBS structure is preferably used. Meanwhile, the white-light-emitting device is preferable in terms of lower manufacturing cost or higher manufacturing yield because the manufacturing process of the white-light-emitting device is simpler than that of a light-emitting device having an SBS structure.

<Structure Examples of Light-Emitting Element>

Figure 30A:
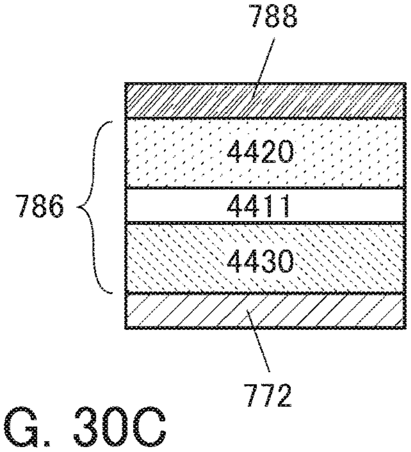
FIG. 30A to FIG. 30F are diagrams illustrating structure examples of a light-emitting element.

As illustrated in FIG. 30A, the light-emitting element includes an EL layer 786 between a pair of electrodes (a lower electrode 772 and an upper electrode 788). The EL layer 786 can be formed of a plurality of layers such as a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer). The layer 4430 preferably includes a region in contact with an end portion of the partition (the insulating layer 134 or the insulating layer 131) disclosed in this specification.

The structure including the layer 4420, the light-emitting layer 4411, and the layer 4430, which is provided between the pair of electrodes, can function as a single light-emitting unit, and the structure in FIG. 30A is referred to as a single structure in this specification.

Figure 30B:
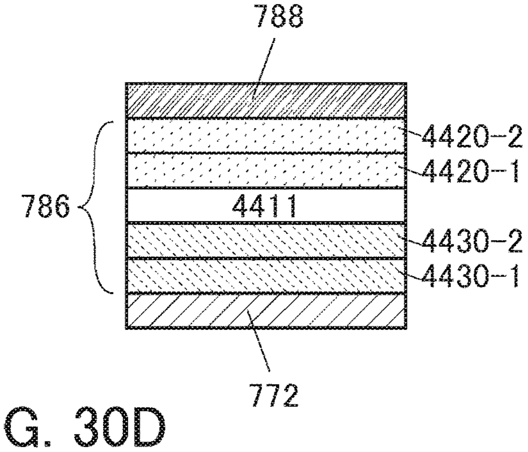

FIG. 30B is a variation example of the EL layer 786 included in the light-emitting element illustrated in FIG. 30A. Specifically, the light-emitting element illustrated in FIG. 30B includes a layer 4430-1 over the lower electrode 772, a layer 4430-2 over the layer 4430-1, the light-emitting layer 4411 over the layer 4430-2, a layer 4420-1 over the light-emitting layer 4411, a layer 4420-2 over the layer 4420-1, and the upper electrode 788 over the layer 4420-2. For example, when the lower electrode 772 functions as an anode and the upper electrode 788 functions as a cathode, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, when the lower electrode 772 functions as a cathode and the upper electrode 788 functions as an anode, the layer 4430-1 functions as an electron-injection layer, the layer 4430-2 functions as an electron-transport layer, the layer 4420-1 functions as a hole-transport layer, and the layer 4420-2 functions as a hole-injection layer. With such a layered structure, carriers can be efficiently injected to the light-emitting layer 4411, and the efficiency of the recombination of carriers in the light-emitting layer 4411 can be enhanced.

Figure 30C:
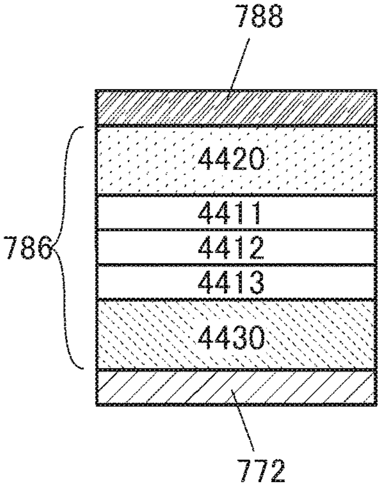
Figure 30D:
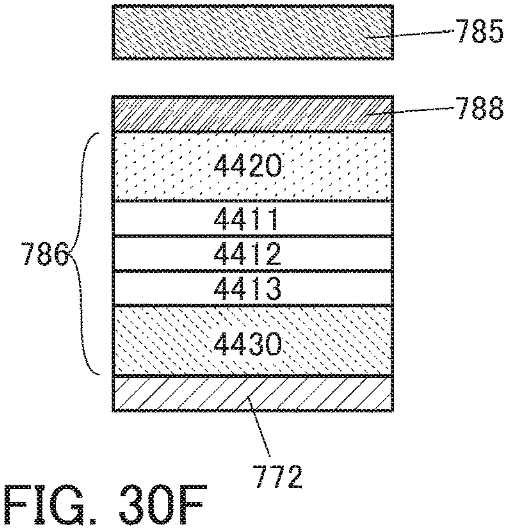

Note that the structure in which a plurality of light-emitting layers (light-emitting layers 4411, 4412, and 4413) are provided between the layer 4420 and the layer 4430 as illustrated in FIG. 30C and FIG. 30D is a variation of the single structure.

Figure 30E:
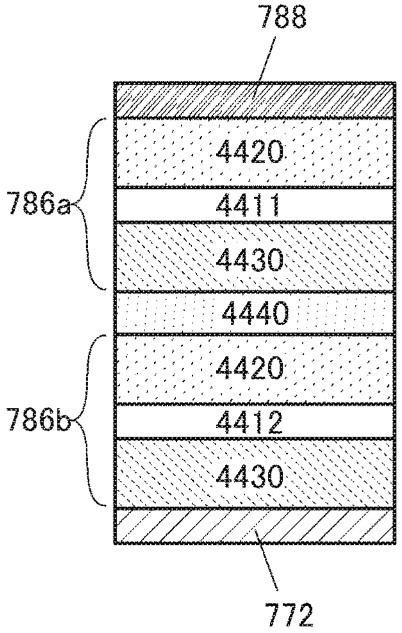
Figure 30F:
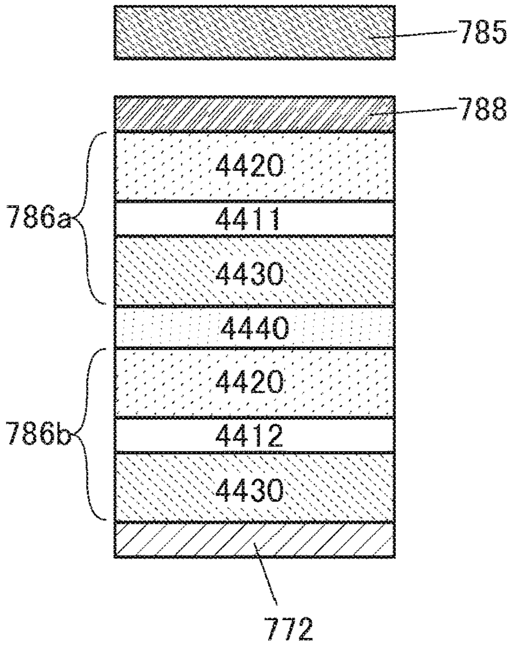

The structure in which a plurality of light-emitting units (an EL layer 786*a* and an EL layer 786*b*) are connected in series with an intermediate layer (charge-generation layer) 4440 therebetween as illustrated in FIG. 30E and FIG. 30F is referred to as a tandem structure in this specification. In this specification and the like, the structure illustrated in FIG. 30E and FIG. 30F is referred to as a tandem structure; however, without being limited to this, a tandem structure may be referred to as a stack structure, for example. The tandem structure enables a light-emitting element capable of high luminance light emission.

In FIG. 30C, a light-emitting material that emits the same light may be used for the light-emitting layer 4411, the light-emitting layer 4412, and the light-emitting layer 4413.

Alternatively, different light-emitting materials may be used for the light-emitting layer 4411, the light-emitting layer 4412, and the light-emitting layer 4413. White light can be obtained when the light-emitting layer 4411, the light-emitting layer 4412, and the light-emitting layer 4413 emit light of complementary colors. FIG. 30D illustrates an example in which a coloring layer 785 functioning as a color filter is provided. When white light passes through a color filter, light of a desired color can be obtained. A color filter may include a region overlapping with the end portion of the partition (e.g., the insulating layer 134 or the insulating layer 131) disclosed in this specification. Without limitation to this, the color filter does not necessarily include the overlapping region.

In FIG. 30E, the same light-emitting material may be used for the light-emitting layer 4411 and the light-emitting layer 4412. Alternatively, light-emitting materials that emit light of different colors may be used for the light-emitting layer 4411 and the light-emitting layer 4412. White light can be obtained when the light-emitting layer 4411 and the light-emitting layer 4412 emit light of complementary colors. FIG. 30F illustrates an example in which the coloring layer 785 is further provided.

Also in the structures illustrated in FIG. 30C, FIG. 30D, FIG. 30E, and FIG. 30F, the layers 4420 and the layers 4430 may each have a stacked-layer structure of two or more layers as illustrated in FIG. 30B.

A structure in which light-emitting elements that emit light of different colors (here, blue (B), green (G), and red (R)) are separately formed is referred to as an SBS (Side By Side) structure in some cases.

The emission color of the light-emitting element can be red, green, blue, cyan, magenta, yellow, white, or the like depending on the material contained in the EL layer 786. Furthermore, the color purity can be further increased when the light-emitting element has a microcavity structure.

The light-emitting element that emits white light preferably contains two or more kinds of light-emitting substances in the light-emitting layer. To obtain white light emission, two or more kinds of light-emitting substances are selected such that their emission colors are complementary. For example, when emission colors of a first light-emitting layer and a second light-emitting layer are complementary colors, the light-emitting element can be configured to emit white light as a whole. The same applies to a light-emitting element including three or more light-emitting layers.

The light-emitting layer preferably contains two or more selected from light-emitting substances that emit light of red (R), green (G), blue (B), yellow (Y), orange (0), and the like. Alternatively, the light-emitting layer preferably contains two or more light-emitting substances that emit light containing two or more of spectral components of R, G, and B.

Here, a specific structure example of a light-emitting element is described.

The light-emitting element includes at least the light-emitting layer. The light-emitting element may further include, as a layer other than the light-emitting layer, a layer containing a substance with a high hole-injection property, a substance with a high hole-transport property, a hole-blocking material, a substance with a high electron-transport property, an electron-blocking material, a substance with a high electron-injection property, a substance with a bipolar property (a substance with a high electron-transport property and a high hole-transport property), or the like.

Either a low molecular compound or a high molecular compound can be used for the light-emitting device, and an inorganic compound may also be included. Each layer included in the light-emitting device can be formed by an evaporation method (including a vacuum evaporation method), a transfer method, a printing method, an inkjet method, a coating method, or the like.

For example, the light-emitting device can include one or more of a hole-injection layer, a hole-transport layer, a hole-blocking layer, an electron-blocking layer, an electron-transport layer, and an electron-injection layer.

The hole-injection layer is a layer injecting holes from an anode to the hole-transport layer, and a layer containing a material with a high hole-injection property. For the material with a high hole-injection property, an aromatic amine compound and a composite material containing a hole-transport material and an acceptor material (electron-accepting material), and the like can be given.

The hole-transport layer is a layer transporting holes, which are injected from the anode by the hole-injection layer, to the light-emitting layer. The hole-transport layer is a layer containing a hole-transport material. For the hole-transport material, a substance having a hole mobility greater than or equal to $1\times10^{-6}$ $cm^2/Vs$ is preferable. Note that other substances can also be used as long as they have a property of transporting more holes than electrons. For the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferable.

The electron-transport layer is a layer that transports electrons, which are injected from a cathode by the electron-injection layer, to the light-emitting layer. The electron-transport layer is a layer containing an electron-transport material. For the electron-transport material, a substance having an electron mobility greater than or equal to $1\times10^{-6}$ $cm^2/Vs$ is preferable. Note that other substances can also be used as long as they have a property of transporting more electrons than holes. For the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The electron-injection layer is a layer injecting electrons from the cathode to the electron-transport layer, and a layer containing a material with a high electron-injection property. For the material with a high electron-injection property, an alkali metal, an alkaline earth metal, or a compound thereof can be used. For the material with a high electron-injection property, a composite material containing an electron-transport material and a donor material (electron-donating material) can also be used.

For the electron-injection layer, for example, an alkali metal, an alkaline earth metal, or a compound thereof, such as lithium, cesium, lithium fluoride (LiF), cesium fluoride (CsF), calcium fluoride ($CaF_2$), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide ($LiO_x$), or cesium carbonate can be used.

Alternatively, for the electron-injection layer, an electron-transport material may be used. For example, a compound having an unshared electron pair and having an electron deficient heteroaromatic ring can be used as the electron-transport material. Specifically, a compound having at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound having an unshared electron pair is preferably greater than or equal to −3.6 eV and less than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino [2,3-a: 2',3'-c]phenazine (abbreviation: HATNA), 2,4,6-tris [3'-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

The light-emitting layer is a layer containing a light-emitting substance. The light-emitting layer can contain one or more kinds of light-emitting substances. For the light-emitting substance, a substance that exhibits an emission color of blue, purple, bluish purple, green, yellowish green, yellow, orange, red, or the like is appropriately used. For the light-emitting substance, a substance that emits near-infrared light can also be used.

Examples of the light-emitting substances include a fluorescent material, a phosphorescent material, a TADF material, and a quantum dot material.

Examples of the fluorescent materials include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material and an assist material) in addition to the light-emitting substance (a guest material). For one or more kinds of organic compounds, one or both of the hole-transport material and the electron-transport material can be used. Alternatively, as one or more kinds of organic compounds, a bipolar material or a TADF material may be used.

The light-emitting layer preferably contains, for example, a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected to form an exciplex that exhibits light emission whose wavelength overlaps with the wavelength of a lowest-energy-side absorption band of the light-emitting substance, energy can be transferred smoothly and light emission can be obtained efficiently. With this structure, high efficiency, low-voltage driving, and a long lifetime of the light-emitting device can be achieved at the same time.

At least part of the structure examples, the drawings corresponding thereto, and the like described in this embodiment can be combined with the other structure examples, the other drawings, and the like as appropriate.

At least part of this embodiment can be implemented in combination with the other embodiments described in this specification as appropriate.

Embodiment 11

In this embodiment, a high-resolution display device is described.

[Structure Example of Display Panel]

Wearable electronic devices for VR, AR, and the like can provide 3D images by using parallax. In that case, it is necessary to display an image for the right eye in the right eye's field of view and display an image for the left eye in the left eye's field of view. Although the shape of a display portion in a display device may be a horizontal rectangular shape, pixels provided outside the range of vision of both eyes do not contribute to display, and thus black is always displayed in these pixels.

In view of the above, it is preferred that a display portion of a display panel be divided into two regions for the right eye and for the left eye, and that pixels not be provided in an outer region which does not contribute to display. Hence, power consumption needed for writing to pixels can be reduced. Moreover, loads on source lines, gate lines, and the like are reduced, so that display with a high frame rate is possible. Consequently, smooth moving images can be displayed, which improves sense of reality.

Figure 31A:
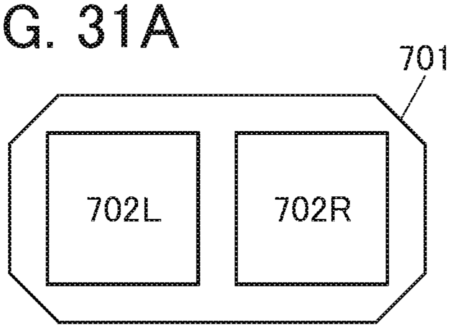
FIG. 31A to FIG. 31J are diagrams illustrating structure examples of a display device.

FIG. 31A illustrates a structure example of a display panel. In FIG. 31A, a display portion 702L for the left eye and a display portion 702R for the right eye are provided inward from a substrate 701. Note that in addition to the display portion 702L and the display portion 702R, a driver circuit, a wiring, an IC, an FPC, or the like may be provided over the substrate 701.

The display portion 702L and the display portion 702R illustrated in FIG. 31A have a square top surface shape.

Figure 31B:
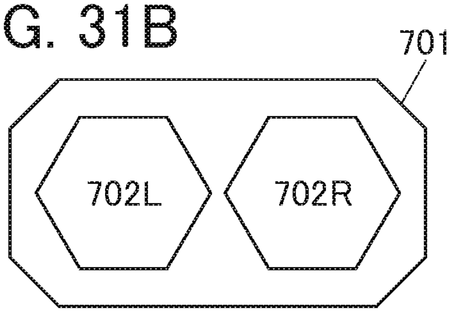
Figure 31C:
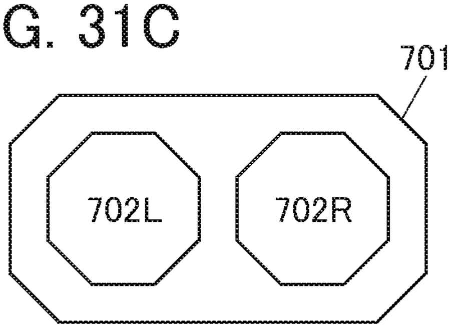
Figure 31D:
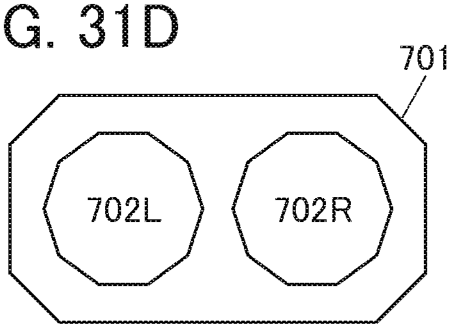
Figure 31E:
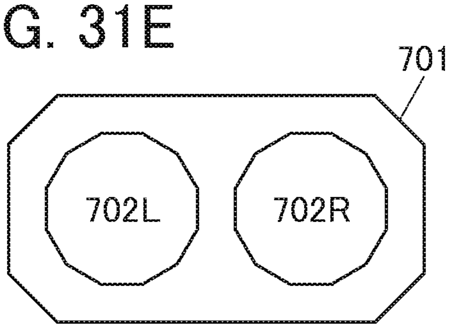

The top surface shapes of the display portion 702L and the display portion 702R may be other regular polygons. FIG. 31B illustrates an example in which the top surface shape is a regular hexagon; FIG. 31C illustrates an example in which the top surface shape is a regular octagon; FIG. 31D illustrates an example in which the top surface shape is a regular decagon; and FIG. 31E illustrates an example in which the top surface shape is a regular dodecagon. When a polygon with even-numbered corners is used as above, the shape of the display portion can be bilaterally symmetrical. Note that a polygon that is not a regular polygon may be used. Moreover, a regular polygon or a polygon with rounded corners may be used.

Since the display portion consists of pixels arranged in a matrix, a linear portion of the outline of the display portion is not strictly a straight line and can be partly a stair-like portion. In particular, a linear portion that is not parallel to the direction of pixel arrangement has a stair-like top surface shape. Since the user watches images without perceiving the shape of the pixels, a tilted outline, which is stair-like to be exact, of the display portion can be regarded as a straight line. Similarly, a curved portion, which is stair-like to be exact, of the outline of the display portion can be regarded as a curve.

Figure 31F:
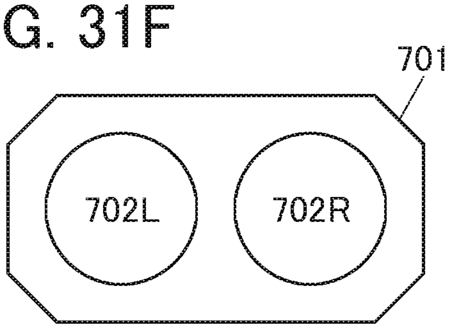

FIG. 31F illustrates an example in which the top surface shapes of the display portion 702L and the display portion 702R are circular.

The top surface shapes of the display portion 702L and the display portion 702R may be bilaterally asymmetrical. Moreover, the top surface shapes are not necessarily regular polygonal.

Figure 31G:
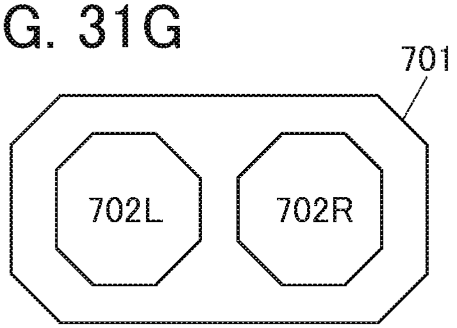
Figure 31H:
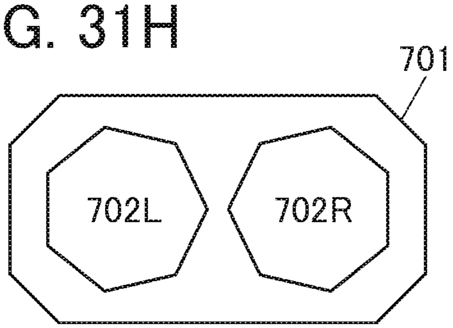

FIG. 31G illustrates an example in which the top surface shapes of the display portion 702L and the display portion 702R are bilaterally asymmetric octagonal. FIG. 31H illustrates an example in which the top surface shape is regular heptagonal. Even when the top surface shapes of the display portion 702L and the display portion 702R have a bilaterally asymmetrical shape in this manner, the display portion 702L and the display portion 702R are preferably arranged bilaterally symmetrically. Consequently, an image with no unnaturalness can be provided.

Although the structures where the display portion is divided into two are described above, the display portions may have a continuous shape.

Figure 31I:
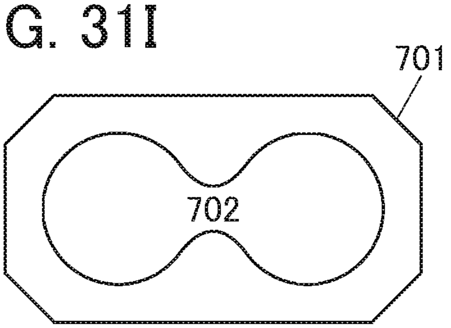
Figure 31J:
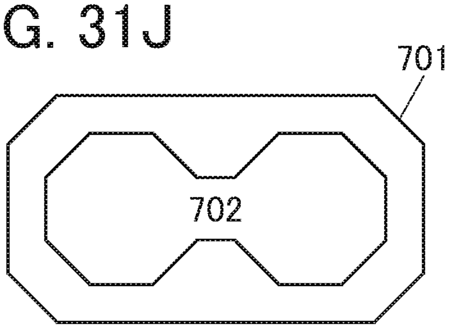

FIG. 31I illustrates an example in which the two circular display portions in FIG. 31F are connected. FIG. 31J illustrates an example in which the two regular octagonal display portions in FIG. 31C are connected.

The above is the description of the structure examples of the display panel.

At least part of the structure examples, the drawings corresponding thereto, and the like described in this embodiment can be combined with the other structure examples, the other drawings, and the like as appropriate.

At least part of this embodiment can be implemented in combination with the other embodiments described in this specification as appropriate.

Embodiment 12

In this embodiment, a metal oxide (also referred to as an oxide semiconductor) that can be used in the OS transistor described in the above embodiment is described.

The metal oxide used in the OS transistor preferably contains at least indium or zinc, and further preferably contains indium and zinc. The metal oxide preferably contains indium, M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. Specifically, Mis preferably one or more kinds selected from gallium, aluminum, yttrium, and tin, and further preferably M is gallium.

The metal oxide can be formed by a sputtering method, a chemical vapor deposition (CVD) method such as a metal organic chemical vapor deposition (MOCVD) method, an atomic layer deposition (ALD) method, or the like.

Hereinafter, an oxide containing indium (In), gallium (Ga), and zinc (Zn) is described as an example of the metal oxide. Note that an oxide containing indium (In), gallium (Ga), and zinc (Zn) may be referred to as an In—Ga—Zn oxide.

<Classification of Crystal Structure>

Amorphous (including a completely amorphous structure), CAAC (c-axis-aligned crystalline), nc (nanocrystalline), CAC (cloud-aligned composite), single-crystal, and polycrystalline (poly crystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method. The XRD spectrum obtained by GIXD measurement may be hereinafter simply referred to as an XRD spectrum.

For example, the XRD spectrum of the quartz glass substrate shows a peak with a substantially bilaterally symmetrical shape. On the other hand, the peak of the XRD spectrum of the In—Ga—Zn oxide film having a crystal structure has a bilaterally asymmetrical shape. The bilaterally asymmetrical peak of the XRD spectrum clearly shows the existence of crystals in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the In—Ga—Zn oxide film deposited at room temperature. Thus, it is suggested that the In—Ga—Zn oxide film deposited at room temperature is in an intermediate state, which is neither a single crystal nor polycrystal nor an amorphous state, and it cannot be concluded that In—Ga—Zn oxide film is in an amorphous state.

«Structure of Oxide Semiconductor»

Note that oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductors include the above-described CAAC-OS and nc-OS. Other examples of the non-single-crystal oxide semiconductors include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor having a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In—Ga—Zn oxide, the CAAC-OS tends to have a layered crystal structure (also referred to as a layered structure) in which a layer containing indium (In) and oxygen (hereinafter, an In layer) and a layer containing gallium (Ga), zinc (Zn), and oxygen (hereinafter, a (Ga,Zn) layer) are stacked. Indium and gallium can be replaced with each other. Therefore, indium may be contained in the (Ga,Zn) layer. In addition, gallium may be contained in the In layer. Note that zinc may be contained in the In layer. Such a layered structure is observed as a lattice image in a high-resolution TEM (Transmission Electron Microscope) image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and traps carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor having small amounts of impurities and defects (e.g., oxygen vacancies). Thus, an oxide semiconductor including the CAAC-OS is physically stable.

Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of flexibility of the manufacturing process.

[nc-OS]

In the nc-OS, a microscopic region (e.g., a region with a size greater than or equal to 1 nm and less than or equal to 10 nm, specifically, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter greater than the diameter of a nanocrystal (e.g., greater than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or less than the diameter of a nanocrystal (e.g., greater than or equal to 1 nm and less than or equal to 30 nm).

[a-Like OS]

The a-like OS is an oxide semiconductor having a structure between those of the nc-OS and the amorphous oxide semiconductor. The a-like OS has a void or a low-density region. That is, the a-like OS has low crystallinity as compared with the nc-OS and the CAAC-OS. Moreover, the a-like OS has a higher hydrogen concentration in the film than the nc-OS and the CAAC-OS.

«Structure of Oxide Semiconductor»

Next, the above-described CAC-OS is described in detail. Note that the CAC-OS relates to the material composition.

[CAC-OS]

The CAC-OS refers to one composition of a material in which elements included in a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has [In] higher than [In] in the second region and [Ga] lower than [Ga] in the second region. Moreover, the second region has [Ga] higher than [Ga] in the first region and [In] lower than [In] in the first region.

Specifically, the first region includes indium oxide, indium zinc oxide, or the like as its main component. The second region includes gallium oxide, gallium zinc oxide, or the like as its main component. That is, the first region can be rephrased as a region containing In as its main component. The second region can be rephrased as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof and these regions are randomly present to form a mosaic pattern. Thus, it is suggested that the CAC-OS has a structure in which metal elements are unevenly distributed.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used for a deposition gas. The proportion of the flow rate of an oxygen gas in the total flow rate of the deposition gas during deposition is preferably as low as possible. For example, the proportion of the flow rate of an oxygen gas in the total flow rate of the deposition gas is higher than or equal to 0% and lower than 30%, preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide like a cloud, high field-effect mobility (μ) can be achieved.

On the other hand, the second region has a higher insulating property than the first region. In other words, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (μ), and excellent switching operation can be achieved.

A transistor using the CAC-OS has high reliability. Thus, the CAC-OS is the most suitable for a variety of semiconductor devices such as display devices.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon. Note that impurities in an oxide semiconductor refer to, for example, elements other than the main components of an oxide semiconductor. For example, an element with a concentration lower than 0.1 atomic % can be regarded as an impurity.

<Impurities>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Accordingly, a transistor including an oxide semiconductor that contains alkali metal or alkaline earth metal tends to have normally-on characteristics. Thus, the concentration of alkali metal or alkaline earth metal in the oxide semiconductor, which is obtained by SIMS, is lower than or equal to $1\times10^{18}$ atoms/$cm^3$, preferably lower than or equal to $2\times10^{16}$ atoms/$cm^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$.

When an oxide semiconductor with sufficiently reduced impurities is used for the channel formation region of the transistor, stable electrical characteristics can be given.

At least part of this embodiment can be implemented in combination with the other embodiments described in this specification as appropriate.

Embodiment 13

In this embodiment, electronic devices of one embodiment of the present invention are described with reference to FIG. 32 to FIG. 35.

An electronic device in this embodiment includes the display device of one embodiment of the present invention. In the display device of one embodiment of the present invention, increases in resolution, definition, and sizes are easily achieved. Thus, the display device of one embodiment of the present invention can be used for a display portion of a variety of electronic devices.

The display device of one embodiment of the present invention can be manufactured at low cost, which leads to a reduction in the manufacturing cost of an electronic device.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or notebook personal computer, a monitor of a computer or the like, digital signage, and a large game machine such as a pachinko machine.

In particular, the display device of one embodiment of the present invention can have high resolution, and thus can be suitably used for an electronic device including a relatively small display portion. Examples of such an electronic devices include information terminals (wearable devices) such as watch-type and bracelet-type information terminals and wearable devices capable of being worn on the head, such as a VR device like a head-mounted display and a glasses-type AR device. Examples of wearable devices include an SR (Substitutional Reality) device and an MR (Mixed Reality) device.

The definition of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K2K (number of pixels: 3840×2160), or 8K4K (number of pixels: 7680×4320). In particular, definition of 4K2K, 8K4K, or higher is preferable. Furthermore, the pixel density (resolution) of the display device of one embodiment of the present invention is preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. With the display device with such high definition or high resolution, the electronic device can have higher realistic sensation, sense of depth, and the like in personal use such as portable use or home use.

The electronic device in this embodiment can be incorporated along a curved surface of an inside wall or an outside wall of a house or a building or the interior or the exterior of a car.

The electronic device in this embodiment may include an antenna. When a signal is received by the antenna, the electronic device can display a video, data, and the like on a display portion. When the electronic device includes the antenna and a secondary battery, the antenna may be used for contactless power transmission.

The electronic device in this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 32A:
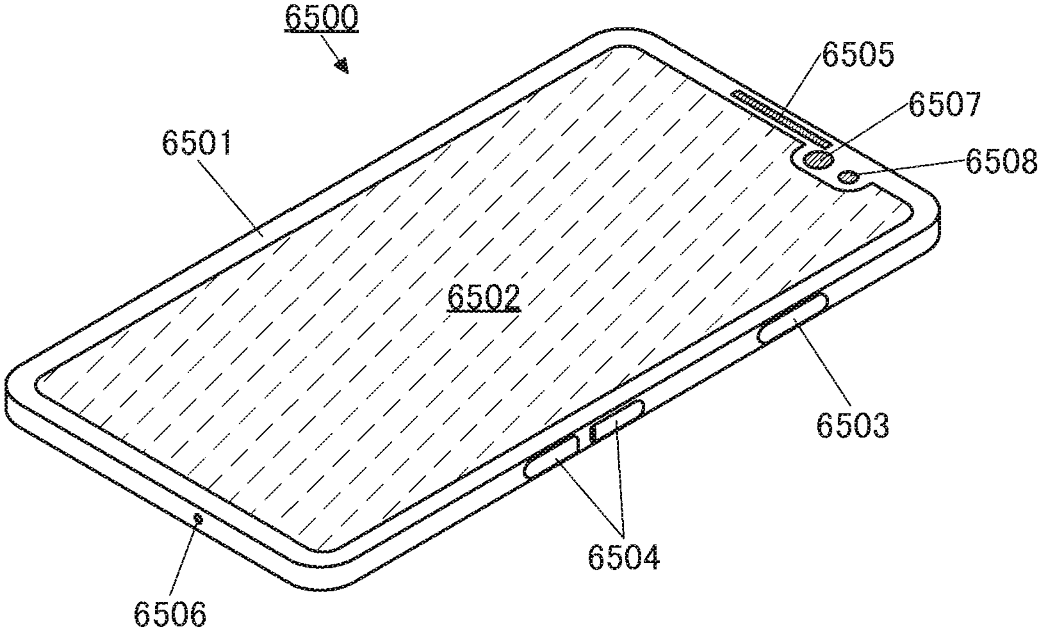
FIG. 32A and FIG. 32B are diagrams illustrating an example of an electronic device.

An electronic device 6500 illustrated in FIG. 32A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 32B:
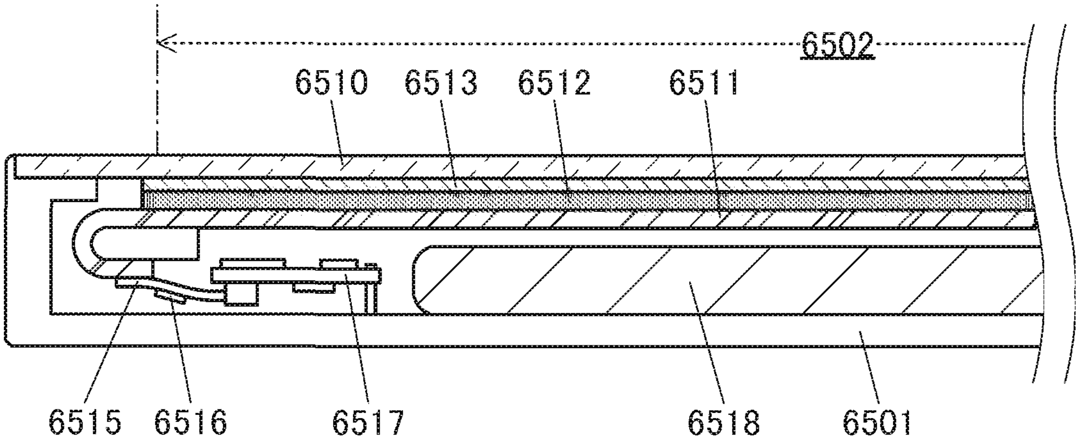

FIG. 32B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outward from the display portion 6502, and an FPC 6515 is connected to the part that is folded back. An IC 6516 is mounted on the FPC 6515. The FPC 6515 is connected to a terminal provided on the printed circuit board 6517.

A flexible display (a display device having flexibility) of one embodiment of the present invention can be used for the display panel 6511. Thus, an extremely lightweight electronic device can be provided. Since the display panel 6511 is extremely thin, the battery 6518 with high capacity can be mounted with the thickness of the electronic device controlled. An electronic device with a narrow frame can be obtained when part of the display panel 6511 is folded back so that the portion connected to the FPC 6515 is positioned on the rear side of a pixel portion.

Figure 33A:
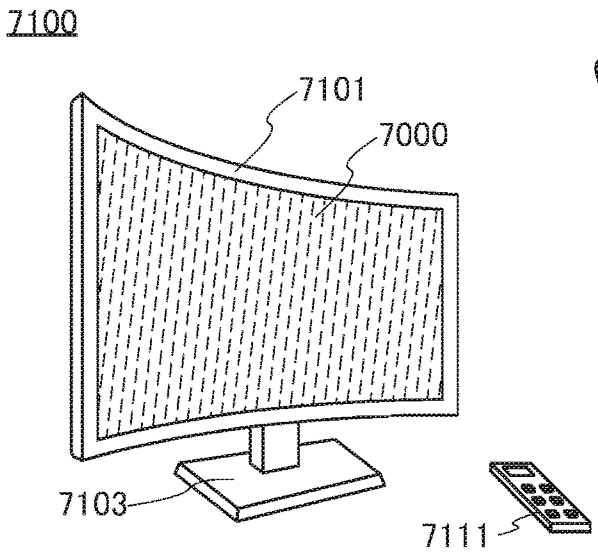
FIG. 33A to FIG. 33D are diagrams illustrating examples of electronic devices.

FIG. 33A illustrates an example of a television device. In a television device 7100, a display portion 7000 is incorporated in a housing 7101. Here, a structure in which the housing 7101 is supported by a stand 7103 is illustrated.

The display device of one embodiment of the present invention can be used in the display portion 7000.

Operation of the television device 7100 illustrated in FIG. 33A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying data output from the remote controller 7111. With operation keys or a touch panel provided in the remote controller 7111, channels and volume can be controlled and videos displayed on the display portion 7000 can be controlled.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 33B:
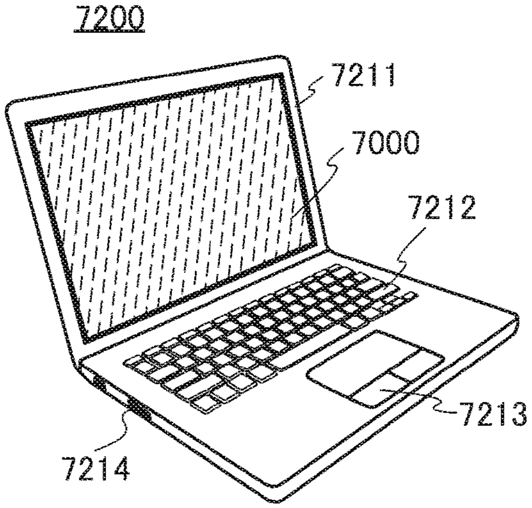

FIG. 33B illustrates an example of a notebook personal computer. A notebook personal computer 7200 includes a housing 7211, a keyboard 7212, a pointing device 7213, an external connection port 7214, and the like. In the housing 7211, the display portion 7000 is incorporated.

The display device of one embodiment of the present invention can be used in the display portion 7000.

Figure 33C:
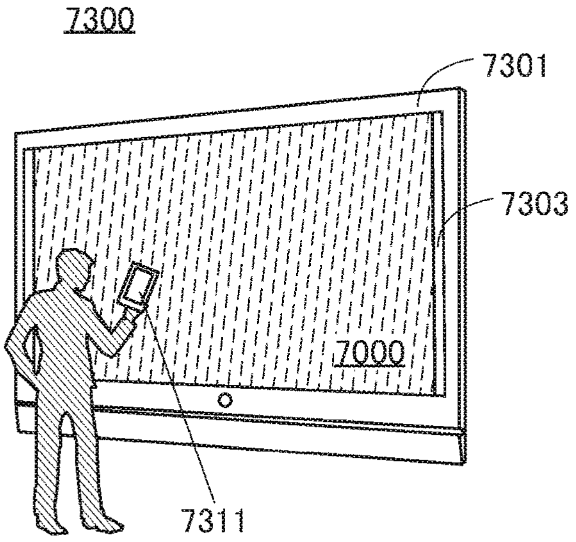
Figure 33D:
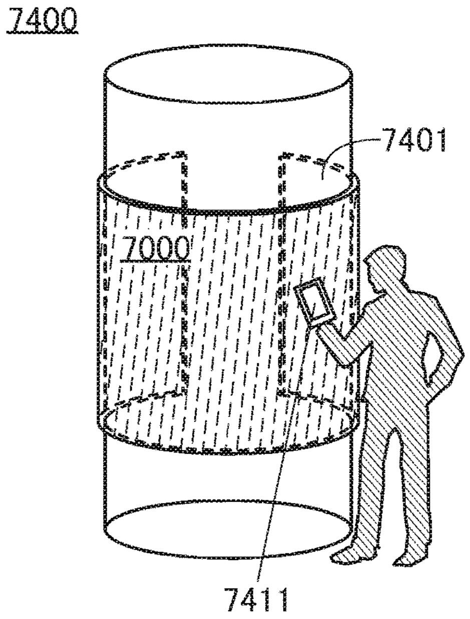

FIG. 33C and FIG. 33D illustrate examples of digital signage.

Digital signage 7300 illustrated in FIG. 33C includes a housing 7301, the display portion 7000, a speaker 7303, and the like. Furthermore, the digital signage 7300 can include an LED lamp, an operation key (including a power switch or an operation switch), a connection terminal, a variety of sensors, a microphone, and the like.

FIG. 33D is digital signage 7400 attached to a cylindrical pillar 7401. The digital signage 7400 includes the display portion 7000 provided along a curved surface of the pillar 7401.

The display device of one embodiment of the present invention can be used for the display portion 7000 in FIG. 33C and FIG. 33D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 33C and FIG. 33D, it is preferable that the digital signage 7300 or the digital signage 7400 can work with an information terminal 7311 or an information terminal 7411, such as a smartphone a user has, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Figure 34A:
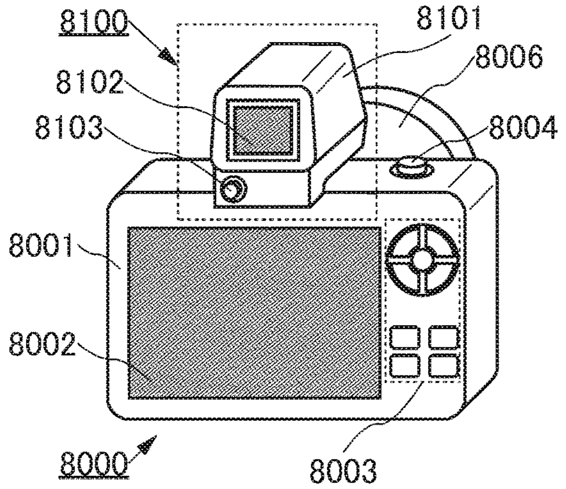
FIG. 34A to FIG. 34F are diagrams illustrating examples of electronic devices.

FIG. 34A is a diagram illustrating the appearance of a camera 8000 to which a finder 8100 is attached.

The camera 8000 includes a housing 8001, a display portion 8002, operation buttons 8003, a shutter button 8004, and the like. In addition, a detachable lens 8006 is attached to the camera 8000. Note that the lens 8006 and the housing 8001 may be integrated with each other in the camera 8000.

The camera 8000 can take images by the press of the shutter button 8004 or touch on the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 with the mount engaging with a mount of the camera 8000. In the finder 8100, a video or the like received from the camera 8000 can be displayed on the display portion 8102.

The button 8103 has a function of a power button or the like.

The display device of one embodiment of the present invention can be used for the display portion 8002 of the camera 8000 and the display portion 8102 of the finder 8100. Note that a finder may be incorporated in the camera 8000.

Figure 34B:
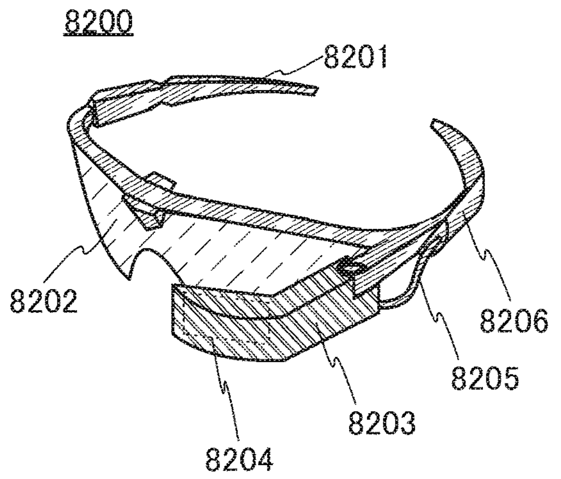

FIG. 34B is a diagram illustrating the appearance of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like and can display received video information on the display portion 8204. In addition, the main body 8203 is provided with a camera, and information on the movement of the user's eyeball or eyelid can be used as an input means.

The mounting portion 8201 may be provided with a plurality of electrodes capable of sensing current flowing in response to the movement of the user's eyeball in a position in contact with the user to have a function of recognizing the user's sight line. Furthermore, the mounting portion 8201 may have a function of monitoring the user's pulse with the use of current flowing through the electrodes. Moreover, the mounting portion 8201 may include a variety of sensors such as a temperature sensor, a pressure sensor, and an acceleration sensor to have a function of displaying the user's biological information on the display portion 8204, a function of changing a video displayed on the display portion 8204 in accordance with the movement of the user's head, or the like.

The display device of one embodiment of the present invention can be used in the display portion 8204.

Figure 34C:
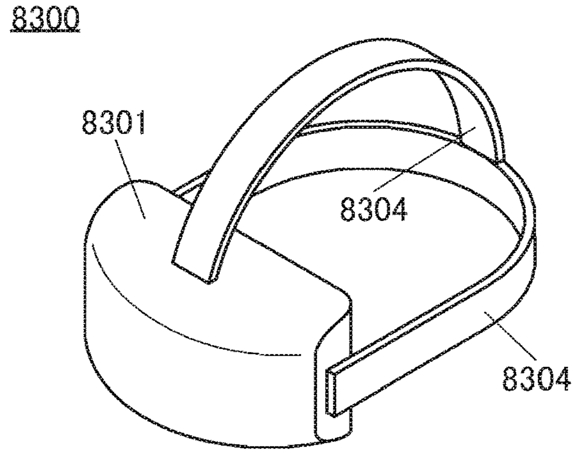
Figure 34D:
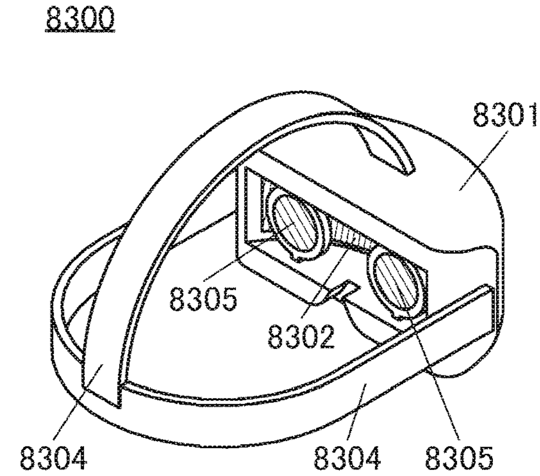
Figure 34E:
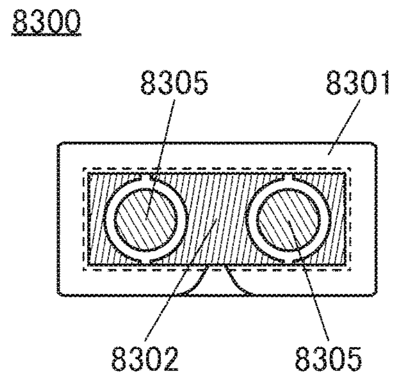

FIG. 34C to FIG. 34E are diagrams illustrating the appearance of a head-mounted display 8300. The head-mounted display 8300 includes a housing 8301, a display portion 8302, a fixing band 8304, and a pair of lenses 8305.

A user can perceive display on the display portion 8302 through the lenses 8305. Note that the display portion 8302 is preferably curved and placed because the user can feel a high realistic sensation. In addition, when another image displayed on a different region of the display portion 8302 is perceived through the lenses 8305, three-dimensional display using parallax, or the like can also be performed. Note that the number of display portions 8302 provided is not limited to one; two display portions 8302 may be provided so that one display portion is provided for one eye of the user.

The display device of one embodiment of the present invention can be used for the display portion 8302. The display device of one embodiment of the present invention can achieve extremely high resolution. For example, a pixel is not easily perceived by the user even when the user perceives display that is magnified by the use of the lenses 8305 as illustrated in FIG. 34E. In other words, a video with a strong sense of reality can be perceived by the user with the use of the display portion 8302.

Figure 34F:
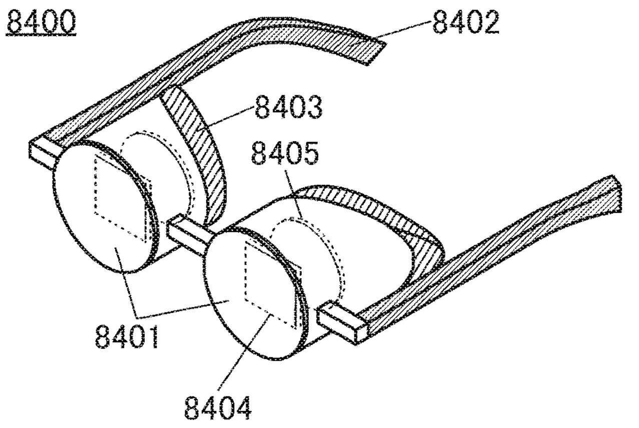

FIG. 34F is an external view of a goggle-type head-mounted display 8400. The head-mounted display 8400 includes a pair of housings 8401, a mounting portion 8402, and a cushion 8403. A display portion 8404 and a lens 8405 are provided in each of the pair of housings 8401. The pair of display portions 8404 may display different images, whereby three-dimensional display using parallax can be performed.

A user can perceive display on the display portion 8404 through the lenses 8405. The lens 8405 has a focus adjustment mechanism and the focus adjustment mechanism can adjust the position of the lenses 8405 according to the user's eyesight. The display portion 8404 is preferably a square or a horizontal rectangle. Accordingly, realistic sensation can be increased.

The mounting portion 8402 preferably has plasticity and elasticity to be adjusted to fit the size of the user's face and not to slide down. In addition, part of the mounting portion 8402 preferably has a vibration mechanism functioning as a bone conduction earphone. Thus, without additionally requiring an audio device such as earphones or a speaker, the user can enjoy video and sound only by wearing. Note that the housing 8401 may have a function of outputting sound data by wireless communication.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered with cloth, leather (natural leather or synthetic leather), or the like is used, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable because cleaning or replacement can be easily performed.

Electronic devices illustrated in FIG. 35A to FIG. 35G include a housing 9000, a display portion 9001, a speaker 9003, an operation key 9005 (including a power switch or an operation switch), a connection terminal 9006, a sensor 9007 (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 35A to FIG. 35G have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may each include a plurality of display portions. In addition, the electronic devices may each include a camera or the like and have a function of taking a still image or a moving image and storing the taken image in a recording medium (an external recording medium or a recording medium incorporated in the camera), a function of displaying the taken image on the display portion, or the like.

The display device of one embodiment of the present invention can be used in the display portion 9001.

The details of the electronic devices illustrated in FIG. 35A to FIG. 35G are described below.

Figure 35A:
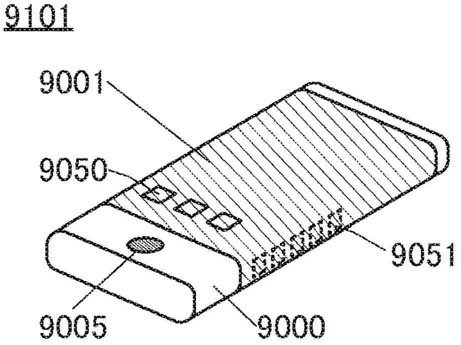
FIG. 35A to FIG. 35G are diagrams illustrating examples of electronic devices.

FIG. 35A is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display letters and image information on its plurality of surfaces. FIG. 35A illustrates an example in which three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 35D:
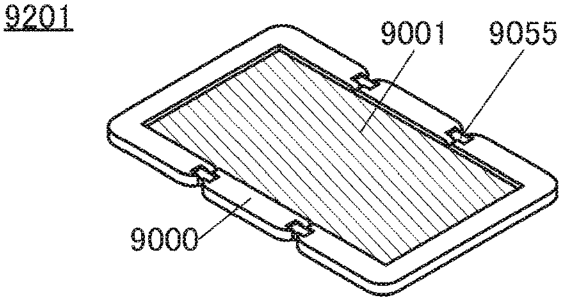
Figure 35B:
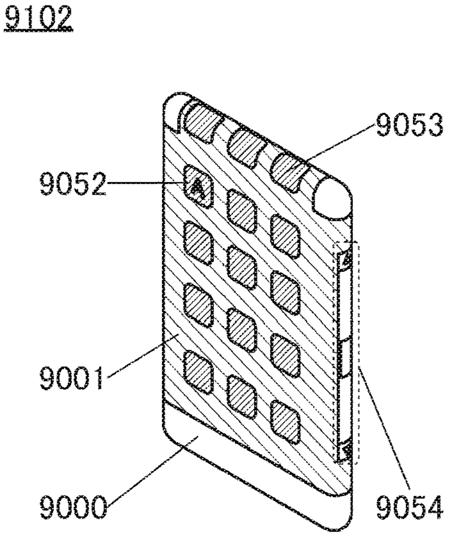

FIG. 35B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is illustrated. For example, the user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer a call, for example.

Figure 35E:
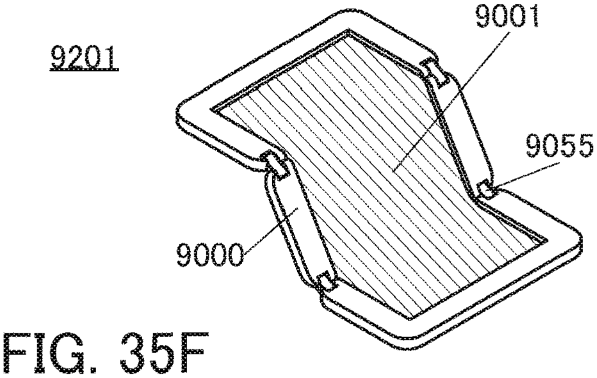
Figure 35F:
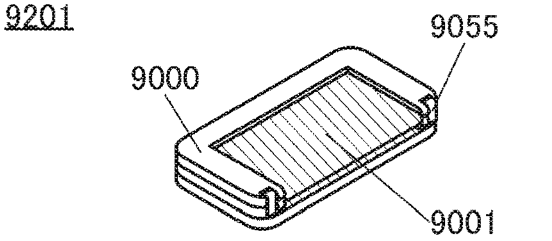
Figure 35C:
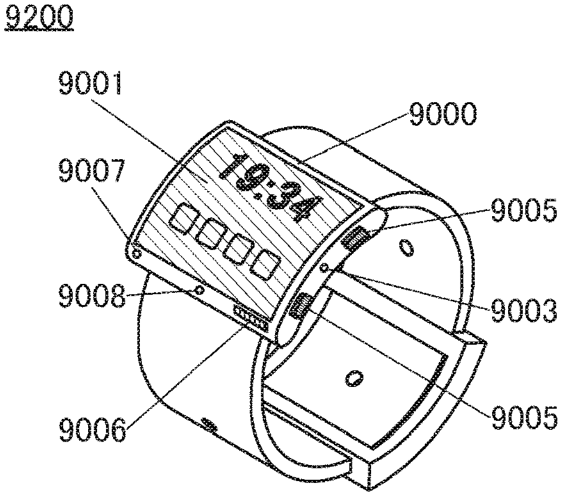
Figure 35G:
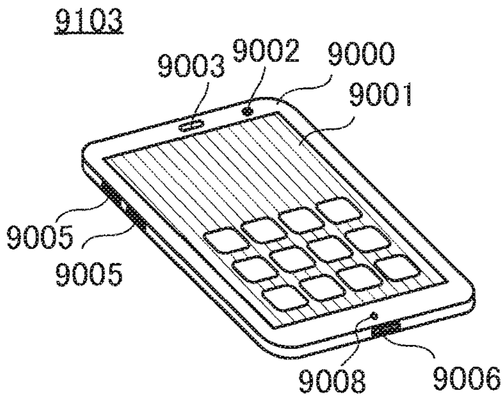

FIG. 35G is a perspective view of a tablet terminal 9103. The tablet terminal 9103 is capable of executing a variety of applications such as mobile phone calls, e-mailing, viewing and editing texts, music reproduction, Internet communication, and a computer game. The tablet terminal 9103 includes the display portion 9001, a camera 9002, the microphone 9008, and the speaker 9003 on the front surface of the housing 9000; the operation keys 9005 on the left side surface of the housing 9000; and the connection terminal 9006 on the bottom surface of the housing 9000.

FIG. 35C is a perspective view illustrating a watch-type portable information terminal 9200. The portable information terminal 9200 can be used as a smartwatch (registered trademark), for example. The display surface of the display portion 9001 is curved, and display can be performed on the curved display surface. Mutual communication between the portable information terminal 9200 and, for example, a headset capable of wireless communication enables hands-free calling. With the connection terminal 9006, the portable information terminal 9200 can perform mutual data transmission with another information terminal and can be charged. Note that the charging operation may be performed by wireless power feeding.

FIG. 35D to FIG. 35F are perspective views illustrating a foldable portable information terminal 9201. FIG. 35E is a perspective view of an opened state of the portable information terminal 9201, FIG. 35F is a perspective view of a folded state thereof, and FIG. 35F is a perspective view of a state in the middle of change from one of FIG. 35E and FIG. 35G to the other. The portable information terminal

9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature greater than or equal to 0.1 mm and less than or equal to 150 mm.

At least part of the structure examples, the manufacturing method examples, the drawings corresponding thereto, and the like described in this embodiment can be combined with the other structure examples, the other manufacturing method examples, the other drawings, and the like as appropriate. The terms or expressions used for describing the structure or manufacturing method in this specification can be appropriately used for defining another structure or manufacturing method.

At least part of this embodiment can be implemented in combination with the other embodiments described in this specification as appropriate.

REFERENCE NUMERALS

100: display device, 100A: display device, 100B: display device, 100C: display device, 100D: display device, 100E: display device, 100F: display device, 100G: display device, 100H: display device, 100J: display device, 100K: display device, 101: substrate, 110B: light-emitting element, 110G: light-emitting element, 110R: light-emitting element, 111*a*: conductive layer, 111*b*: conductive layer, 111B: pixel electrode, 111C: connection electrode, 111G: pixel electrode, 111R: pixel electrode, 112B: EL layer, 112Bf: EL film, 112G: EL layer, 112Gf: EL film, 112R: EL layer, 112Rf: EL film, 113: common electrode, 114: EL layer, 115B: optical adjustment layer, 115G: optical adjustment layer, 115R: optical adjustment layer, 116B: conductive layer, 116G: conductive layer, 116R: conductive layer, 117R: region, 118R: region, 119R: region, 121: protective layer, 130: connection portion, 131: insulating layer, 131*f*: insulating film, 132: insulating layer, 132*a*: insulating layer, 132*b*: insulating layer, 132*f*: insulating film, 133: space, 134: insulating layer, 134*a*: insulating layer, 134*b*: insulating layer, 134*f*: insulating film, 141: resist mask, 141*f*: resist film, 143*a*: resist mask, 143*b*: resist mask, 143*c*: resist mask, 144*a*: sacrificial film, 144*b*: sacrificial film, 144*c*: sacrificial film, 145: sacrificial layer, 145*a*: sacrificial layer, 145*b*: sacrificial layer, 145*c*: sacrificial layer, 146*a*: sacrificial film, 146*b*: sacrificial film, 146*c*: sacrificial film, 147: sacrificial layer, 147*a*: sacrificial layer, 147*b*: sacrificial layer, 147*c*: sacrificial layer, 151: photomask, 152: light, 153: light, 161: layer, 162: insulating layer, 163: contact hole, 201: transistor, 202: transistor, 204: connection portion, 205: transistor, 209: transistor, 210: transistor, 211: insulating layer, 212: insulating layer, 213: insulating layer, 214: insulating layer, 215: insulating layer, 218: insulating layer, 221: conductive layer, 222*a*: conductive layer, 222*b*: conductive layer, 223: conductive layer, 225: insulating layer, 228: region, 231: semiconductor layer, 231*i*: channel formation region, 231*n*: low-resistance region, 242: connection layer, 400A: display device, 400B: display device, 400C: display device, 400D: display device, 411*a*: pixel electrode, 411*b*: pixel electrode, 411*c*: pixel electrode, 413: common electrode, 416: protective layer, 416*a*: inorganic insulating layer, 416*b*: organic insulating layer, 416*c*: inorganic insulating layer, 417: light-blocking layer, 421: insulating layer, 422: insulating layer, 424: insulating layer, 426*a*: optical adjustment layer, 426*b*: optical adjustment layer, 426*c*: optical adjustment layer, 430*a*: light-emitting element, 430*b*: light-emitting element, 430*c*: light-emitting element, 442: adhesive layer, 443: space, 451: substrate, 452: substrate, 453: substrate, 454: substrate, 455: adhesive layer, 462: display portion, 464: circuit, 465: wiring, 466: conductive layer, 472: FPC, 473: IC, 701: substrate, 702L: display portion, 702R: display portion, 772: lower electrode, 785: coloring layer, 786: EL layer, 786*a*: EL layer, 786*b*: EL layer, 788: upper electrode, 4411: light-emitting layer, 4412: light-emitting layer, 4413: light-emitting layer, 4420: layer, 4420-1: layer, 4420-2: layer, 4430: layer, 4430-1: layer, 4430-2: layer, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: separate remote controller, 7200: notebook personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing band, 8305: lens, 8400: head-mounted display, 8401: housing, 8402: mounting portion, 8403: cushion, 8404: display portion, 8405: lens, 9000: housing, 9001: display portion, 9002: camera, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. A display device comprising:

a first display element comprising a first pixel electrode, a first EL layer, and a common electrode;

a second display element comprising a second pixel electrode, a second EL layer, and the common electrode;

a first insulating layer covering an end portion of the first pixel electrode and an end portion of the second pixel electrode;

a second insulating layer over the first insulating layer; and a third insulating layer over the second insulating layer, wherein the first EL layer is placed over the first pixel electrode and the third insulating layer, and wherein the second EL layer is placed over the second pixel electrode and the third insulating layer.

2. The display device according to claim 1, wherein the third insulating layer comprises a region in contact with the first insulating layer over the first pixel electrode.

3. The display device according to claim 1, wherein the first insulating layer and the third insulating layer comprise an inorganic material, and wherein the second insulating layer comprises an organic material.

4. A display device comprising:

a first display element comprising a first pixel electrode, a first EL layer, and a common electrode;

a second display element comprising a second pixel electrode, a second EL layer, and the common electrode;

a first insulating layer covering an end portion of the first pixel electrode and an end portion of the second pixel electrode; and a second insulating layer over the first insulating layer, wherein the first EL layer is placed over the first pixel electrode and the second insulating layer, wherein the second EL layer is placed over the second pixel electrode and the second insulating layer, wherein the first insulating layer comprises an inorganic material, wherein the second insulating layer comprises an organic material, wherein the first insulating layer and the second insulating layer are part of a first partition, and wherein each layer of the first partition overlaps with the end portion of the first pixel electrode and the end portion of the second pixel electrode.

5. The display device according to claim 4, wherein the first EL layer comprises a region in contact with the first insulating layer over the first pixel electrode, and wherein the second EL layer comprises a region in contact with the first insulating layer over the second pixel electrode.

6. The display device according to claim 4, wherein the second insulating layer comprises a region in contact with the first pixel electrode and a region in contact with the second pixel electrode.

7. A method for manufacturing a display device, comprising steps of:

forming a pixel electrode;

forming a first insulating film over the pixel electrode;

forming a second insulating layer over the first insulating film to cover an end portion of the pixel electrode;

forming a first insulating layer covering the end portion of the pixel electrode by etching the first insulating film using a resist mask;

forming an EL layer over the pixel electrode and the second insulating layer; and forming a common electrode over the EL layer, wherein the first insulating layer comprises an inorganic material, wherein the second insulating layer comprises an organic material, and wherein the common electrode is not in contact with the first insulating layer and the second insulating layer.

8. The display device according to claim 4, wherein the first EL layer is not in contact with the second insulating layer.

9. The display device according to claim 4, wherein the common electrode is not in contact with the first insulating layer and the second insulating layer.

10. The method according to claim 7, wherein the EL layer is not in contact with the second insulating layer.

11. The method according to claim 7, wherein the second insulating layer has a curved top surface.

12. The display device according to claim 4, wherein the second insulating layer has a curved top surface.

* * * * *